(12) United States Patent
Takahashi et al.

(10) Patent No.: US 12,525,504 B2
(45) Date of Patent: Jan. 13, 2026

(54) SEMICONDUCTOR DEVICE

(71) Applicant: FUJI ELECTRIC CO., LTD., Kawasaki (JP)

(72) Inventors: Seiichi Takahashi, Matsumoto (JP); Masayoshi Shimoda, Matsumoto (JP); Makoto Isozaki, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 465 days.

(21) Appl. No.: 18/193,603

(22) Filed: Mar. 30, 2023

(65) Prior Publication Data
US 2023/0238299 A1    Jul. 27, 2023

Related U.S. Application Data

(63) Continuation of application No. PCT/JP2021/040282, filed on Nov. 1, 2021.

(30) Foreign Application Priority Data

Apr. 28, 2021  (JP) ................................. 2021-075538

(51) Int. Cl.
*H01L 23/00* (2006.01)
*H01L 23/373* (2006.01)
*H01L 25/07* (2006.01)

(52) U.S. Cl.
CPC .......... *H01L 23/3735* (2013.01); *H01L 24/32* (2013.01); *H01L 25/072* (2013.01);
(Continued)

(58) Field of Classification Search
CPC ................. H01L 23/3735; H01L 24/32; H01L 25/072; H01L 24/48; H01L 24/73;
(Continued)

(56) References Cited

U.S. PATENT DOCUMENTS

| 4,500,383 A | 2/1985 | Kashiwagi et al. |
| 5,869,890 A | 2/1999 | Nishiura et al. |
| (Continued) | | |

FOREIGN PATENT DOCUMENTS

| DE | 102005007373 A1 | 8/2006 |
| EP | 3744705 A1 | 12/2020 |
| (Continued) | | |

OTHER PUBLICATIONS

International Search Report for PCT/JP2021/040282, mailed on Feb. 1, 2022.
(Continued)

*Primary Examiner* — Elias Ullah
(74) *Attorney, Agent, or Firm* — Rabin & Berdo, P.C.

(57) ABSTRACT

A semiconductor device includes a semiconductor chip, a bonding member, and a planar laminated substrate having the semiconductor chip bonded to a front surface thereof via the bonding member. The laminated substrate includes a planar ceramic board, a high-potential metal layer, a low-potential metal layer, an intermediate layer. The planar ceramic board contains a plurality of ceramic particles. The high-potential metal layer contains copper and is bonded to a first main surface of the ceramic board. The low-potential metal layer contains copper, is bonded to a second main surface of the ceramic board, and has a potential lower than a potential of the first main surface of the high-potential metal layer. The intermediate layer is provided between the second main surface and the low-potential metal layer and includes a first oxide that contains at least either magnesium or manganese.

41 Claims, 25 Drawing Sheets

(52) U.S. Cl.
CPC .............. *H01L 24/48* (2013.01); *H01L 24/73* (2013.01); *H01L 2224/32225* (2013.01); *H01L 2224/48137* (2013.01); *H01L 2224/48225* (2013.01); *H01L 2224/73265* (2013.01)

(58) Field of Classification Search
CPC ........... H01L 2224/32225; H01L 2224/48137; H01L 2224/48225; H01L 2224/73265; H01L 24/33; H01L 24/42; H01L 23/49811; H01L 24/78; H01L 2224/0603; H01L 2224/48139; H01L 2224/48227; H01L 2224/49111; H01L 2224/49175; H01L 2924/19107; H01L 23/142; H01L 23/13; H01L 23/36; C04B 2235/3225; C04B 2235/3246; C04B 35/117; C04B 35/119; C04B 2235/3206; C04B 2235/3262; C04B 2235/72; C04B 2237/06; C04B 2237/592; C04B 2237/72; C04B 37/021; C04B 37/025; C04B 2235/3201; C04B 2235/3418; C04B 2235/85; C04B 35/111; C04B 2237/343; C04B 2237/407; C04B 2237/54

See application file for complete search history.

(56) References Cited

U.S. PATENT DOCUMENTS

| | | |
|---|---|---|
| 2009/0016088 A1 | 1/2009 | Bayerer et al. |
| 2012/0077023 A1 | 3/2012 | Nagahiro et al. |
| 2017/0236819 A1 | 8/2017 | Kanai et al. |
| 2020/0365475 A1 | 11/2020 | Terasaki |
| 2021/0082898 A1 | 3/2021 | Azha |
| 2021/0238102 A1 | 8/2021 | Terasaki |
| 2021/0261473 A1 | 8/2021 | Umeda et al. |
| 2022/0417914 A1 | 12/2022 | Uzawa et al. |

FOREIGN PATENT DOCUMENTS

| | | |
|---|---|---|
| JP | S58145669 A | 8/1983 |
| JP | S59039779 A | 3/1984 |
| JP | S64083512 A | 3/1989 |
| JP | H04293290 A | 10/1992 |
| JP | H05330958 A | 12/1993 |
| JP | H06032669 A | 2/1994 |
| JP | H06172021 A | 6/1994 |
| JP | H08059338 A | 3/1996 |
| JP | H08195458 A | 7/1996 |
| JP | 2000031325 A | 1/2000 |
| JP | 2000277662 A | 10/2000 |
| JP | 2001127224 A | 5/2001 |
| JP | 2004047913 A | 2/2004 |
| JP | 2006199584 A | 8/2006 |
| JP | 2006298703 A | 11/2006 |
| JP | 2011241131 A | 12/2011 |
| JP | 2012129548 A | 7/2012 |
| JP | 2015086085 A | 5/2015 |
| JP | 2015138830 A | 7/2015 |
| JP | 2015224151 A | 12/2015 |
| JP | 2017147327 A | 8/2017 |
| JP | 2019127432 A | 8/2019 |
| JP | 2020007225 A | 1/2020 |
| JP | 2020031325 A | 2/2020 |
| JP | 2021044452 A | 3/2021 |
| WO | 2010114126 A1 | 10/2010 |
| WO | 2013008919 A1 | 1/2013 |
| WO | 2013008920 A1 | 1/2013 |
| WO | 2020044590 A1 | 3/2020 |
| WO | 2020045386 A1 | 3/2020 |
| WO | 2020115868 A1 | 6/2020 |

OTHER PUBLICATIONS

Written Opinion for PCT/JP2021/040282, mailed on Feb. 1, 2022.
Office Action issued for corresponding DE Patent Application No. 11 2021 004 170.3 dated Sep. 15, 2025.

| | | FIRST EMBODIMENT | | | |
|---|---|---|---|---|---|
| | | SPECIFIC EXAMPLE 1-1 | SPECIFIC EXAMPLE 1-2 | SPECIFIC EXAMPLE 1-3 | COMPARATIVE EXAMPLE 1 |
| CERAMIC BOARD | | MgO APPLIED | MgO APPLIED | MgO APPLIED | MgO NOT APPLIED |
| METAL LAYER | | DRY OXIDATION | WET OXIDATION | WET OXIDATION | DRY OXIDATION |
| INTERMEDIATE LAYER | | Mg-O | Mg-Mn-O | Mn-O | — |
| TEST RESULTS | FRONT SURFACE (HIGH POTENTIAL METAL LAYER) | Excellent | Excellent | Excellent | Excellent |
| | REAR SURFACE (LOW POTENTIAL METAL LAYER) | Good | Excellent | Very Good | Not Good |

FIG. 13

<METAL LAYER 40 AT FLOATING POTENTIAL>

SEMICONDUCTOR DEVICE

CROSS-REFERENCE TO RELATED APPLICATION

This application is a continuation application of International Application PCT/JP2021/040282 filed on Nov. 1, 2021, which designated the U.S., which claims priority to Japanese Patent Application No. 2021-075538, filed on Apr. 28, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power converter apparatuses. Example power devices are insulated gate bipolar transistors (IGBTs) and power metal oxide semiconductor field effect transistors (MOSFETs). A semiconductor device includes semiconductor chips, which include power devices, and a ceramic laminated substrate. The ceramic laminated substrate includes a ceramic board, a plurality of metal layers that are formed on the front surface of the ceramic board and serve as circuit patterns, and a metal layer formed on the rear surface of the ceramic board. Semiconductor chips, lead frames, and the like are bonded to the circuit patterns.

Please see, for example. Japanese Laid-open Patent Publication No. 2017-147327.

In a semiconductor device like that described above, when the semiconductor chips are driven, the semiconductor chips will generate heat, resulting in regions below the semiconductor chips becoming hot. In addition, since large voltages are applied to lead frames in the semiconductor device, large voltages will be applied to the metal layers between the front surface and the rear surface of the ceramic board immediately below the lead frames. When this situation continues, there is the risk of deterioration in the bonding characteristics between the ceramic board and the metal layers. When a ceramic laminated substrate deteriorates in this way, this may cause a semiconductor device to fail and may result in a fall in reliability for the semiconductor device.

SUMMARY OF THE INVENTION

According to an aspect, there is provided a semiconductor device including: a semiconductor chip; a bonding member; and a planar laminated substrate having a front surface and a rear surface opposite to each other, the laminated substrate having the semiconductor chip bonded to the front surface thereof via the bonding member, wherein the laminated substrate includes: a planar ceramic board having a first main surface and a second main surface opposite to each other, the ceramic board containing a plurality of ceramic particles; a high-potential metal layer containing copper and being bonded to the first main surface of the ceramic board; a low-potential metal layer containing copper, being bonded to the second main surface of the ceramic board, and having a potential lower than a potential of the first main surface of the high-potential metal layer; and an intermediate layer provided between the second main surface and the low-potential metal layer and including a first oxide that contains at least either magnesium or manganese.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 13 is a table summarizing test results of ceramic laminated substrates according to the first embodiment;

DETAILED DESCRIPTION OF THE INVENTION

Figure 1:
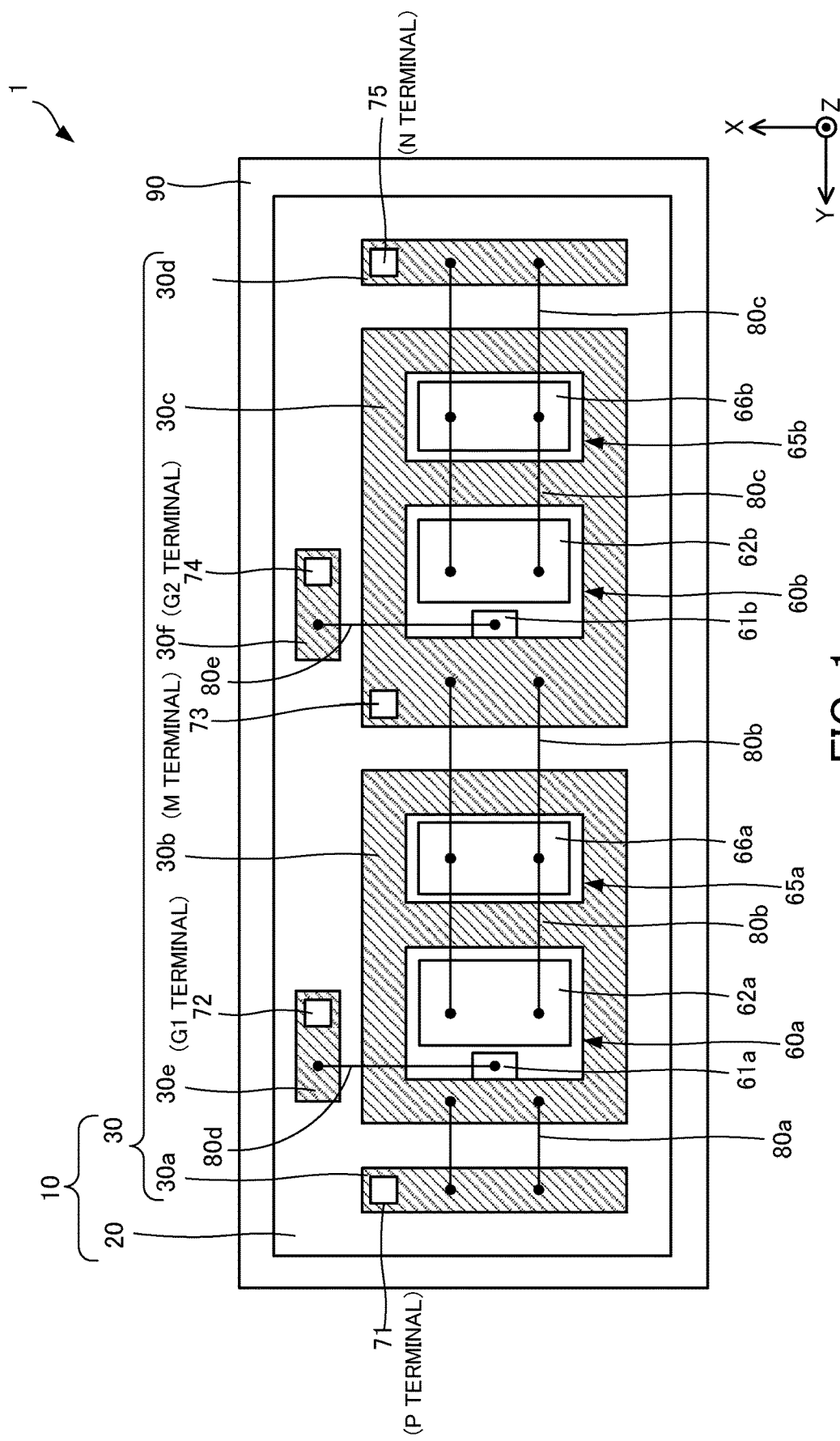
FIG. 1 is a plan view of a semiconductor device according to a first embodiment.

Several embodiments will be described below with reference to the accompanying drawings. Note that in the following description, the expressions "front surface" and "upper surface" refer to an X-Y plane that faces upward (in the "+Z direction") for a semiconductor device 1 depicted in the drawings. In the same way, the expression "up" refers to the upward direction (or "+Z direction") for the semiconductor device 1 depicted in FIG. 1. The expressions "rear surface" and "lower surface" refer to an X-Y plane that faces downward (that is, in the "−Z direction") for the semiconductor device 1 depicted in the drawings. In the same way, the expression "down" refers to the downward direction (or "−Z direction") for the semiconductor device 1 depicted in the drawings. These expressions are used as needed to refer to the same directions in the other drawings. The expressions "front surface", "upper surface", "up", "rear surface", "lower surface", "down", and "side surface" are merely convenient expressions used to specify relative positional relationships, and are not intended to limit the technical scope of the present disclosure. As one example, "up" and "down" do not necessarily mean directions that are perpendicular to the ground. That is, the "up" and "down" directions are not limited to the direction of gravity. Additionally, in the following description, the expression "main component" refers to a component that composes 80% or higher by volume out of all the components.

Also, in the following description, the "content" of a substance may be expressed as an "oxide equivalent". The "oxide equivalent" is calculated by converting each metal element whose presence has been confirmed by compositional analysis into the respective oxides. As one example, all elements confirmed by compositional analysis, such as aluminum, silicon, sodium, magnesium, manganese, zirconium, and yttrium, are converted to oxides such as aluminum oxide ($Al_2O_3$), silicon oxide ($SiO_2$), sodium oxide ($Na_2O$), magnesium oxide ($MgO$), manganese oxide ($MnO$), zirconium oxide ($ZrO_2$), and yttrium oxide ($Y_2O_3$), and are expressed by ratios of the weight of the respective oxides to the total weight of the oxide equivalents. Note that example methods of compositional analysis include X-ray fluorescence (XRF) spectroscopy, inductively coupled plasma (ICP) spectroscopy, electron probe micro analysis (EPMA), and energy-dispersive X-ray (EDX) spectroscopy.

Also, in the following description, the expressions "does not contain", "not confirmed", and "not formed" for an element or compound refer to that element or compound being below a measurement limit in the compositional analysis described above. As one example, in the case of manganese and magnesium, the expressions refer to less than 0.01 wt % as an oxide equivalent. As another example, for sodium, the expressions refer to less than 0.001 wt % as an oxide equivalent.

First Embodiment (Configuration of Semiconductor Device)

Figure 2:
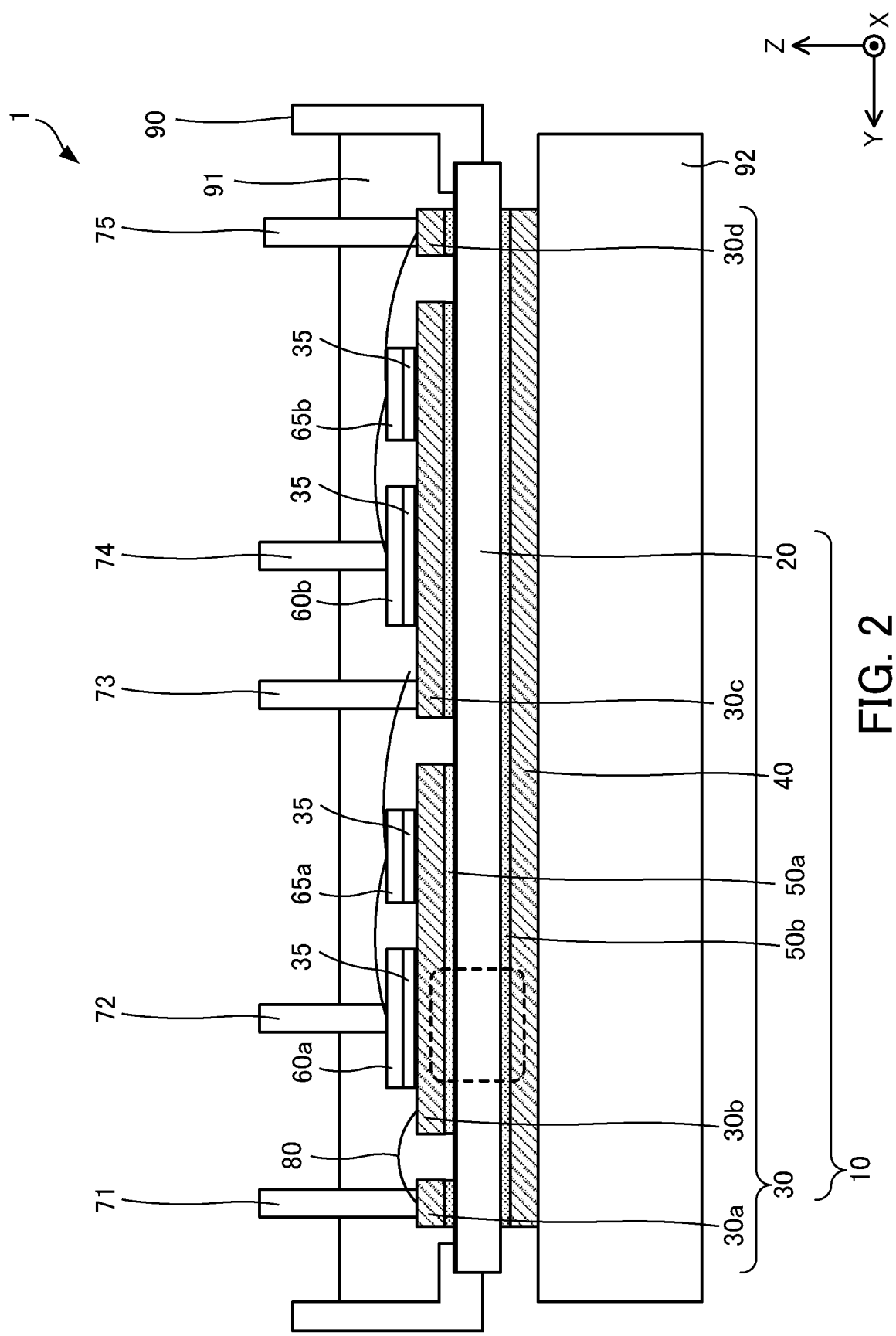
FIG. 2 is a side view of the semiconductor device according to the first embodiment.
Figure 3:
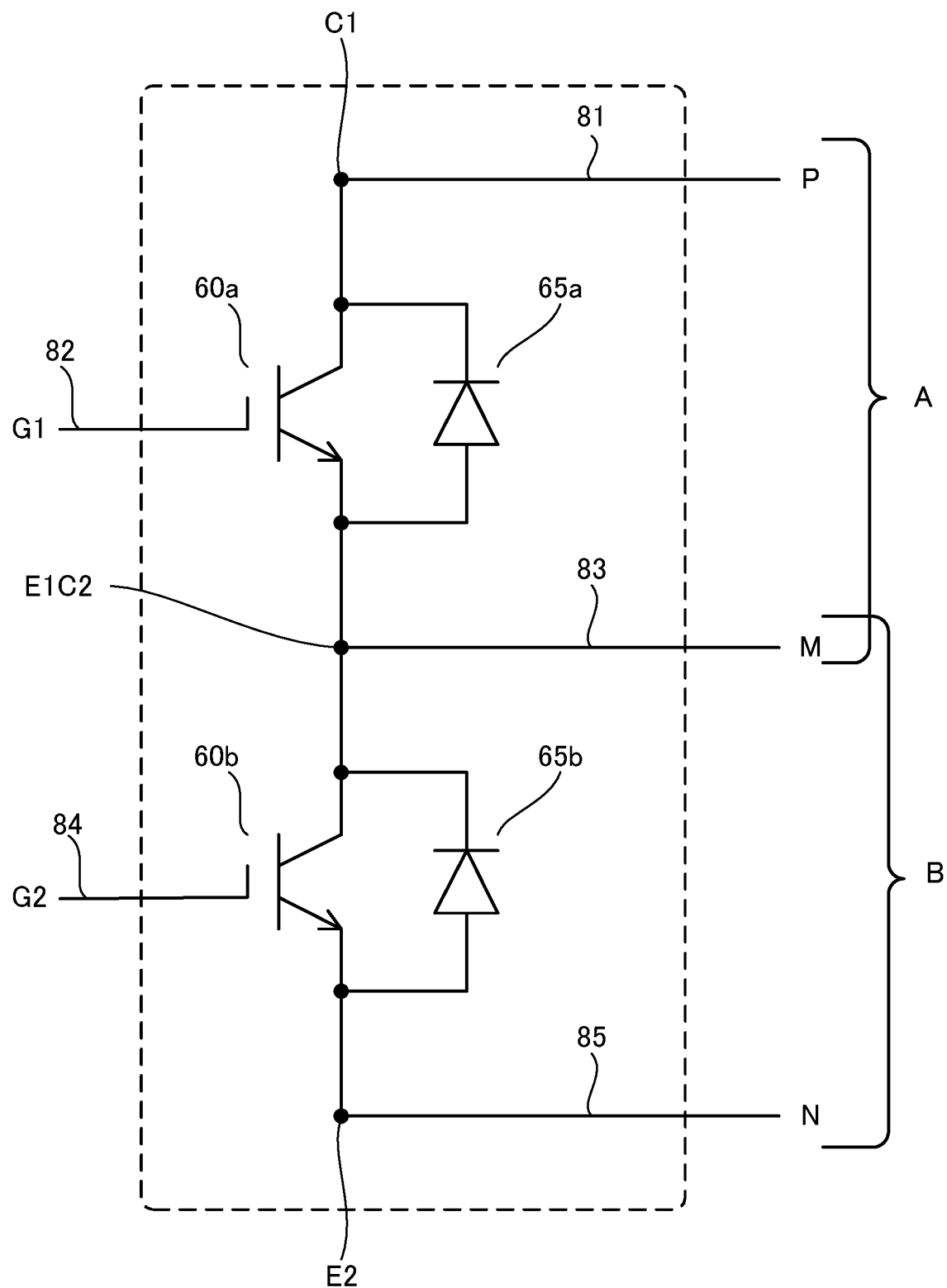
FIG. 3 is an equivalent circuit diagram depicting functions realized by the semiconductor device according to the first embodiment.

A semiconductor device according to a first embodiment will now be described with reference to FIGS. 1 to 3. FIG. 1 is a plan view of the semiconductor device according to the first embodiment, and FIG. 2 is a side view of the semiconductor device according to the first embodiment. FIG. 3 is an equivalent circuit diagram depicting functions realized by the semiconductor device according to the first embodiment. Note that illustration of an encapsulating member is omitted from FIG. 1. FIG. 2 is a side view of the semiconductor device 1 in FIG. 1 when looking in the +X direction.

The semiconductor device 1 includes at least a ceramic laminated substrate 10, semiconductor chips 60*a*, 60*b*, 65*a*, and 65*b*, and external connection terminals 71 to 75. A case 90 and an encapsulating member 91 (see FIG. 2) may be additionally included. In the semiconductor device 1, the external connection terminals 71 to 75 extend upward (in the +Z direction) from the front surface.

The ceramic laminated substrate 10 includes a ceramic board 20, metal layers 30*a* to 30*f* formed on a front surface of the ceramic board 20, and a metal layer 40 formed on a rear surface of the ceramic board 20. Note that in the following description, the metal layers 30*a* to 30*f* may be collectively referred to as the "metal layers 30".

The ceramic board 20 is constructed of a ceramic that is electrically insulating and has favorable thermal conductivity as a main component. As examples, the ceramic may be constructed of a material that has aluminum oxide ($Al_2O_3$) or zirconium oxide ($ZrO_2$) as a main component. In this example, the ceramic has aluminum oxide ($Al_2O_3$) as a main component. Note that in a second embodiment described later, zirconium oxide ($ZrO_2$) is also included. This ceramic mainly includes ceramic particles. The ceramic particles may be constructed of a material containing aluminum oxide ($Al_2O_3$) as a main component. The ceramic board 20 may also contain grain boundary materials formed at grain boundaries and triple points of the ceramic particles. Examples of grain boundary materials include oxide containing silicon (or here, "second oxide"). The ceramic board 20 is rectangular in shape when viewed from above. Corner portions may be chamfered into rounded or beveled shapes. The thickness of the ceramic board 20 is 0.1 mm or more and 1.0 mm or less, and as one example is around 0.3 mm. The ceramic board 20 will be described in detail later.

The metal layers 30 formed on the front surface of the ceramic board 20 are constructed with a metal with superior electrical conductivity as the main component. Example metals include copper, aluminum, or an alloy containing at least one of copper and aluminum. The metal layers 30 used here have copper as a main component. A plating process may be performed on the surfaces of the metal layers 30 to improve corrosion resistance. Examples of the plating material used here include nickel, nickel-phosphorus alloy, and nickel-boron alloy. A plurality of metal layers 30 are formed on the front surface of the ceramic board 20. As one example, in the first embodiment, a plurality of metal layers 30a to 30f are formed on the front surface of the ceramic board 20. Hereinafter, the metal layers 30a to 30f may be referred to as the metal layers 30 when no distinction is made between them. The metal layers 30 are electrically connected to the semiconductor chips 60a, 60b, 65a, and 65b. The metal layers 30 may be bonded to the semiconductor chips 60a, 60b, 65a, and 65b and the external connection terminals 71 to 75 via a bonding member 35, such as solder. Each metal layer 30 may be shaped as a polygon, and corner portions may be chamfered into rounded or beveled shapes. The plurality of metal layers 30 are formed on the inside of the ceramic board 20. Each of the metal layers 30 has a thickness of 0.1 mm or more and 0.5 mm or less, and may be around 0.3 mm thick.

The metal layer 40 formed on the rear surface of the ceramic board 20 is constructed with a metal with superior thermal conductivity as a main component. Example metals include copper, aluminum, or an alloy containing at least one of copper and aluminum. The metal layer 40 used here is constructed with copper as a main component. A plating process may be performed on the surface of the metal layer 40 to improve corrosion resistance. Examples of the plating material used here include nickel, nickel-phosphorus alloy, and nickel-boron alloy. The metal layer 40 is formed on the rear surface of the ceramic board 20 so as to correspond to the metal layers 30. That is, when viewed from above, the metal layer 40 includes the metal layers 30a to 30f formed on the front surface of the ceramic board 20. The metal layer 40 may be connected via solder, brazing material, thermal paste, or the like to a heat dissipating member 92. The ceramic laminated substrate 10 may transfer heat generated by the semiconductor chips 60a, 60b, 65a, and 65b via the metal layers 30, the ceramic board 20, and the metal layer 40 to the heat dissipating member 92 on the outside. Accordingly, during operation of the semiconductor device 1, the ceramic board 20 is heated. The metal layer 40 is also rectangular in shape when viewed from above. Corner portions of the metal layer 40 may be chamfered into rounded or beveled shapes. The metal layer 40 is formed on the inside of the ceramic board 20. The metal layer 40 is formed so as to cover a region that is opposite the metal layers 30. The thickness of the metal layer 40 is 0.1 mm or more and 0.5 mm or less, and may be around 0.3 mm.

Intermediate layers 50a and 50b are formed between the ceramic board 20 and the metal layers 30 and 40, respectively. The intermediate layers 50a and 50b contain an oxide (or "first oxide") including at least one of magnesium and manganese. As examples, the oxide may be magnesium oxide (MgO), manganese oxide (MnO), (Mg,Mn)O, or (Mg,Mn)Mn$_2$O$_4$. Large amounts of this oxide are included in the intermediate layers 50a and 50b on the front surface side and the rear surface side of the ceramic board 20.

The oxide included in the intermediate layers 50a and 50b may additionally include aluminum. Such oxide may include a spinel crystal system including aluminum. Examples of spinel crystal systems include MgAl$_2$O$_4$, MnAl$_2$O$_4$, (Mg,Mn)Al$_2$O$_4$, and (Mg,Mn)(Al,Mn)$_2$O$_4$. Note that the ceramic laminated substrate 10 may include at least one of the intermediate layer 50a and the intermediate layer 50b.

As examples, a direct copper bonding (DCB) substrate or an active metal brazed (AMB) substrate may be used as the ceramic laminated substrate 10 with the configuration described above. Note that the manufacturing method and detailed configuration of the ceramic laminated substrate 10 will be described later.

The semiconductor chips 60a, 60b, 65a, and 65b are constructed with silicon or silicon carbide as a main component. The semiconductor chips 60a and 60b are switching elements. As one example, the switching elements are IGBTs or power MOSFETs. Such semiconductor chips 60a and 60b have a drain electrode or a collector electrode as an input electrode (main electrode) on their rear surfaces. The semiconductor chips 60a and 60b have gate electrodes as control electrodes 61a and 61b and source electrodes or emitter electrodes as output electrodes 62a and 62b (main electrodes) on their front surfaces. The semiconductor chips 60a and 60b described above have their rear surfaces bonded to the metal layers 30b and 30c by solder (not illustrated).

The semiconductor chips 65a and 65b are diode elements. As examples, the diode elements are freewheeling diodes (FWDs), such as Schottky barrier diodes (SBDs) and PiN (P-intrinsic-N) diodes. The semiconductor chips 65a and 65b have cathode electrodes as output electrodes (main electrodes) on their rear surfaces, and anode electrodes as input electrodes 66a and 66b (main electrodes) on their front surfaces. The semiconductor chips 65a and 65b described above have their rear surfaces bonded by solder (not illustrated) to the metal layers 30b and 30c. Note that the semiconductor chips 60a, 60b, 65a, and 65b may be RC (Reverse Conductive)-IGBT elements or RB (Reverse Blocking)-IGBT elements, where a switching element and a diode element are combined into single semiconductor chips.

The bonding member 35 that joins the semiconductor chips 60a, 60b, 65a, and 65b and the metal layers 30b and 30c may be solder. Lead-free solder is used as the solder. The lead-free solder has an alloy including at least two of tin, silver, copper, zinc, antimony, indium, and bismuth for example as a main component. The solder may additionally include additives. Sintered metal may be used as the bonding member 35 in place of solder. The material of the sintered metal has silver or silver alloy as a main component. In addition, the solder and sintered metal described above are not limited to joining the semiconductor chips 60a and 60b and the metal layers 30b and 30c, and may also be used to join the external connection terminals 71 to 75, which will be described later, to the metal layers 30a, 30e, 30c, 30f and 30d.

The external connection terminals 71 to 75 are each shaped like a plate, a prism, or a cylinder. In this embodiment, a case where the external connection terminals 71 to 75 are prismatic is described as an example. One end of each of the external connection terminals 71 to 75 is electrically and mechanically joined to the metal layers 30a, 30e, 30c, 30f, and 30d of the ceramic laminated substrate 10. The other end of each terminal extends from the encapsulating member 91. These other ends may be connected to an external device (not illustrated).

The external connection terminals 71 to 75 are constructed with a metal with superior conductivity as a main component. Example metals include aluminum, copper, iron, nickel, or an alloy containing at least one of these. A plating process may be performed on the surfaces of the external connection terminals 71 to 75 to improve corrosion resistance. Examples of the plating material used here include nickel, nickel-phosphorus alloy, and nickel-boron alloy. The external connection terminals 71 to 75 and the metal layers 30a, 30e, 30c, 30f, and 30d may be joined using solder or sintered metal in the same way as the joining of the semiconductor chips 60a, 60b, 65a, and 65b. The external connection terminals 71 to 75 and the metal layers 30a, 30e, 30c, 30f, and 30d may be directly joined using ultrasonic waves or a laser.

The bonding wires 80a to 80e have a metal with superior conductivity as a main component. Example metals are made of aluminum and copper, or an alloy containing at least one of aluminum and copper. The bonding wires 80a mechanically and electrically connect the metal layers 30a and 30b. The bonding wire 80d mechanically and electrically connects the metal layer 30e and the control electrode 61a of the semiconductor chip 60a. The bonding wires 80b mechanically and electrically connect the output electrode 62a of the semiconductor chip 60a and the input electrode 66a of the semiconductor chip 65a to the metal layer 30c. The bonding wire 80e mechanically and electrically connects the metal layer 30f and the control electrode 61b of the semiconductor chip 60b. The bonding wires 80c mechanically and electrically connect the output electrode 62b of the semiconductor chip 60b and the input electrode 66b of the semiconductor chip 65b to the metal layer 30d. Note that the diameter of the bonding wires 80d and 80e for control purposes is 25 μm or more and 400 μm or less, for example, and the diameter of the bonding wires 80a to 80c for the main current is 250 μm or more and 600 μm or less.

The case 90 houses the metal layer 30, the semiconductor chips 60a, 60b, 65a, and 65b, and one end of each of the external connection terminals 71 to 75 on the front surface of the ceramic laminated substrate 10. The other ends of the external connection terminals 71 to 75 may extend upward (in the +Z direction) from the front surface of the case. The case 90 is made of resin. This resin has a thermoplastic resin as a main component. Example thermoplastic resins include polyphenylene sulfide resin, polybutylene terephthalate resin, polybutylene succinate resin, polyamide resin, and acrylonitrile butadiene styrene resin.

The encapsulating member 91 may encapsulate the inside of the case 90. That is, the encapsulating member 91 encapsulates the metal layers 30, the semiconductor chips 60a, 60b, 65a, and 65b, and one end of each of the external connection terminals 71 to 75 on the front surface of the ceramic laminated substrate 10. The encapsulating member 91 includes, as one example, a thermosetting resin and a filler included in the thermosetting resin. Example thermosetting resins include epoxy resin, phenolic resin, and maleimide resin. One example of this encapsulating member is epoxy resin that contains filler. An inorganic substance is used as the filler. Examples of this inorganic substance include silicon oxide, aluminum oxide, boron nitride, and aluminum nitride. In addition to the materials mentioned above, the encapsulating member 91 may be silicone gel.

As depicted in FIG. 3, the semiconductor device 1 forms a half bridge circuit including an upper arm portion A and a lower arm portion B. A connection node P is connected to a positive electrode of an external power supply (not illustrated). The connection node P and a connection node C1 of the collector electrode of the semiconductor chip 60a are connected by wiring 81. A connection node M is connected to a load (not illustrated). The connection node M and a connection node E1C2 between the emitter electrode of the semiconductor chip 60a and the collector electrode of the semiconductor chip 60b are connected by wiring 83. A connection node N is connected to the negative electrode of the external power supply (not illustrated). The connection node N and a connection node E2 of the emitter electrode of the semiconductor chip 60b are connected by wiring 85. In this configuration, during operation of the semiconductor device 1, the connection node P is placed at a higher potential than the connection node M. This means that the wiring 81 will be at a higher potential than the wiring 83. The connection node M will also be at a higher potential than the connection node N. This means that the wiring 83 will be at a higher potential than the wiring 85. The potential of the wiring 81 may be 250 V or more and less than 1000 V higher than the potential of the wiring 83. Likewise, the potential of the wiring 83 may be 250 V or more and less than 1000 V higher than the potential of the wiring 85.

Connection nodes G1 and G2 are connected to a control power source (not illustrated). The connection node G1 is connected by a wire 82 to the control electrode 61a of the semiconductor chip 60a (not illustrated in FIG. 3, see FIG. 1). The connection node G2 is connected by a wire 84 to the control electrode 61b of the semiconductor chip 60b (not illustrated in FIG. 3, see FIG. 1).

The upper arm portion A of the semiconductor device 1 includes the metal layers 30a, 30b, 30e on the ceramic laminated substrate 10, the semiconductor chips 60a and 65a, the external connection terminals 71, 73, and 72, and the bonding wires 80a, 80b, and 80d that connect these components. The lower arm portion B of the semiconductor device 1 includes the metal layers 30d, 30c and 30f of the ceramic laminated substrate 10, the semiconductor chips 60b and 65b, the external connection terminals 75, 73, and 74, and the bonding wires 80c and 80e that connect these components. The upper arm portion A and the lower arm portion B are connected by electrically connecting the metal layers 30b and 30c with the bonding wires 80b. By doing so, the semiconductor device 1 may be made to function as a half bridge circuit including the upper arm portion A and the lower arm portion B.

The wiring 81 includes an external connection terminal 71 which is a P terminal (positive electrode), the metal layer 30a to which the external connection terminal 71 is connected, the metal layer 30b on which the semiconductor chips 60a and 65a are disposed, and a bonding wires 80a that connect the metal layer 30a and the metal layer 30b. The wiring 83 includes an external connection terminal 73 which is an M terminal, the metal layer 30c on which the external connection terminal 73 and the semiconductor chips 60b and 65b are disposed, and the bonding wires 80b that connect the metal layer 30c and the semiconductor chips 60a and 65a. The wiring 85 includes the external connection terminal 75 that is an N terminal (negative electrode), the metal layer 30d on which the external connection terminal 75 is disposed, and the bonding wires 80c that connects the metal layer 30d and the semiconductor chips 60b and 65b.

Accordingly, during operation of the semiconductor device 1, when the metal layer 40 formed on the rear surface of the ceramic board 20 is grounded so as to have the same potential as the N terminal, the metal layer 40 will be at a low potential compared to the metal layers 30a, 30b, 30c corresponding to the wiring 81 and 83. That is, in this case, the low-potential metal layer is the metal layer 40 formed on the rear surface of the ceramic board 20, and the high-potential metal layers are the metal layers 30a, 30b, and 30c formed on the front surface of the ceramic board 20. As one example, the metal layer 40 has a potential that is 500 V or more and less than 2000 V lower than the potential of the metal layers 30a and 30b. Also, the potential of the metal layer 40 is 250 V or more and less than 1000 V lower than the potential of the metal layer 30c.

Also, during operation of the semiconductor device 1, when the metal layer 40 formed on the rear surface of the ceramic board 20 is grounded so as to have the same potential as the M terminal, or when the metal layer 40 is floating without being grounded, the metal layer 40 will have a lower potential than the metal layers 30a and 30b that correspond to the wiring 81. That is, in this case, the low-potential metal layer is the metal layer 40 formed on the rear surface of the ceramic board 20, and the high-potential metal layers are the metal layers 30a and 30b formed on the front surface of the ceramic board 20. As one example, the metal layer 40 has a potential that is 250 V or more and less than 1000 V lower than the potential of the metal layers 30a and 30b. Also, the potential of the metal layer 30d corresponding to the wiring 85 becomes lower than the potential of the metal layer 40. That is, in this case, the low-potential metal layer is the metal layer 30d formed on the front surface of the ceramic board 20 and the high-potential metal layer is the metal layer 40 formed on the rear surface of the ceramic board 20. As one example, the potential of the metal layer 30d is 250 V or more and less than 1000 V lower than the potential of the metal layer 40.

(Method of Manufacturing Semiconductor Device)

Figure 4:
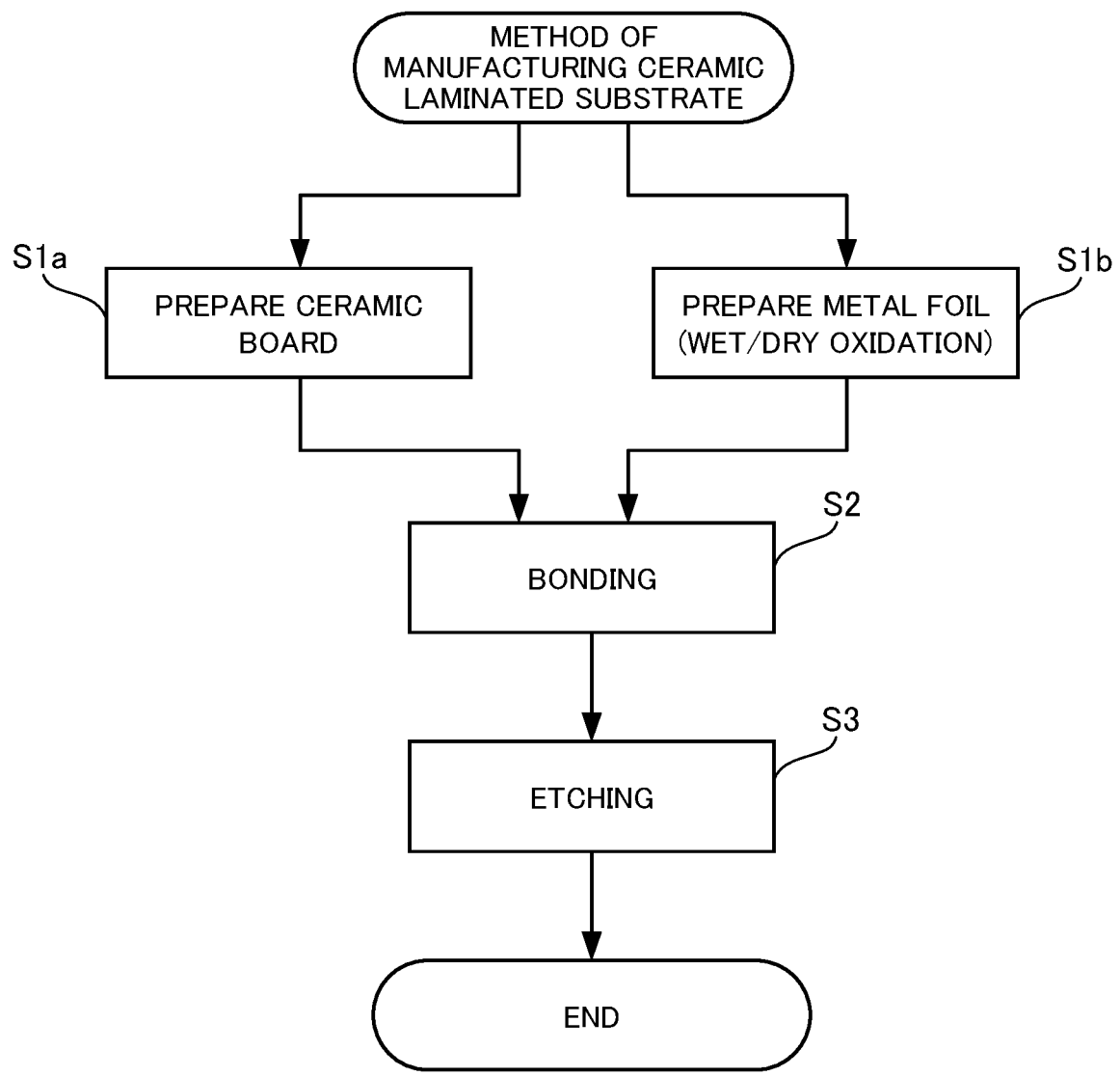
FIG. 4 is a flowchart depicting a method of manufacturing a ceramic laminated substrate included in the semiconductor device according to the first embodiment.

Next, a method of manufacturing the ceramic laminated substrate 10 included in the semiconductor device 1 will be described with reference to FIG. 4. FIG. 4 is a flowchart depicting a method of manufacturing a ceramic laminated substrate included in the semiconductor device according to the first embodiment. When manufacturing the ceramic laminated substrate 10, first, a ceramic board and metal foil are prepared (steps S1a and S1b). Note that either step S1a or S1b may be performed first.

Preparation of the ceramic board will now be described (step S1a). First, silicon oxide ($SiO_2$) powder is added to aluminum oxide ($Al_2O_3$) powder, and the mixture is stirred together with a binder or the like and molded into a board. Magnesium oxide (MgO) powder is applied to the surface of the board-shaped molded object, which is then fired at a predetermined temperature for a predetermined time. The ceramic board formed by firing in this way contains aluminum oxide as ceramic particles, includes an oxide (or "second oxide") containing silicon at the grain boundaries and triple points of the ceramic particles, and also includes an oxide containing magnesium at the surface. An oxide containing magnesium may also be formed at the grain boundaries and triple points of the ceramic particles. Note that in this case, the application of magnesium oxide powder may be omitted. The average particle diameter of the ceramic particles is 0.5 μm or more and 25 μm or less, and more preferably 1 μm or more and 10 μm or less.

In the ceramic board 20, the content of aluminum oxide is 90 wt % or more and 99 wt % or less out of the total oxide equivalent, and more preferably 92 wt % or more and 98 wt % or less. The content of the oxide containing silicon in the ceramic board 20 is 0.01 wt % or more and 3.0 wt % or less as silicon oxide ($SiO_2$) equivalent with respect to the total amount of oxide equivalent, and more preferably 1.0 wt % or more and 3.0 wt % or less. When the content of the oxide containing silicon is too low, many voids will remain in the ceramic board, which makes the board susceptible to cracking. On the other hand, when the content is too large, the conduction of ions in the ceramic board will increase during the operation of the semiconductor device 1, resulting in a tendency for deterioration in the electrically insulating property and a fall in the bonding characteristics for the copper foil.

In addition to ceramic particles, oxide containing magnesium, and oxide containing silicon, the ceramic board 20 includes various materials used in manufacturing. An example of such a material is an oxide containing sodium. One example is sodium oxide ($Na_2O$). The content of the oxide containing sodium in the ceramic board 20 is 0.001 wt % or more and 0.2 wt % or less as sodium oxide ($Na_2O$) equivalent with respect to the total amount of oxide equivalent, and more preferably 0.002 wt % or more and 0.2 wt % or less. When the content of the oxide containing sodium is too low, it will be difficult to refine the powdered ceramic raw material. On the other hand, when the amount is too large, β-alumina ($Na_2O \cdot 11Al_2O_3$) is formed, which tends to cause deterioration in the insulating properties and a drop in strength. It is preferable for the ceramic board 20 to not include β-alumina.

Preparation of the metal foil will now be described (step S1b). A metal foil with copper as a main component is prepared and the surface is oxidized. As a result, a film of copper oxide ($Cu_xO$) with a thickness of 10 nm or more and 1 μm or less is formed on the surface of the metal foil. In this oxidation process, wet oxidation or dry oxidation may be performed. During wet oxidation, as one example, a metal foil containing copper as a main component may be oxidized by immersing the foil in a solution containing manganese. Wet oxidation using a solution containing manganese forms copper oxide on the surface of the metal foil and also forms oxide containing manganese. During dry oxidation, as one example, a metal foil with copper as a main component is heated in air or an oxygen gas atmosphere. By doing so, through dry oxidation, copper oxide is formed on most of the surface of the metal foil, and other metals including manganese are not formed.

Next, the metal foil formed in step S1b is bonded to the front and rear surfaces of the ceramic board formed in step S1a (step S2). That is, the metal foil formed in step S1b is placed over the front and rear surfaces of the ceramic board formed in step S1a, and a heat treatment is performed at a predetermined temperature for a predetermined time. Note that at this time, metal foil produced by either wet oxidation or dry oxidation is used as the metal layers formed on the front and rear surfaces of the ceramic board. That is, metal foil prepared by wet oxidation is placed over the front and rear surfaces of a ceramic board. Alternatively, metal foil prepared by dry oxidation is placed over the front and rear surfaces of the ceramic board 20.

When a heat treatment is performed in this overlapping state, copper oxide ($Cu_xO$) is formed at contact interfaces between the ceramic board and the metal layers. The intermediate layers 50a and 50b including oxide containing at least one of magnesium and manganese may be formed by a predetermined method at the contact interfaces between the ceramic board and the metal layers. The predetermined method may be at least one of applying magnesium oxide when firing the ceramic board and forming the metal layers by wet oxidation using a solution containing manganese.

The ceramic laminated substrate 10 of Specific Example 1-1, which will be described later, has magnesium oxide applied thereto when the ceramic board 20 is fired. By doing so, the intermediate layers 50a, 50b, which include oxide containing magnesium as the first oxide, are formed at the contact interfaces between the ceramic board 20 and the metal layers 30 and 40.

The ceramic laminated substrate 10 of Specific Example 1-2, which will be described later, has magnesium oxide applied thereto when the ceramic board 20 is fired and has the metal layers 30 and 40 formed by wet oxidation using a solution containing manganese. By doing so, the intermediate layers 50a and 50b including oxide containing both magnesium and manganese as the first oxide are formed at the contact interfaces between the ceramic board 20 and the metal layers 30 and 40.

The ceramic laminated substrate 10 of Specific Example 1-3, which will be described later, has the metal layers 30 and 40 formed by wet oxidation using a solution containing manganese when the ceramic board 20 is fired. By doing so, the intermediate layers 50a and 50b including oxide containing manganese as the first oxide are formed at the contact interfaces between the ceramic board 20 and the metal layers 30 and 40. This results in the ceramic board 20 and the metal layers 30, 40 being favorably bonded.

Next, the metal layers formed on the ceramic board in step S2 are etched (step S3). That is, the metal layers 30a to 30f are formed by etching the metal layer formed on the front surface of the ceramic board into predetermined shapes. The metal layer 40 is formed by etching the metal layer formed on the rear surface of the ceramic board. Note that a coating of copper oxide ($Cu_xO$) does not need to be formed on the surfaces of the metal layers 30a to 30f and the surface of the metal layer 40. The coating of copper oxide ($Cu_xO$) may be removed by performing a heat treatment in a reducing atmosphere during bonding (step S2) or by surface polishing after bonding and etching. The thickness of the ceramic board 20 is around 0.32 mm. The thickness of the metal layers 30 and 40 is around 0.3 mm.

Through the steps described above, the ceramic laminated substrate 10 including the intermediate layers 50a and 50b between the ceramic board 20 and the metal layers 30 and 40 is manufactured. In this ceramic laminated substrate 10, the intermediate layers 50a and 50b suppress deterioration in bonding characteristics between the metal layers 30 and 40 and the ceramic board 20. Note that when magnesium oxide powder has been applied in step S1a, in the ceramic laminated substrate 10, the content of the oxide containing magnesium in the ceramic board 20 and the intermediate layers 50a and 50b is 0.1 wt % or more and 1.5 wt % or less in terms of magnesium oxide (MgO) equivalent with respect to the total amount of oxide equivalent. In addition, in this case, the magnesium content in terms of magnesium oxide (MgO) equivalent is 10 wt % or more and 50 wt % or less with respect to the content of silicon in terms of silicon oxide ($SiO_2$) equivalent. When magnesium oxide powder is not applied in step S1a, the ceramic laminated substrate 10 will not contain magnesium (that is, the amount will be below the lower measurement limit of 0.01 wt %). When wet oxidation is performed in step S1b using a solution containing manganese, in the ceramic laminated substrate 10, the content of oxide containing manganese in the ceramic board 20 and the intermediate layers 50a and 50b is 0.01 wt % or more and 0.15 wt % or less in terms of manganese oxide (MnO) equivalent with respect to the total amount of oxide equivalent. In addition, in this case, the content of manganese in terms of manganese oxide (MnO) equivalent is 1.0 wt % or more and 5.0 wt % or less with respect to the content of silicon in terms of silicon oxide ($SiO_2$) equivalent. When wet oxidation using solution containing manganese was not performed in step S1b, the ceramic laminated substrate 10 will not include manganese (that is, the amount will be below the lower measurement limit of 0.01 wt %).

The ceramic laminated substrate 10 of Specific Example 1-1, which will be described later, is coated with magnesium oxide powder but was not subjected to wet oxidation using a solution containing manganese. In this case, the ceramic laminated substrate 10 includes oxide containing magnesium but does not include oxide containing manganese. A ceramic laminated substrate of Specific Example 1-2, which will be described later, is obtained by applying magnesium oxide powder and also performing wet oxidation using a solution containing manganese. Accordingly, the ceramic laminated substrate 10 includes both an oxide containing magnesium and an oxide containing manganese. The ceramic laminated substrate 10 of Specific Example 1-3, which will be described later, is obtained by performing wet oxidation using a solution containing manganese without applying magnesium oxide powder. Accordingly, the ceramic laminated substrate 10 does not include oxide containing magnesium but includes oxide containing manganese. Note that a ceramic laminated substrate 100 in a comparative example, which will be described later, is a case where neither the application of magnesium oxide powder nor wet oxidation using a solution containing manganese was performed. Accordingly, the ceramic laminated substrate 100 does not include oxide containing magnesium or oxide containing manganese.

(Ceramic Laminated Substrate of Comparative Example 1)

Figure 5:
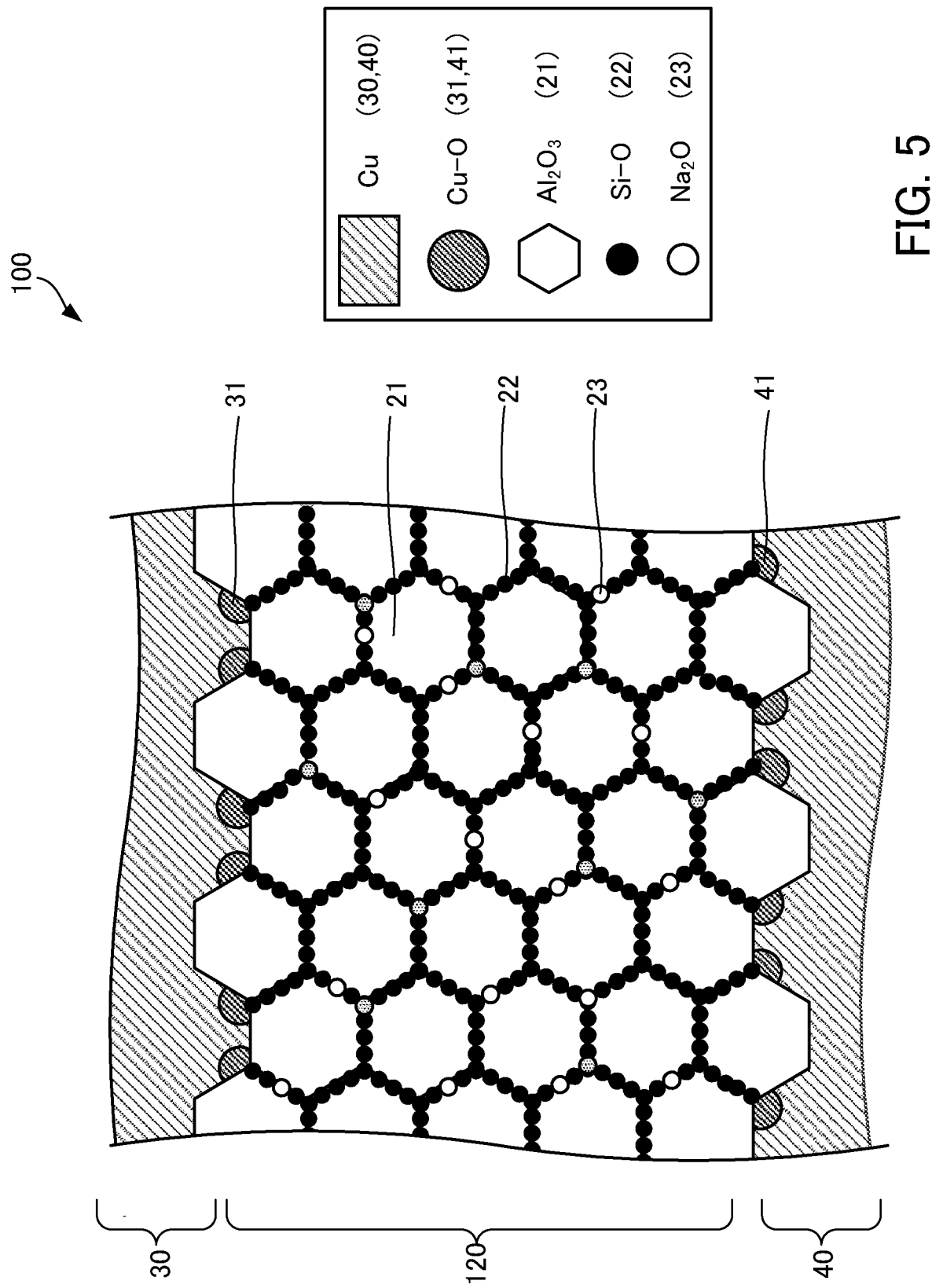
FIG. 5 is a schematic cross-sectional view of a ceramic laminated substrate of Comparative Example 1.
Figure 6:
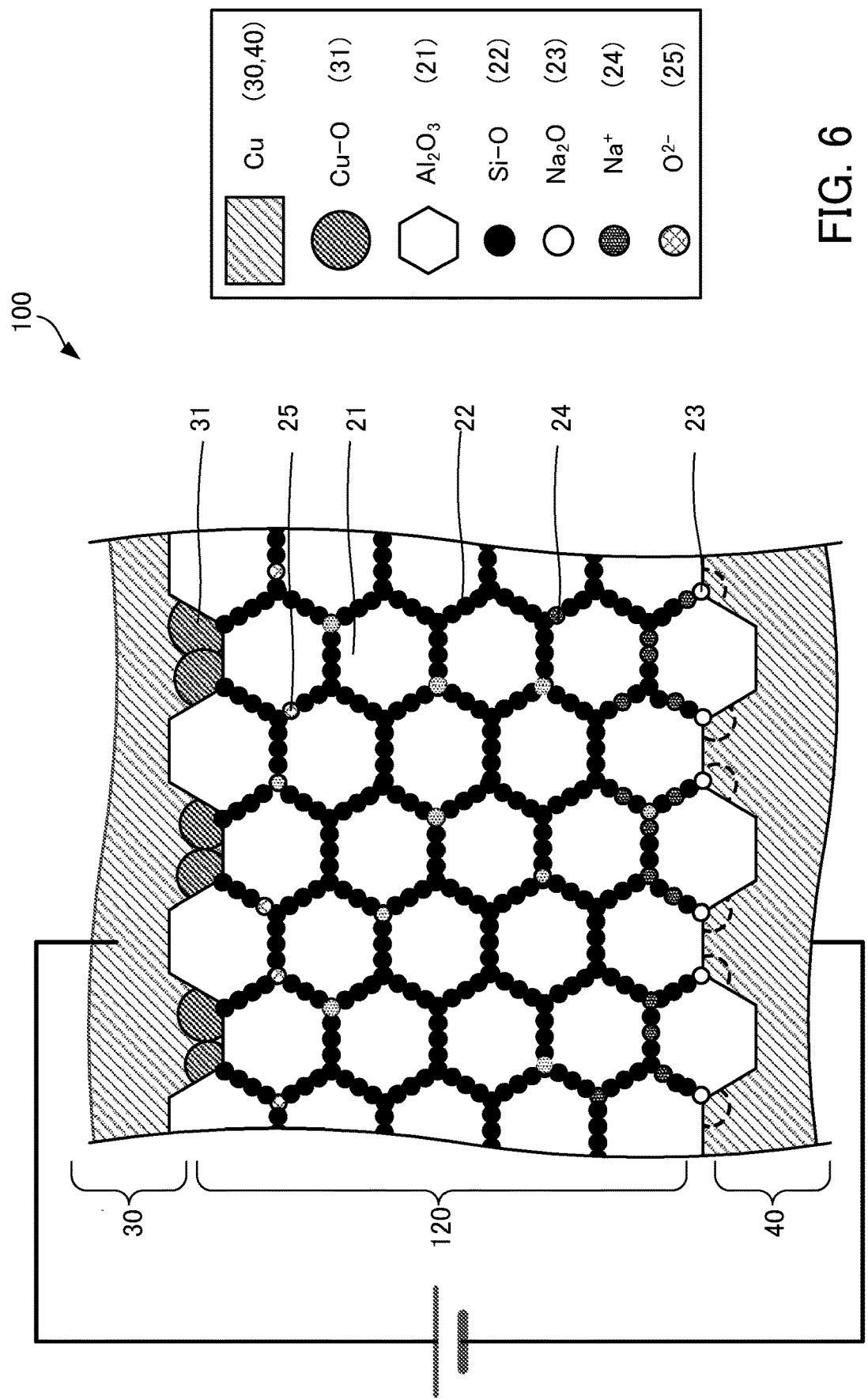
FIG. 6 is a schematic cross-sectional view of the ceramic laminated substrate of Comparative Example 1 under a high voltage in a high temperature environment.

In the following description, to describe how the intermediate layers 50a and 50b suppress deterioration in the bonding characteristics of the metal layers 30 and 40, first, as Comparative Example 1, a ceramic laminated substrate that does not include the intermediate layers 50a and 50b will be described with reference to FIGS. 5, 6 and 13. FIG. 5 is a schematic cross-sectional view of the ceramic laminated substrate of Comparative Example 1, and FIG. 6 is a schematic cross-sectional view of the ceramic laminated substrate of Comparative Example 1 under a high voltage in a high temperature environment. FIG. 13 is a table summarizing test results of several ceramic laminated substrates. Note that FIG. 5 schematically depicts the microscopic state in the range surrounded by the broken line in FIG. 2. FIG. 6 schematically depicts the microscopic state when a high voltage is applied between the metal layers 30 and 40 in a high temperature environment in FIG. 5. In addition to Comparative Example 1, FIG. 13 also depicts test results for Specific Examples 1-1 to 1-3, which will be described later.

A ceramic board 120 included in the ceramic laminated substrate of Comparative Example 1 was prepared without applying magnesium oxide in step S1a in FIG. 4. This ceramic board has aluminum oxide as a main component, and additionally includes oxide containing silicon and oxide containing sodium. The metal layers included in the ceramic laminated substrate of Comparative Example 1 were prepared by dry oxidation in step S1b of FIG. 4. The ceramic laminated substrate 100 of Comparative Example 1 is manufactured by subjecting the ceramic board and the metal layers to the processes of steps S2 and S3. The ceramic laminated substrate 100 does not include magnesium or manganese. That is, in the ceramic laminated substrate 100 manufactured as described above, the intermediate layers 50a, 50b including oxide containing at least one of magnesium and manganese are not formed.

As depicted in FIG. 5, the ceramic laminated substrate 100 manufactured as described above is constructed by laminating a metal layer 40, a ceramic board 120, and metal layers 30 in that order from the bottom. The ceramic board 120 includes at least aluminum oxide 21 ($Al_2O_3$) particles, and oxide 22 (Si—O) containing silicon and sodium oxide 23 ($Na_2O$) at the grain boundaries and triple points of the aluminum oxide 21. The metal layers 30 and 40 have copper (Cu) as a main component and do not include oxygen. Oxides 31 and 41 (Cu—O) containing copper are respectively formed at the boundaries between the metal layers 30 and 40 and the ceramic board 120.

The result of a peeling strength evaluation test for this ceramic laminated substrate 100 will now be described. The peeling strength evaluation test measures the peeling strength of the metal layers 30 and 40 on the ceramic board 120 of the ceramic laminated substrate 100 before and after a reliability test. After this, a test that evaluates the bonding strength of the metal layers 30 and 40 on the ceramic board 120 from these measurement results is performed. Note that the value of the peeling strength was obtained by averaging measured values at 40 points.

First, in the reliability test, the half-bridge circuit is operated continuously for a predetermined time according to a predetermined ON/OFF pattern in a high temperature environment. Note that in this case, the metal layer 40 formed on the rear surface of the ceramic board 120 was grounded so as to have the same potential as the N terminal. This means that the metal layers 30 formed on the front surface of the ceramic board 120 are high-potential metal layers, and the metal layer 40 formed on the rear surface is a low-potential metal layer. Such continuous operation is performed on the front surface of the ceramic laminated substrate 100.

Measurement of peeling strength is performed as described below. On the ceramic laminated substrate 100, parts of the metal layers 30 and 40 are processed into strip-shaped patterns of a predetermined width, one end of each of the strip-shaped metal layers 30 and 40 is peeled off the ceramic board 120, and the peeled ends are pulled in a direction perpendicular to the main surface of the ceramic laminated substrate 100 at a constant speed so that a predetermined length or longer is pulled off. The load during this peeling off is measured.

Evaluation is performed by changing the peeling strength of the metal layers 30 and 40 included in the ceramic laminated substrate 100 before and after the reliability test. When the peeling strength after the reliability test is 95% or higher of the peeling strength before the reliability test, the evaluation "Excellent" is given, when the peeling strength is less than 95% but 90% or more, the evaluation "Very Good" is given, when the peeling strength is less than 90% but 60% or more, the evaluation "Good" is given, and when the peeling strength is less than 60%, the evaluation "Not Good" is given (see FIG. 13). Note that FIG. 13 indicates the ceramic board, the metal layers, and the intermediate layers used for the evaluation and the test results for Specific Examples 1-1 to 1-3 and Comparative Example 1.

As depicted in FIG. 13 (rightmost column), the evaluation results for Comparative Example 1 are "Excellent" for the front surface of the ceramic laminated substrate 100, but "Not Good" for the rear surface. In other words, the ceramic laminated substrate 100 is in a state where the bonding strength of the metal layer 40 on the rear surface of the ceramic board 120 has fallen due to the reliability test. The reason for this has not yet been fully established at present. Without wishing to be bound by theory, this is believed to be due to the reasons given below.

After the reliability test, the ceramic laminated substrate 100 has a composition depicted in FIG. 6. By applying a high potential (positive electrode) and a low potential (negative electrode) voltage to the metal layers 30 and 40 in a high temperature environment, the sodium oxide 23 (see FIG. 5) is separated into sodium ions 24 ($Na^+$) and oxygen ions 25 ($O^{2-}$). The sodium ions 24 pass through the oxide 22 containing silicon at the grain boundaries of the aluminum oxide 21 and migrate toward the low-potential metal layer 40, which is the negative electrode. The oxygen ions 25 pass through the oxide 22 containing silicon at the grain boundaries of the aluminum oxide 21 and migrate toward the high-potential metal layer 30, which is the positive electrode.

The oxygen ions 25 that have migrated to the positive electrode react with the copper included in the metal layers 30 to form oxide 31 containing copper. In the positive electrode, the oxide 31 containing copper increases, and the bonding strength to each of the aluminum oxide 21 and the oxide 22 containing silicon is improved.

On the other hand, the sodium ions 24 that have migrated to the negative electrode react with the oxide 41 containing copper (see FIG. 5) to reduce the copper oxide, resulting in the oxide 41 containing copper in the negative electrode which has reacted with the sodium ions 24 becoming copper, which becomes included in the metal layer 40. The sodium ions 24 are also oxidized to become sodium oxide. In this way, there is a fall in the amount of oxide 41 containing copper, which has high bonding strength for each of the aluminum oxide 21 and the oxide 22 containing silicon. In addition, the concentration of sodium ions (sodium oxide 23) increases in the ceramic board 120 in the vicinity of the boundary with the metal layer 40 that is the negative electrode, which makes it easier for particles of aluminum oxide 21 to detach. For this reason, there is a fall in the bonding strength of the metal layer 40 on the ceramic board 120.

When this ceramic laminated substrate 100 is used in place of the ceramic laminated substrate 10 of the semiconductor device 1, when the metal layer 40 is grounded, the metal layer 40 becomes a low potential (or "reference potential"), the metal layer 30*a* is placed at a high potential, and the metal layer 30*c* is placed at an intermediate potential. This results in a fall in bonding characteristics at parts of the metal layer 40 that face the metal layers 30*a* and 30*c* (and especially the metal layers 30 at the high potential).

Note that the metal layer 40 may be left at a floating potential without being grounded, or the metal layer 40 may be grounded at an intermediate point (that is, grounded so as to reach the same potential as the metal layer 30*c*). In these cases, the metal layers 30*a* and 30*b* on the collector side of the upper arm portion is placed at a high potential and the metal layer 40 is placed at a low potential. This results in a fall in the bonding characteristics of the part of the metal layer 40 facing the metal layers 30*a* and 30*b*. On the other hand, the metal layer 30*d* on the emitter side of the lower arm portion is placed at a low potential and the metal layer 40 facing the metal layer 30*d* is placed at a high potential, resulting in a fall in the bonding characteristics of the metal layer 30*d*.

In the following description, Specific Examples 1-1 to 1-3 relating to the intermediate layers 50*a* and 50*b* in the ceramic laminated substrate 10 including the ceramic board 20 that has aluminum oxide as a main component will be described.

(Ceramic Laminated Substrate of Specific Example 1-1)

Figure 7:
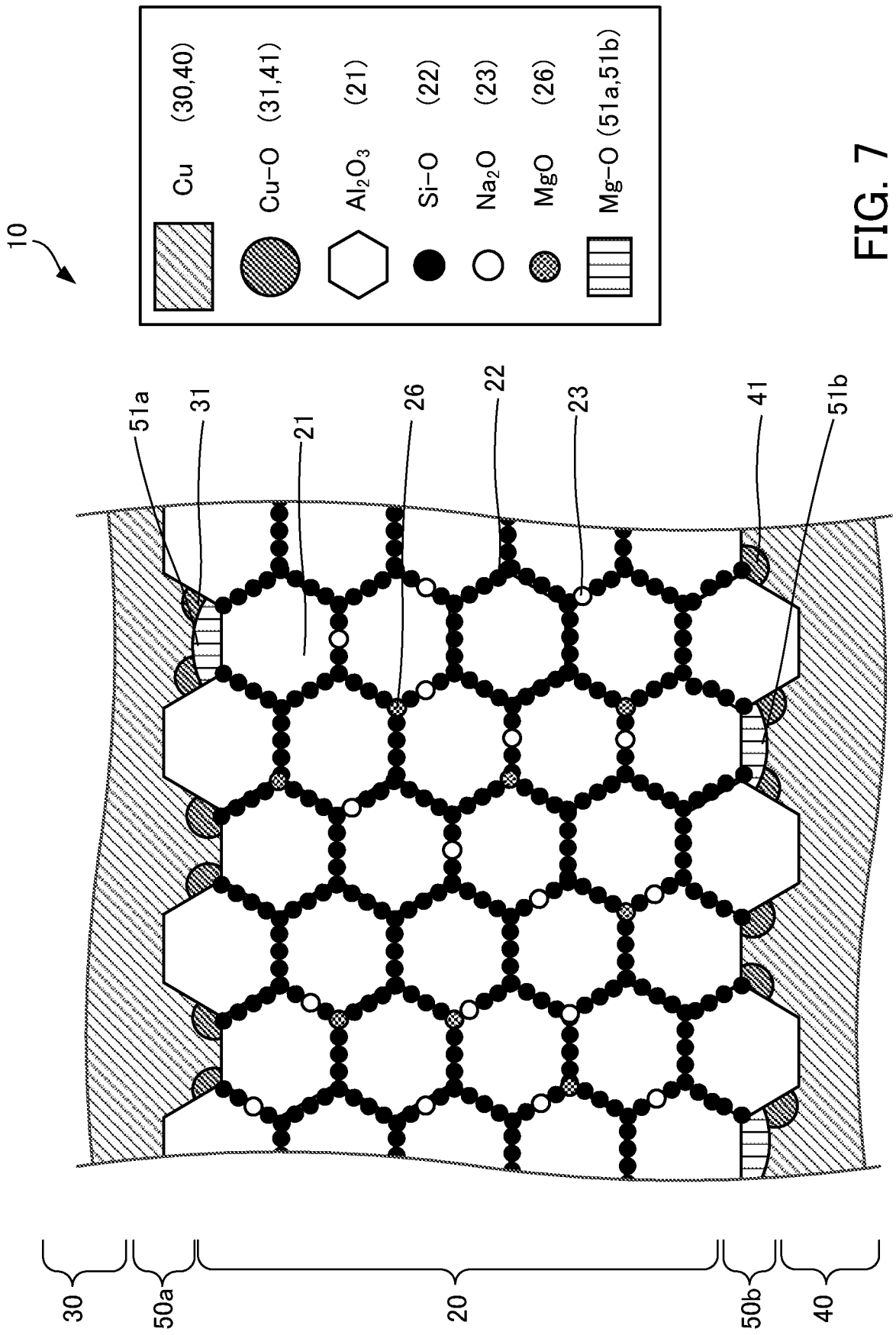
FIG. 7 is a schematic cross-sectional view of a ceramic laminated substrate according to the first embodiment (Specific Example 1-1)
Figure 8:
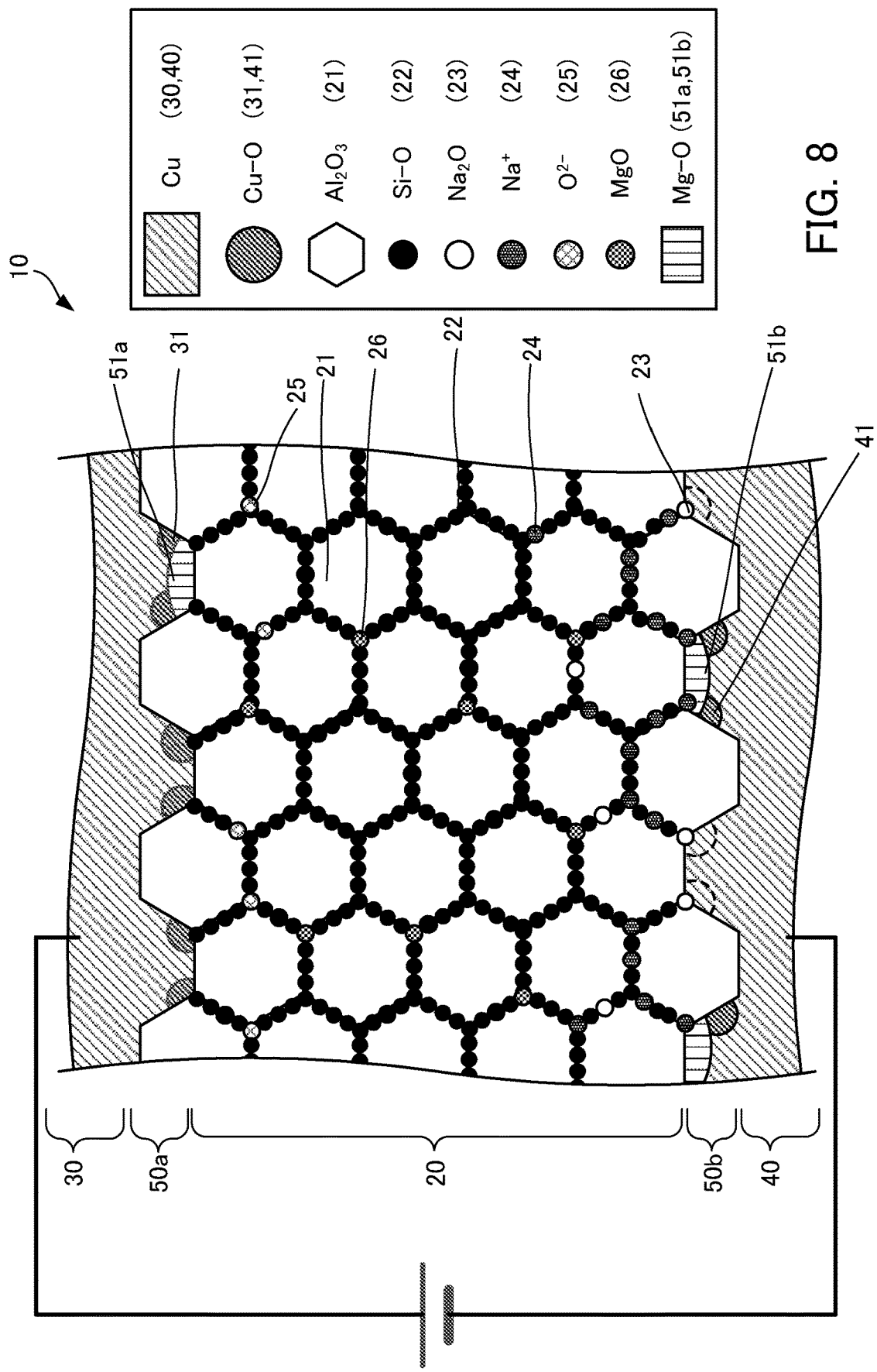
FIG. 8 is a schematic cross-sectional view of the ceramic laminated substrate according to the first embodiment (Specific Example 1-1) under a high voltage in a high temperature environment.

Next, a ceramic laminated substrate 10 including the intermediate layers 50*a* and 50*b* will be described with reference to FIGS. 7, 8 and 13. FIG. 7 is a schematic cross-sectional view of a ceramic laminated substrate according to the first embodiment (Specific Example 1-1), and FIG. 8 is a schematic cross-sectional view of a ceramic laminated substrate according to the first embodiment (Specific Example 1-1) under a high voltage in a high temperature environment. Note that FIG. 7 schematically depicts the microscopic state in the range surrounded by the broken line in FIG. 2. FIG. 8 schematically depicts a microscopic state when a high voltage is applied between the metal layers 30 and 40 in a high temperature environment in FIG. 2.

As depicted in FIG. 7, the ceramic laminated substrate 10 of Specific Example 1-1 is constructed by laminating the metal layer 40, the intermediate layer 50b, the ceramic board 20, the intermediate layer 50a, and the metal layers 30 in that order from the bottom.

The ceramic board 20 is manufactured by applying magnesium oxide powder in step S1a of FIG. 4. The metal layers 30 and 40 are manufactured by dry oxidation in step S1b of FIG. 4. The ceramic board 20 includes, as second oxide, an oxide 22 containing silicon and sodium oxide 23 between the particles of the aluminum oxide 21 (that is, at the grain boundaries and triple points). Magnesium oxide may additionally be included.

The intermediate layers 50a and 50b respectively include oxides 51a and 51b containing magnesium (Mg—O) as the first oxide. The oxides 51a and 51b containing magnesium are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40 and the ceramic board 20 and also at the boundaries between the oxides 51a and 51b containing magnesium, the metal layers 30 and 40, and the ceramic board 20.

On the ceramic laminated substrate 10 (before the reliability test), when the amounts of the oxides 51a and 51b containing magnesium are too large, the bonding strength between the ceramic board 20 and the metal layers 30 and 40 will fall. For this reason, it is preferable for the intermediate layers 50a and 50b including oxides 51a and 51b containing magnesium to be formed so as to cover 10% or more and 80% or less of the bonding surfaces between the ceramic board 20 and the metal layers 30 and 40, and more preferably 20% or more and 50% or less.

A peeling strength evaluation test was also performed on the ceramic laminated substrate 10. As depicted in FIG. 13, the evaluation results for Specific Example 1-1 are "Excellent" for the front surface of the ceramic laminated substrate 10 and "Good" for the rear surface. That is, even when the reliability test was performed on the ceramic laminated substrate 10, compared with Comparative Example 1, the bonding strength of the metal layer 40 to the rear surface of the ceramic board 20 was somewhat improved, and the fall in bonding characteristics was suppressed. The reason for this has not yet been fully established at present. Without wishing to be bound by theory, this is believed to be due to the reasons given below.

After the reliability test, the ceramic laminated substrate 10 has a composition like that depicted in FIG. 8. By applying a high potential (positive electrode) and a low potential (negative electrode) voltage to the metal layers 30 and 40 in a high temperature environment, the sodium oxide 23 (see FIG. 7) is separated into sodium ions 24 ($Na^+$) and oxygen ions 25 ($O^{2-}$). The sodium ions 24 pass through the oxide 22 containing silicon at the grain boundaries and triple points of the aluminum oxide 21 and migrate toward the low-potential metal layer 40, which is the negative electrode. The oxygen ions 25 pass through the oxide 22 containing silicon at the grain boundaries and triple points of the aluminum oxide 21 and migrate toward the high-potential metal layer 30, which is the positive electrode.

The oxygen ions 25 that have migrated to the positive electrode react with the copper included in metal layers 30 to form oxide 31 containing copper. In this way, in the positive electrode, the oxide 31 containing copper increases, and the bonding strength to each of the aluminum oxide 21 and the oxide 22 containing silicon is improved.

On the other hand, the sodium ions 24 that have migrated to the negative electrode react with the oxide 41 containing copper (see FIG. 7) at locations where the oxide 51b containing magnesium is not present to reduce the copper oxide, resulting in the oxide 41 containing copper of the negative electrode which has reacted with the sodium ions 24 becoming copper, which becomes included in the metal layer 40. The sodium ions 24 are also oxidized to become sodium oxide. In this way, there is a fall in the amount of oxide 41 containing copper, which has high bonding strength for each of the aluminum oxide 21 and the oxide 22 containing silicon. In addition, the concentration of sodium ions (sodium oxide 23) increases in the ceramic board 20 in the vicinity of the boundary with the metal layer 40 that is the negative electrode, which makes it easier for particles of aluminum oxide 21 to detach.

However, unlike Comparative Example 1, the ceramic laminated substrate 10 has the magnesium oxide 26 disposed in the intermediate layers 50a and 50b. This blocks the sodium ions 24 from reacting with oxide 41 containing copper. Accordingly, at locations where the oxide 51b containing magnesium is formed, the oxide 41 containing copper remains without becoming copper. The magnesium oxide 26 is also present at the grain boundaries and triple points of the aluminum oxide 21. This means that some migration routes in the oxide 22 containing silicon at the grain boundaries are blocked, which blocks the migration of some of the sodium ions 24. Accordingly, the reaction between the sodium ions 24 and the oxide 41 containing copper is suppressed. This means that the bonding strength between the ceramic board 20 and the metal layer 40 is maintained at such locations.

As described above, in the ceramic laminated substrate 10 of Specific Example 1-1, compared with the case of Comparative Example 1, a fall in bonding strength between the ceramic board 20 and the metal layer 40 is suppressed, and the bonding strength of the metal layer 40 to the ceramic board 20 is improved.

According to Comparative Example 1, even without the intermediate layers 50a and 50b, it is possible to maintain a certain amount of bonding strength of the metal layers 30 on the front surface (high potential side) of the ceramic board 120, but there is a fall in bonding characteristics for the metal layer 40 on the rear surface (low potential side) of the ceramic board 120. The intermediate layer 50b between the rear surface (low potential side) of the ceramic board 20 of the ceramic laminated substrate 10 of the first embodiment and the metal layer 40 suppresses this fall in the bonding characteristics of the metal layer 40. Accordingly, in the ceramic laminated substrate 10, when the intermediate layer 50b is provided at least between the rear surface (low potential side) of the ceramic board 20 and the metal layer 40, a fall in the bonding characteristics of the metal layer 40 is suppressed and deterioration in the ceramic laminated substrate 10 may be prevented.

The semiconductor device 1 described above includes the semiconductor chips 60a, 60b, 65a, and 65b, the bonding member 35, and the ceramic laminated substrate 10 that is plate-like, has a front surface and a rear surface that is opposite the front surface, and has the semiconductor chips 60a, 60b, 65a, and 65b bonded via the bonding member 35 onto the front surface. The ceramic laminated substrate 10 includes the ceramic board 20, the metal layers 30 and 40, and the intermediate layer 50b. The ceramic board 20 is plate-like, has a first main surface (or "front surface" in the first embodiment) and a second main surface that is opposite the first main surface (or "rear surface" in the first embodiment), and includes ceramic particles. A high potential voltage is applied to the metal layers 30, which contain copper and are bonded to the first main surface of the ceramic board 20. A low potential voltage is applied to the metal layer 40, which contains copper and is bonded to the second main surface of the ceramic board 20. The intermediate layer 50b is formed between the second main surface of the ceramic board 20 and the low-potential metal layer 40, and includes an oxide 51b containing magnesium. In the ceramic laminated substrate 10, due to the oxide 51b containing magnesium included between the ceramic board 20 and the low-potential metal layer 40, a fall in the bonding characteristics of the metal layer 40 on the ceramic board 20 is suppressed, even when a high voltage is applied in a high temperature environment. This means that deterioration in the ceramic laminated substrate 10 may be prevented and it is possible to suppress a fall in the reliability of the semiconductor device 1.

Note that in the first and second embodiments, when the metal layer 40 formed on the rear surface of the ceramic board 20 is grounded so as to have the same potential as the N terminal, the high-potential metal layer is the metal layers 30a, 30b, and 30c formed on the front surface of the ceramic board 20. The low-potential metal layer is the metal layer 40 formed on the rear surface of the ceramic board 20.

Also, in the first and second embodiments, when the metal layer 40 formed on the rear surface of the ceramic board 20 is grounded so as to have the same potential as the M terminal, or when the metal layer 40 is not grounded and has a floating potential, high-potential metal layers are the metal layers 30a and 30b formed on the front surface of the ceramic board 20 and a low-potential metal layer is the metal layer 40 which is formed on the rear surface of the ceramic board 20 and faces the metal layers 30a and 30b. Also in this case, a low-potential metal layer is the metal layer 30d formed on the front surface of the ceramic board 20 and a high-potential metal layer is the metal layer 40 that is formed on the rear surface of the ceramic board 20 and faces the metal layer 30d.

Regions (positions) where intermediate layers are to be formed in keeping with the potentials of the metal layers 30 and the metal layer 40 of the ceramic board 20 when the semiconductor device 1 is driven or stopped will be described later in a third embodiment.

Note that in the present embodiment, coating the surface of the plate-like molded object with magnesium oxide powder in the ceramic board preparing step (step S1a) and firing at a predetermined temperature for a predetermined time has been described as the method of forming the oxide containing magnesium in the intermediate layers 50a and 50b. The present disclosure is not limited to this, and it is possible to apply a solution containing manganese to the surface of the plate-like molded object in the ceramic board preparing step (step S1a) and then perform firing. It is possible to form oxide containing magnesium in the intermediate layers 50a and 50b by sputtering or vapor deposition of magnesium or oxide containing magnesium on the ceramic board and/or metal foil during the ceramic board preparing step (step S1a) and the metal foil forming step (step S1b).

Also in the present embodiment, immersion of the metal foil in solution containing manganese and oxidization during the metal foil forming step (step S1b) has been described as the method of forming oxide containing manganese in the intermediate layers 50a and 50b. However, the present disclosure is not limited to this, and a powder or solution containing manganese may be applied onto the surface of the plate-like molded body and then fired during the ceramic board preparing step (step S1a). It is also possible to form oxide containing manganese in the intermediate layers 50a and 50b by sputtering or vapor deposition of manganese or oxide containing manganese on the ceramic board and/or metal foil during the ceramic board preparing step (step S1a) and/or the metal foil preparing step (step S1b).

(Ceramic Laminated Substrate of Specific Example 1-2)

Figure 9:
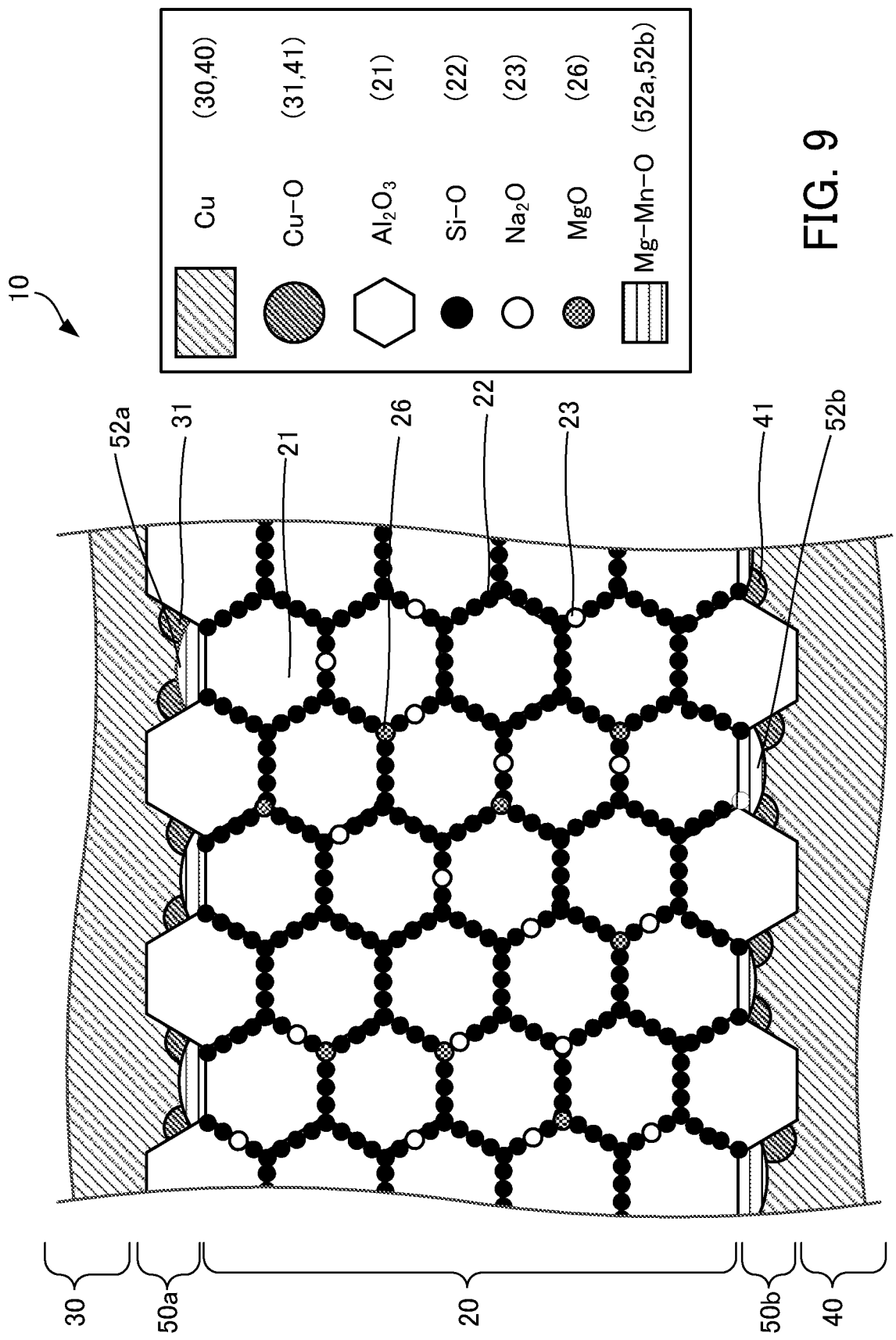
FIG. 9 is a schematic cross-sectional view of a ceramic laminated substrate according to the first embodiment (Specific Example 1-2)
Figure 10:
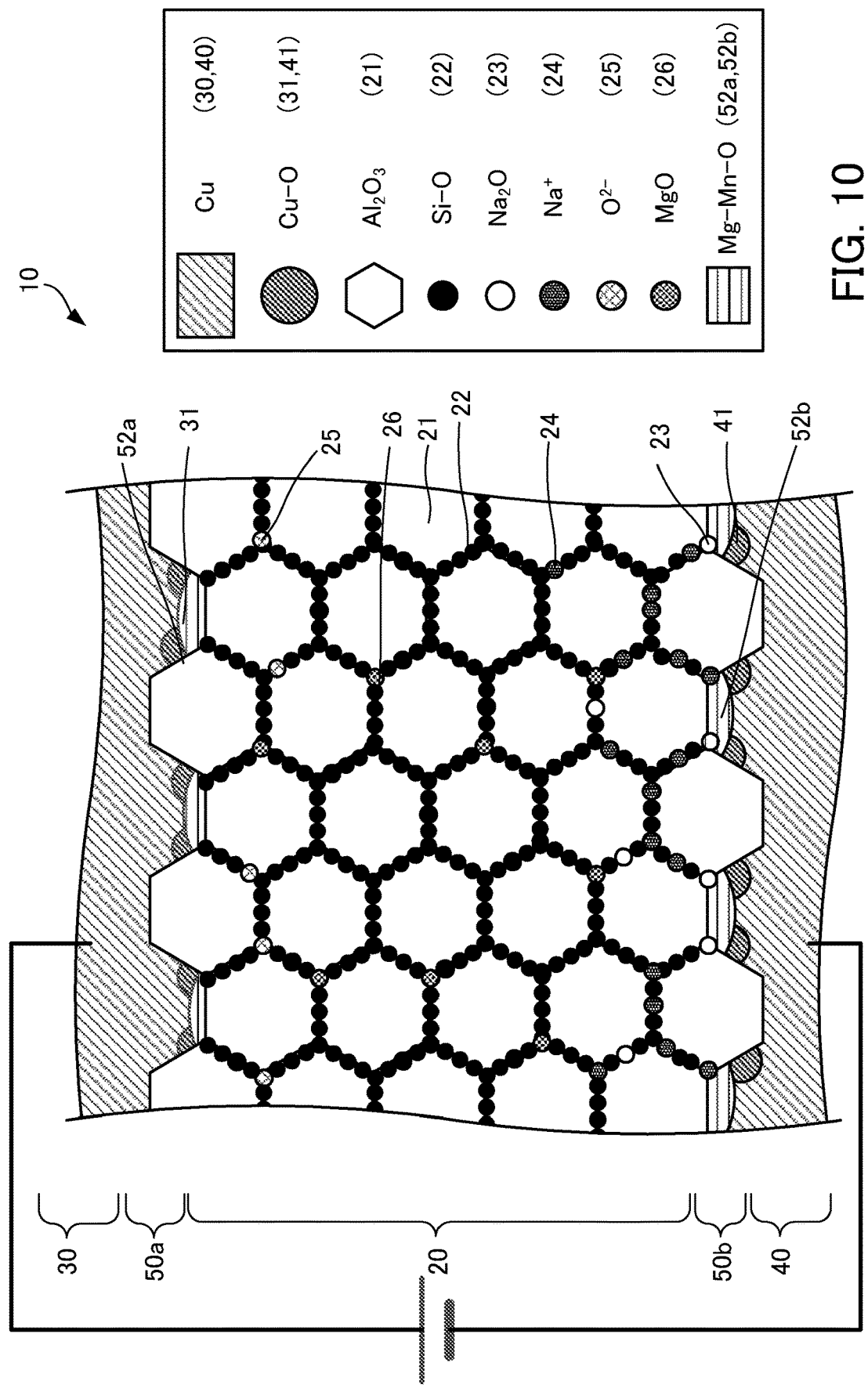
FIG. 10 is a schematic cross-sectional view of the ceramic laminated substrate according to the first embodiment (Specific Example 1-2) under a high voltage in a high temperature environment.

In Specific Example 1-2, a case where the ceramic board 20 of the ceramic laminated substrate 10 is manufactured by applying magnesium oxide powder in step S1a of FIG. 4 and the metal layers 30 and 40 are manufactured by wet oxidation will be described with reference to FIGS. 9, 10 and 13. FIG. 9 is a schematic cross-sectional view of a ceramic laminated substrate according to the first embodiment (Specific Example 1-2), and FIG. 10 is a schematic cross-sectional view of the ceramic laminated substrate according to the first embodiment (Specific Example 1-2) under a high voltage in a high temperature environment. Note that FIG. 9 schematically depicts a microscopic state at a location corresponding to the range surrounded by the broken line in FIG. 2. FIG. 10 schematically depicts a microscopic state when a high voltage is applied between the metal layers 30 and 40 in FIG. 2 in a high temperature environment.

As depicted in FIG. 9, the ceramic laminated substrate 10 in Specific Example 1-2 is constructed by laminating the metal layer 40, the intermediate layer 50b, the ceramic board 20, the intermediate layer 50a, and the metal layers 30 in that order from the bottom.

In the same way as in Specific Example 1-1, the ceramic board 20 is manufactured by applying magnesium oxide powder in step S1a of FIG. 4. On the other hand, unlike Specific Example 1-1, the metal layers 30 and 40 are manufactured by wet oxidation in step S1b of FIG. 4. The ceramic board 20 includes, as second oxide, the oxide 22 containing silicon and sodium oxide 23 between the particles of the aluminum oxide 21 (that is, at the grain boundaries and triple points). Magnesium oxide may additionally be included.

The metal layers 30 and 40 are formed with copper as a main component. The intermediate layers 50a and 50b respectively include oxides 52a and 52b (Mg—Mn—O) containing magnesium and manganese as the first oxide. The oxides 52a and 52b containing magnesium and manganese are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40, the ceramic board 20, and the oxides 52a and 52b containing magnesium and manganese.

In Specific Example 1-1, on the ceramic laminated substrate 10 (before the reliability test), the range covered by the intermediate layers 50a and 50b is limited, so it is not possible to increase the bonding strength between the ceramic board 20 and the metal layers 30 and 40. In Specific Example 1-2, intermediate layers 50a and 50b including the oxides 52a and 52b containing magnesium and manganese may be formed over a wide area. As a result, the bonding strength between the ceramic board 20 and the metal layers 30 and 40 may be increased compared to Specific Example 1-1. These intermediate layers 50a and 50b are preferably formed so as to cover 20% or more and 80% or less of the bonding surfaces between the ceramic board 20 and the metal layers 30 and 40.

A peeling strength evaluation test was also performed on this ceramic laminated substrate 10. As depicted in FIG. 13, the evaluation results for Specific Example 1-2 are "Excellent" for the front surface and the rear surface of the ceramic laminated substrate 10. That is, even when the reliability test was performed on the ceramic laminated substrate 10, compared with Specific Example 1-1, the bonding strength of the metal layer 40 to the rear surface of the ceramic board 20 was improved, and the fall in bonding characteristics was suppressed. The reason for this has not yet been fully established at present. Without wishing to be bound by theory, this is believed to be due to the reasons given below.

The ceramic laminated substrate 10 after the reliability test has a composition like that depicted in FIG. 10. By applying a high potential (positive electrode) and a low potential (negative electrode) voltage to the metal layers 30 and 40 in a high temperature environment, the sodium oxide 23 (see FIG. 9) is separated into sodium ions 24 and oxygen ions 25. The sodium ions 24 pass through the oxide 22 containing silicon at the grain boundaries and triple points of the aluminum oxide 21 and migrate toward the low-potential metal layer 40, which is the negative electrode. The oxygen ions 25 pass through the oxide 22 containing silicon at the grain boundaries of the aluminum oxide 21 and migrate toward the high-potential metal layer 30, which is the positive electrode.

The oxygen ions 25 that have migrated to the positive electrode react with the copper included in the metal layers 30 to form oxide 31 containing copper. In this way, in the positive electrode, the oxide 31 containing copper increases, and the bonding strength to each of the aluminum oxide 21 and the oxide 22 containing silicon is improved.

However, in Specific Example 1-2, in the ceramic laminated substrate 10, the magnesium oxide 26 is disposed at the grain boundaries and triple points of the aluminum oxide 21. In addition, the oxide 52b containing magnesium and manganese is formed at the boundaries and triple points between the aluminum oxide 21 of the negative electrode and the low-potential metal layer 40. In particular, the region where the oxide 52b containing magnesium and manganese is formed is wider than that where the oxide 51b containing magnesium is formed in Specific Example 1-1. This means that migration of the sodium ions 24 that have migrated toward the negative electrode is blocked by the oxide 52b containing magnesium and manganese. Accordingly, reactions between the sodium ions 24 and the oxide 41 containing copper are more inhibited than in Specific Example 1-1. This means that the oxide 41 containing copper remains without becoming Cu at the boundaries between the aluminum oxide 21, the metal layer 40, and the oxide 52b containing magnesium and manganese. Accordingly, the bonding strength between the ceramic board 20 and the metal layer 40 is more favorably maintained than in Specific Example 1-1.

As described above, with the ceramic laminated substrate 10 of Specific Example 1-2, compared to the case of Specific Example 1-1, the fall in bonding strength between the ceramic board 20 and the metal layer 40 is suppressed and the bonding strength of the metal layer 40 to the ceramic board 20 is improved.

(Ceramic Laminated Substrate of Specific Example 1-3)

Figure 11:
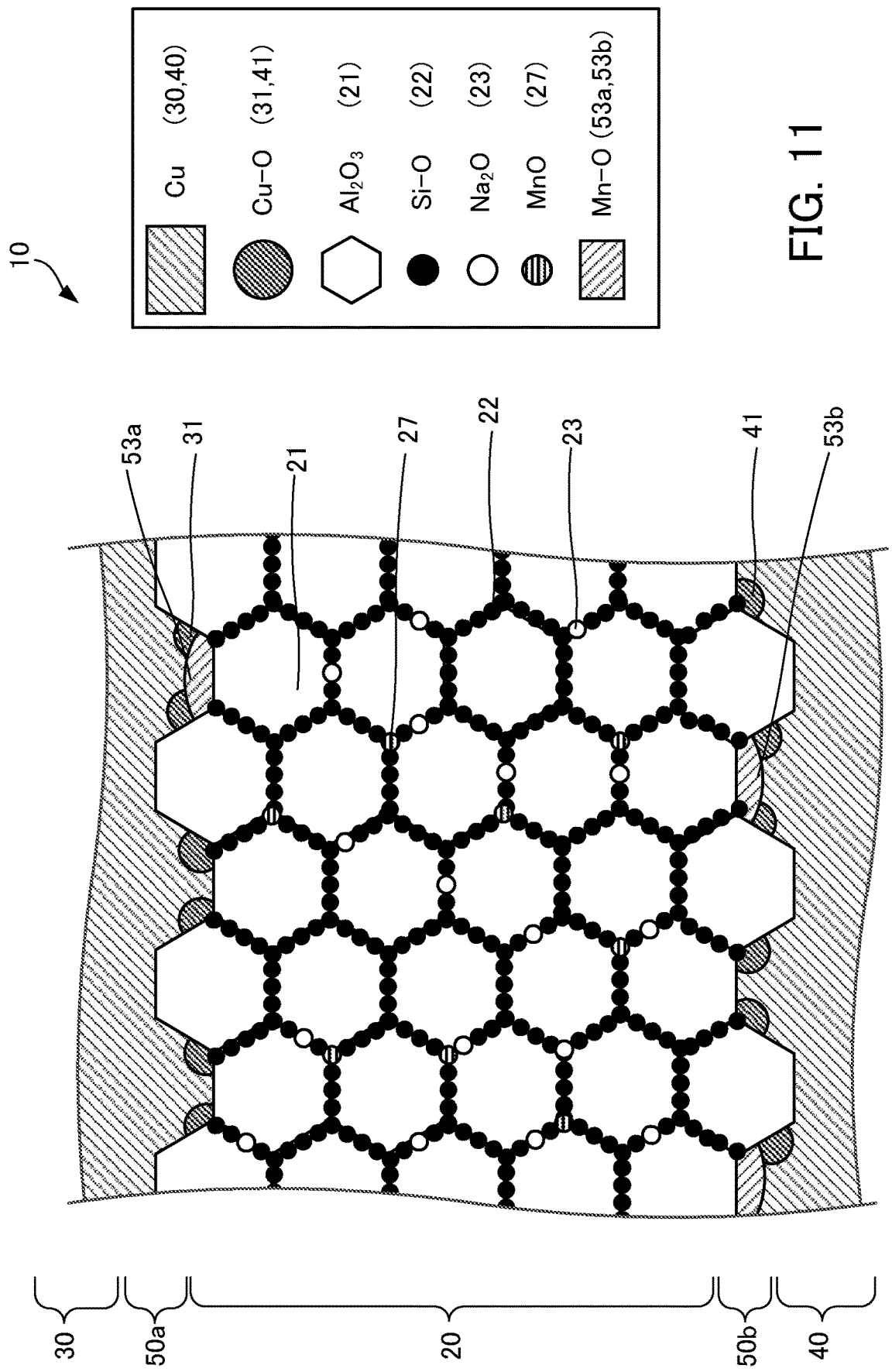
FIG. 11 is a schematic cross-sectional view of a ceramic laminated substrate according to the first embodiment (Specific Example 1-3)
Figure 12:
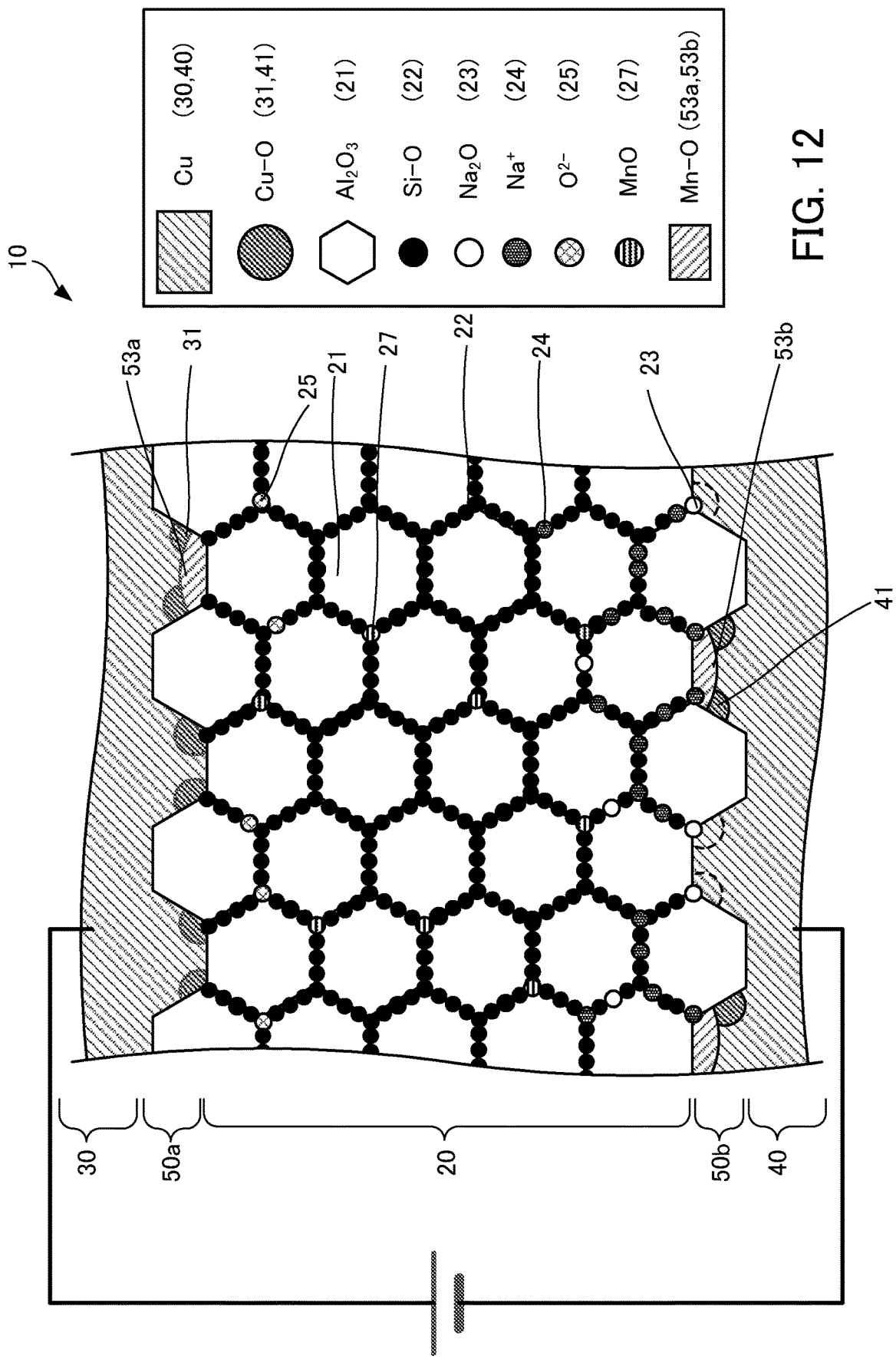
FIG. 12 is a schematic cross-sectional view of the ceramic laminated substrate according to the first embodiment (Specific Example 1-3) under a high voltage in a high temperature environment.

In Specific Example 1-3, a case where the ceramic board 20 of the ceramic laminated substrate 10 is manufactured without applying magnesium oxide powder in step S1a of FIG. 4 and the metal layers 30 and 40 are manufactured by wet oxidation will be described with reference to FIGS. 11, 12 and 13. FIG. 11 is a schematic cross-sectional view of a ceramic laminated substrate according to the first embodiment (Specific Example 1-3), and FIG. 12 is a schematic cross-sectional view of the ceramic laminated substrate according to the first embodiment (Specific Example 1-3) under a high voltage in a high temperature environment. Note that FIG. 11 schematically depicts a microscopic state at the range surrounded by the broken line in FIG. 2. FIG. 12 schematically depicts a microscopic state when a high voltage is applied between the metal layers 30 and 40 in FIG. 2 in a high temperature environment.

As depicted in FIG. 11, the ceramic laminated substrate 10 in Specific Example 1-3 is constructed by laminating the metal layer 40, the intermediate layer 50b, the ceramic board 20, the intermediate layer 50a, and the metal layers 30 in that order from the bottom.

Unlike Specific Example 1-1 and Specific Example 1-2, the ceramic board 20 is manufactured without applying magnesium oxide powder in step S1a of FIG. 4. In the same way as in Specific Example 1-2, the metal layers 30 and 40 are manufactured by wet oxidation in step S1b of FIG. 4. The ceramic board 20 includes, as second oxide, the oxide 22 containing silicon and sodium oxide 23 between the particles of the aluminum oxide 21 (that is, at the grain boundaries and triple points).

The metal layers 30 and 40 are formed with copper as a main component. The intermediate layers 50a and 50b respectively include oxides 53a and 53b (Mn—O) containing manganese as the first oxide. The oxides 53a and 53b containing manganese are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40, the ceramic board 20, and the oxides 53a and 53b containing manganese.

On the ceramic laminated substrate 10 (before the reliability test), when the amount of the oxide 53 containing manganese is too great, the bonding strength between the ceramic board 20 and the metal layers 30 and 40 falls. For this reason, the intermediate layers 50a and 50b including the oxides 53a and 53b containing manganese are preferably formed so as to cover 10% or more and 80% or less of the bonding surfaces between the ceramic board 20 and the metal layers 30 and 40, and more preferably 20% or more and 50% or less.

A peeling strength evaluation test was also performed on this ceramic laminated substrate 10. As depicted in FIG. 13, the evaluation results for Specific Example 1-3 are "Excellent" for the front surface and "Very Good" for the rear surface of the ceramic laminated substrate 10. That is, even when the reliability test was performed on the ceramic laminated substrate 10, compared with Specific Example 1-1, the bonding strength of the metal layer 40 to the rear surface of the ceramic board 20 is somewhat improved, and the fall in bonding characteristics is suppressed. The reason for this has not yet been fully established at present. Without wishing to be bound by theory, this is believed to be due to the reasons given below.

The ceramic laminated substrate 10 after the reliability test has a composition like that depicted in FIG. 12. By applying a high potential (positive electrode) and a low potential (negative electrode) voltage to the metal layers 30 and 40 in a high temperature environment, the sodium oxide 23 (see FIG. 11) is separated into sodium ions 24 and oxygen ions 25. The sodium ions 24 pass through the oxide 22 containing silicon at the grain boundaries and triple points of the aluminum oxide 21 and migrate toward the low-potential metal layer 40, which is the negative electrode. The oxygen ions 25 pass through the oxide 22 containing silicon at the grain boundaries of the aluminum oxide 21 and migrate toward the high-potential metal layer 30, which is the positive electrode.

The oxygen ions 25 that have migrated to the positive electrode react with the copper included in the metal layers 30 to form oxide 31 containing copper. In this way, in the positive electrode, the oxide 31 containing copper increases, and the bonding strength to each of the aluminum oxide 21 and the oxide 22 containing silicon is improved.

On the other hand, the sodium ions 24 that have migrated to the negative electrode react with the oxide 41 containing copper (see FIG. 11) at locations where the oxide 53b containing manganese is not present, which reduces the copper oxide and results in the oxide 41 containing copper of the negative electrode that has reacted with the sodium ions 24 becoming copper, which becomes included in the metal layer 40. The sodium ions 24 are also oxidized to become sodium oxide. In this way, there is a fall in the amount of oxide 41 containing copper, which has high bonding strength for each of the aluminum oxide 21 and the oxide 22 containing silicon. In addition, the concentration of sodium ions (sodium oxide 23) increases in the vicinity of the boundary of the metal layer 40 of the negative electrode and at the grain boundaries and triple points of the oxide 22 containing silicon, which makes it easier for particles of aluminum oxide 21 to detach.

However, the ceramic laminated substrate 10 of Specific Example 1-3 has the manganese oxide 27 disposed in the intermediate layers 50a and 50b. This blocks the sodium ions 24 from reacting with the oxide 41 containing copper. Accordingly, at locations where the oxide 53b containing manganese is formed, the oxide 41 containing copper remains without becoming copper. The manganese oxide 27 is also present at the grain boundaries and triple points of the aluminum oxide 21. This means that some migration routes in the oxide 22 containing silicon at the grain boundaries are blocked, which blocks the migration of some of the sodium ions 24. Accordingly, the reaction between the sodium ions 24 and the oxide 41 containing copper is suppressed. This means that the bonding strength between the ceramic board 20 and the metal layer 40 is maintained at such locations. The bonding strength in this case is believed to be larger than in Specific Example 1-1.

As described above, in the ceramic laminated substrate 10 of Specific Example 1-3, compared with the case of Specific Example 1-1, a fall in bonding strength between the ceramic board 20 and the metal layer 40 is suppressed, and the bonding strength of the metal layer 40 to the ceramic board 20 is improved.

Second Embodiment

Compared to the ceramic board 20 of the first embodiment, the ceramic board 20 included in the ceramic laminated substrate 10 according to the second embodiment further contains zirconium oxide ($ZrO_2$). Note that this second embodiment will be described based on the semiconductor device 1 according to the first embodiment (depicted in FIGS. 1 and 2).
(Method of Manufacturing Semiconductor Device)

The ceramic laminated substrate 10 according to the second embodiment is also manufactured according to the method of manufacturing in the flowchart in FIG. 4 described in the first embodiment. In this second embodiment also, when manufacturing the ceramic laminated substrate 10, first, a ceramic board and metal foil are prepared (steps S1a and S1b). Note that either step S1a or S1b may be performed first.

Preparation of the ceramic board will now be described (step S1a). First, silicon oxide ($SiO_2$) powder and also zirconium oxide ($ZrO_2$) powder are added to aluminum oxide ($Al_2O_3$) powder, and the mixture is stirred together with a binder or the like and molded into a board. Magnesium oxide (MgO) powder is applied to the surface of the board-shaped molded object, which is then fired at a predetermined temperature for a predetermined time. The ceramic board formed by firing in this way contains aluminum oxide as ceramic particles, includes oxide ("second oxide") containing zirconium and oxide containing silicon at the grain boundaries and triple points of the ceramic particles, and also includes an oxide containing magnesium at the surface. An oxide containing magnesium may also be formed at the grain boundaries and triple points of the ceramic particles. Due to the presence of oxide containing zirconium, it is possible to increase the transverse rupture strength compared to the case where oxide containing zirconium is not present.

To manufacture the ceramic board 20 of the second embodiment, yttrium oxide ($Y_2O_3$), magnesium oxide (MgO), or calcium oxide (CaO) powder may be added to zirconium oxide ($ZrO_2$) powder. Alternatively, partially stabilized zirconia powder may be added instead of zirconium oxide ($ZrO_2$) powder. By doing so, the ceramic board 20 includes aluminum oxide as ceramic particles and oxide (second oxide) containing partially stabilized zirconia and silicon at the grain boundaries and triple points of the ceramic particles. In this case, the partially stabilized zirconia preferably contains 2.5 mol % or more and 3.5 mol % or less of yttrium in terms of yttrium oxide (YO) equivalent with respect to zirconium in terms of zirconium oxide ($ZrO_2$) equivalent. By doing so, the transverse rupture strength may be further increased compared to a case where only zirconium oxide is used. Also, the average particle size of the ceramic particles is 0.5 µm or more and 25 µm or less, and more preferably, 1 µm or more and 10 µm or less.

In the ceramic board 20, the content of aluminum oxide is preferably 80 wt % or more and 95 wt % or less with respect to the total amount of oxide equivalent, and more preferably 84 wt % or more and 92 wt % or less. In addition, the content of the oxide containing zirconium is 5.0 wt % or more and 20.0 wt % or less in terms of zirconium oxide ($ZrO_2$) equivalent with respect to the total amount of oxide equivalent, and more preferably 8 wt % or more and 16 wt % or less. In addition, the content of the oxide containing silicon in the ceramic board 20 is 0.01 wt % or more and 3.0 wt % or less in terms of silicon oxide ($SiO_2$) equivalent with respect to the total amount of oxide equivalent, and more preferably 1.0 wt % or more and 3.0 wt % or less. When the content of the oxide containing silicon is too low, many voids will remain in the ceramic board, which makes the board susceptible to cracking. On the other hand, when the amount is too large, the thermal conductivity of the ceramic board will fall, resulting in poor heat dissipation.

In addition to ceramic particles, oxide containing magnesium, oxide containing silicon, and oxide containing zirconium, the ceramic board 20 according to the second embodiment also includes various materials used in manufacturing. An example of such a material is an oxide containing sodium. One example is sodium oxide. The content of the oxide containing sodium in the ceramic board 20 is 0.001 wt % or more and 0.2 wt % or less as sodium oxide ($Na_2O$) equivalent with respect to the total amount of oxide equivalent, and more preferably 0.002 wt % or more and 0.2 wt % or less. When the content of the oxide containing sodium is too low, it will be difficult to refine the powdered ceramic raw material. When the amount is too large, β-alumina is formed, which tends to cause deterioration in the insulating properties and a drop in strength. It is preferable for the ceramic board 20 to not include β-alumina.

The preparation of the metal foil in step S1b is performed in the same way as in the first embodiment. The method of manufacturing from step S2 onwards is performed in the same way as the first embodiment using the ceramic board prepared in step S1a of the second embodiment.

With the method described above, the ceramic laminated substrate 10 including the intermediate layers 50a and 50b between the ceramic board 20 and the metal layers 30 and 40 is manufactured. In this ceramic laminated substrate 10, the intermediate layers 50a and 50b suppress deterioration in bonding characteristics between the metal layers 30 and 40 and the ceramic board 20. Note that when magnesium oxide powder has been applied in the step S1a of the second embodiment, in the ceramic laminated substrate 10, the content of the oxide containing magnesium in the intermediate layers 50a and 50b and the ceramic board 20 is 0.1 wt % or more and 1.5 wt % or less in terms of magnesium oxide (MgO) equivalent with respect to the total amount of oxide equivalent. In addition, in this case, the content of magnesium in terms of magnesium oxide (MgO) equivalent is 2.0 wt % or more and 20.0 wt % or less with respect to the content of zirconium in terms of zirconium oxide ($ZrO_2$) equivalent, and more preferably 7.5 wt % or more and 15 wt % or less. When magnesium oxide powder is not applied in step S1a of the second embodiment, the ceramic laminated substrate 10 will not contain magnesium (that is, the amount will be below the lower measurement limit of 0.01 wt %). When wet oxidation is performed in step S1b using a solution containing manganese, in the ceramic laminated substrate 10, the content of oxide containing manganese in the ceramic board 20 and the intermediate layers 50a and 50b is 0.01 wt % or more and 0.15 wt % or less. In addition, in this case, the content of manganese in terms of manganese oxide equivalent is 0.05 wt % or more and 2 wt % or less with respect to the content of zirconium in terms of zirconium oxide equivalent, and more preferably 0.2 wt % or more and 0.8 wt % or less. When wet oxidation using solution containing manganese was not performed in step S1b, inclusion of manganese in the ceramic laminated substrate 10 was not confirmed, that is, the amount is below the lower measurement limit of 0.01 wt %.

The second embodiment is not limited to the above, and it is possible to form oxide containing magnesium in the intermediate layers 50a and 50b by sputtering or vapor deposition of magnesium or oxide containing magnesium on the ceramic board and/or metal foil when preparing the ceramic board (step S1a) and preparing the metal foil (step S1b). In the ceramic board preparing step (step S1a), magnesium or a powder or solution containing magnesium may be applied onto the surface of the plate-like molded object and then fired.

In the following description, Specific Examples 2-1 to 2-3 relating to the intermediate layers 50a and 50b in the ceramic laminated substrate 10 including a ceramic board including aluminum oxide and zirconium oxide as main components will be described. Note that the same reliability tests as the first embodiment are also performed in the second embodiment.

(Ceramic Laminated Substrate of Comparative Example 2)

Figure 14:
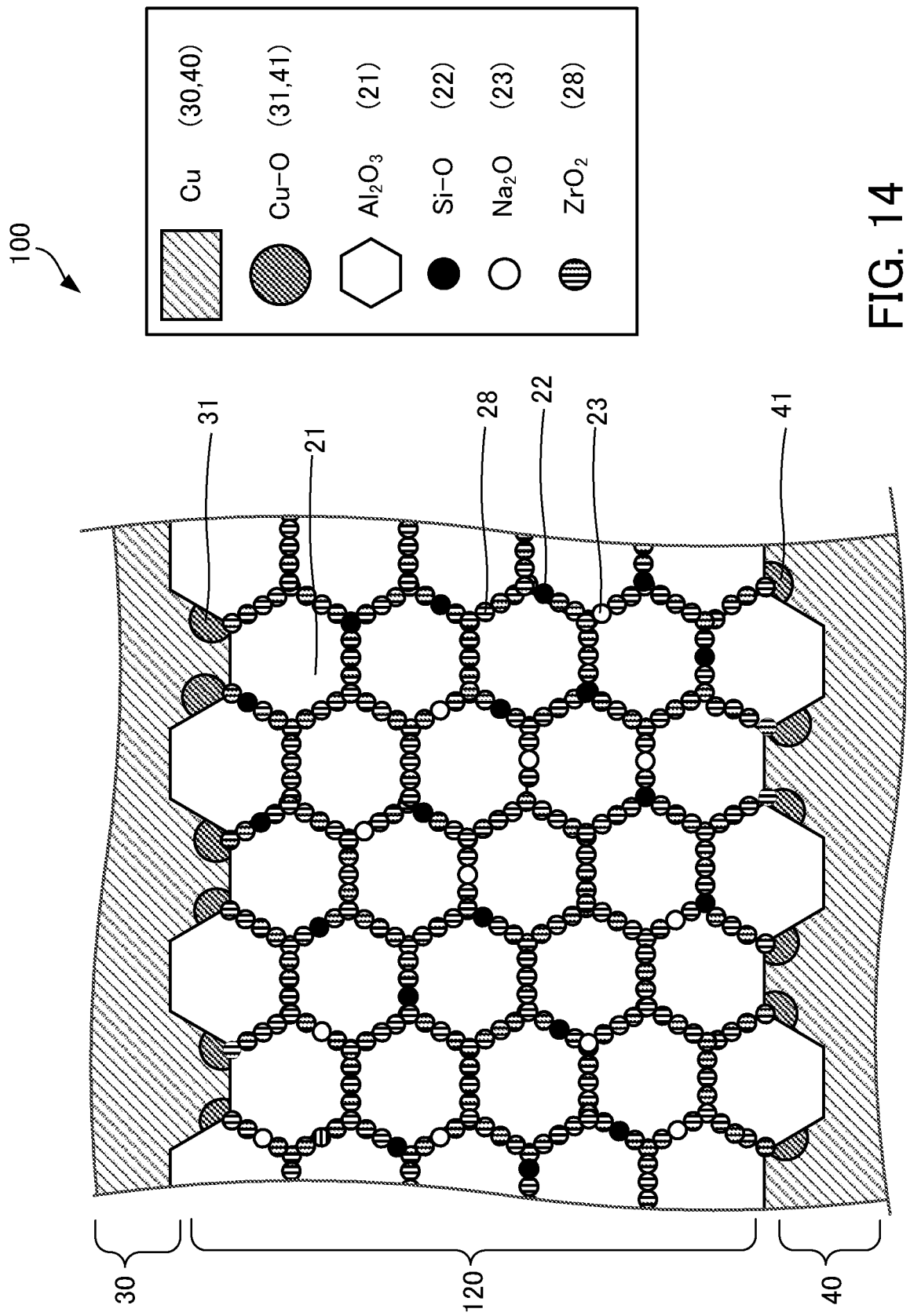
FIG. 14 is a schematic cross-sectional view of a ceramic laminated substrate of Comparative Example 2.
Figure 15:
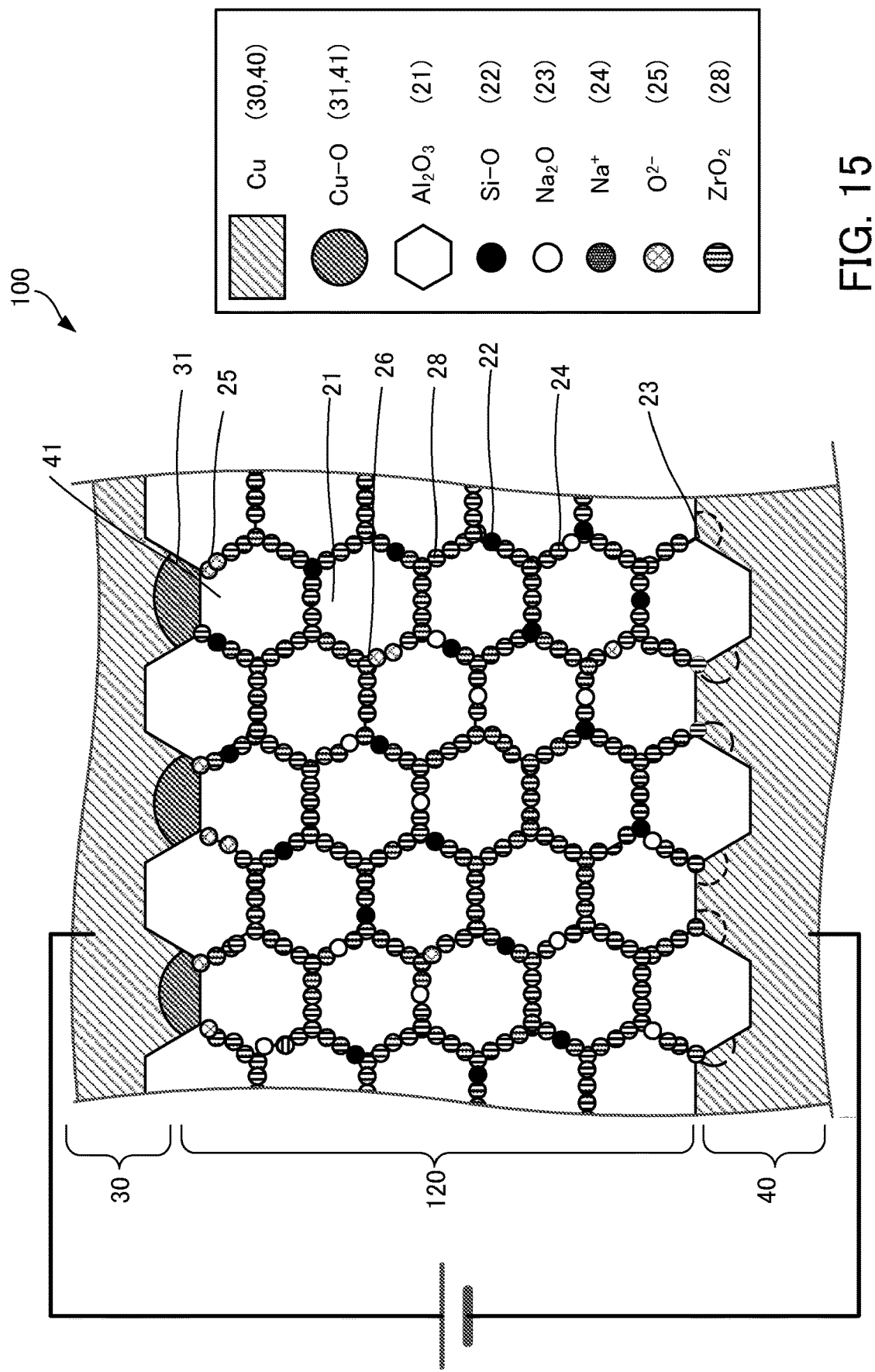
FIG. 15 is a schematic cross-sectional view of the ceramic laminated substrate of Comparative Example 2 under a high voltage in a high temperature environment.

In the following description, to describe how the intermediate layers 50a and 50b suppress deterioration in the bonding characteristics of the metal layers 30 and 40 on the ceramic board 20 according to the second embodiment, first, as Comparative Example 2, a ceramic laminated substrate 10 that does not include the intermediate layers 50a and 50b will be described with reference to FIGS. 14 and 15. FIG. 14 is a schematic cross-sectional view of the ceramic laminated substrate of Comparative Example 2, and FIG. 15 is a schematic cross-sectional view of the ceramic laminated substrate of Comparative Example 2 under a high voltage in a high temperature environment. Note that FIG. 14 schematically depicts the microscopic state in the range surrounded by the broken line in FIG. 2. FIG. 15 schematically depicts the microscopic state when a high voltage is applied between the metal layers 30 and 40 in a high temperature environment in FIG. 2.

The ceramic board 120 of Comparative Example 2 was manufactured without applying magnesium oxide powder in step S1a (of the second embodiment) in FIG. 4. The metal layers 30 and 40 were manufactured by dry oxidation in step S1b of FIG. 4.

As depicted in FIG. 14, the ceramic laminated substrate 100 manufactured as described above is constructed by laminating the metal layer 40, the ceramic board 120, and the metal layers 30 in that order from the bottom. The ceramic board 120 includes, as the second oxide, oxide 22 containing silicon and zirconium oxide 28 between the particles of the aluminum oxide 21 (at the grain boundaries and triple points). The ceramic board 120 may additionally include sodium oxide 23. Note that in place of zirconium oxide 28, the ceramic board 120 may include oxide containing zirconium, for example partially stabilized zirconia. In the same way as the first embodiment, the metal layers 30 and 40 are constructed with copper as a main component.

The ceramic laminated substrate 100 of this comparative example does not include magnesium or manganese. That is, in the ceramic laminated substrate 100 manufactured as described above, the intermediate layers 50a, 50b including oxide containing at least one of magnesium and manganese are not formed.

A peeling strength evaluation test was also performed in the same way as the first embodiment on this ceramic laminated substrate 100. The evaluation result was "Not Good" for both the front surface and rear surface of the ceramic board (this has not been illustrated in the table). The reason for this has not yet been fully established at present. Without wishing to be bound by theory, this is believed to be due to the reasons given below.

As depicted in FIG. 15, in the ceramic laminated substrate 100 of Comparative Example 2, a high potential (positive electrode) and low potential (negative electrode) voltage is applied to the metal layers 30 and 40 in a high temperature environment. As a result, the oxide 41 containing copper (Cu—O) formed at the boundaries between the metal layer 40 on the negative electrode side and the zirconium oxide 28 of the ceramic board 120 is reduced. As one example, the reaction $CuO+2e$ (electrons)$\rightarrow Cu+O^{2-}$ occurs. This means that on the negative electrode side, there is a decrease in the oxide 41 containing copper, and the bonding strength between the metal layer 40 and the ceramic board 120 falls. The oxygen ions 25 produced by the reduction of the oxide 41 (Cu—O) containing copper then pass through the zirconium oxide 28 at the grain boundaries and triple points of the aluminum oxide 21 and migrate to the high-potential metal layers 30 that are the positive electrode. The oxygen ions 25 that have migrated to the positive electrode react with the copper of the metal layers 30 to grow oxide 31 containing copper. As one example, the reaction $Cu+O^{2-} \rightarrow CuO+2e$ (electrons) occurs. This means that at the positive electrode, the oxide 31 containing copper excessively increases, and the bonding strength between the metal layers 30 and the ceramic board 120 falls.

In the ceramic board 120 of the ceramic laminated substrate 100 of Comparative Example 2 for the second embodiment, as described earlier, the migration of oxygen ions is promoted by the zirconium oxide. This means that reduction proceeds on the negative electrode side and oxidation proceeds on the positive electrode side. Accordingly, the bonding strength of the metal layers 30 and 40 to the ceramic board 120 falls even further than in Comparative Example 1 for the first embodiment.

(Ceramic Laminated Substrate of Specific Example 2-1)

Figure 16:
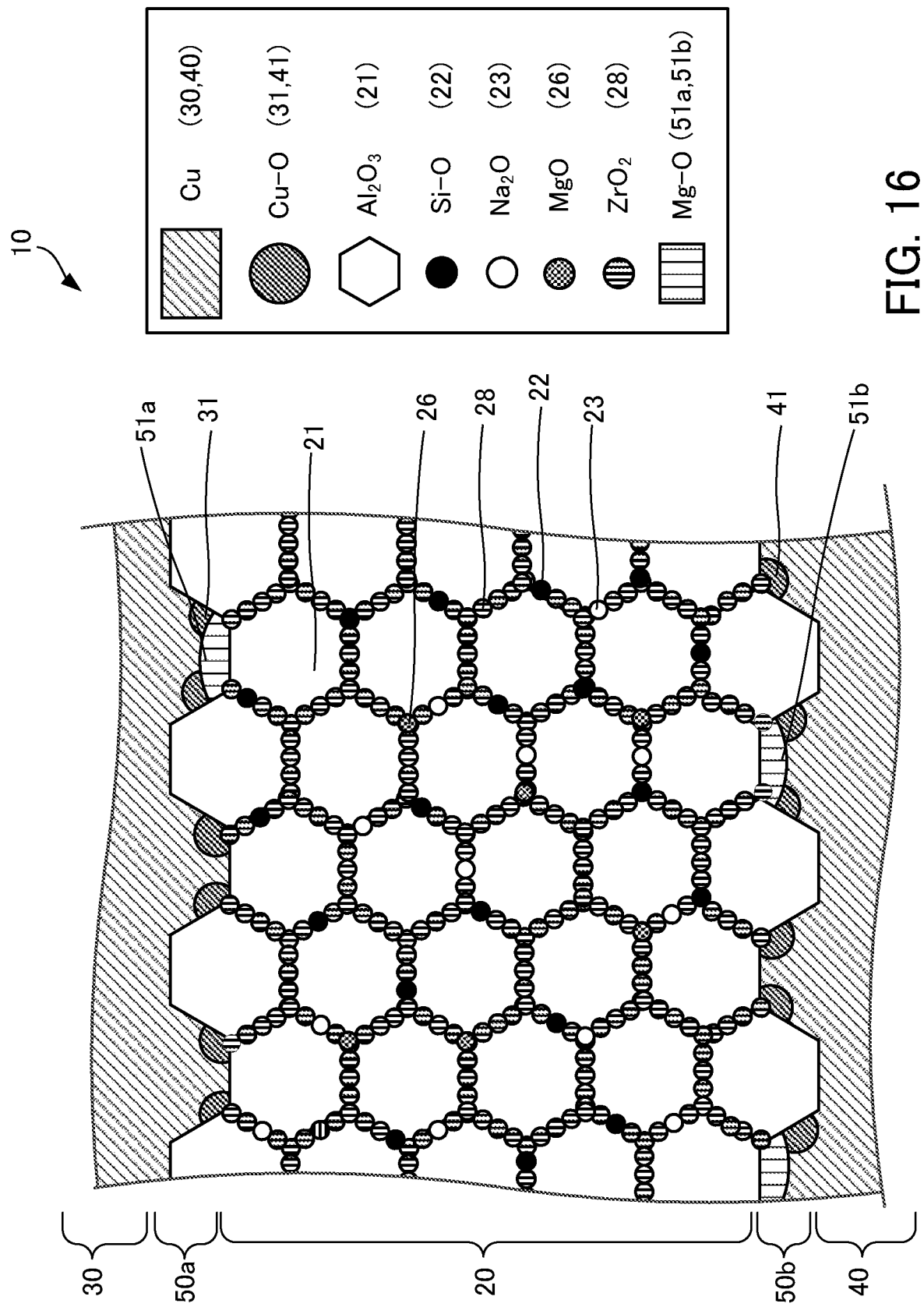
FIG. 16 is a schematic cross-sectional view of a ceramic laminated substrate according to the second embodiment (Specific Example 2-1)
Figure 17:
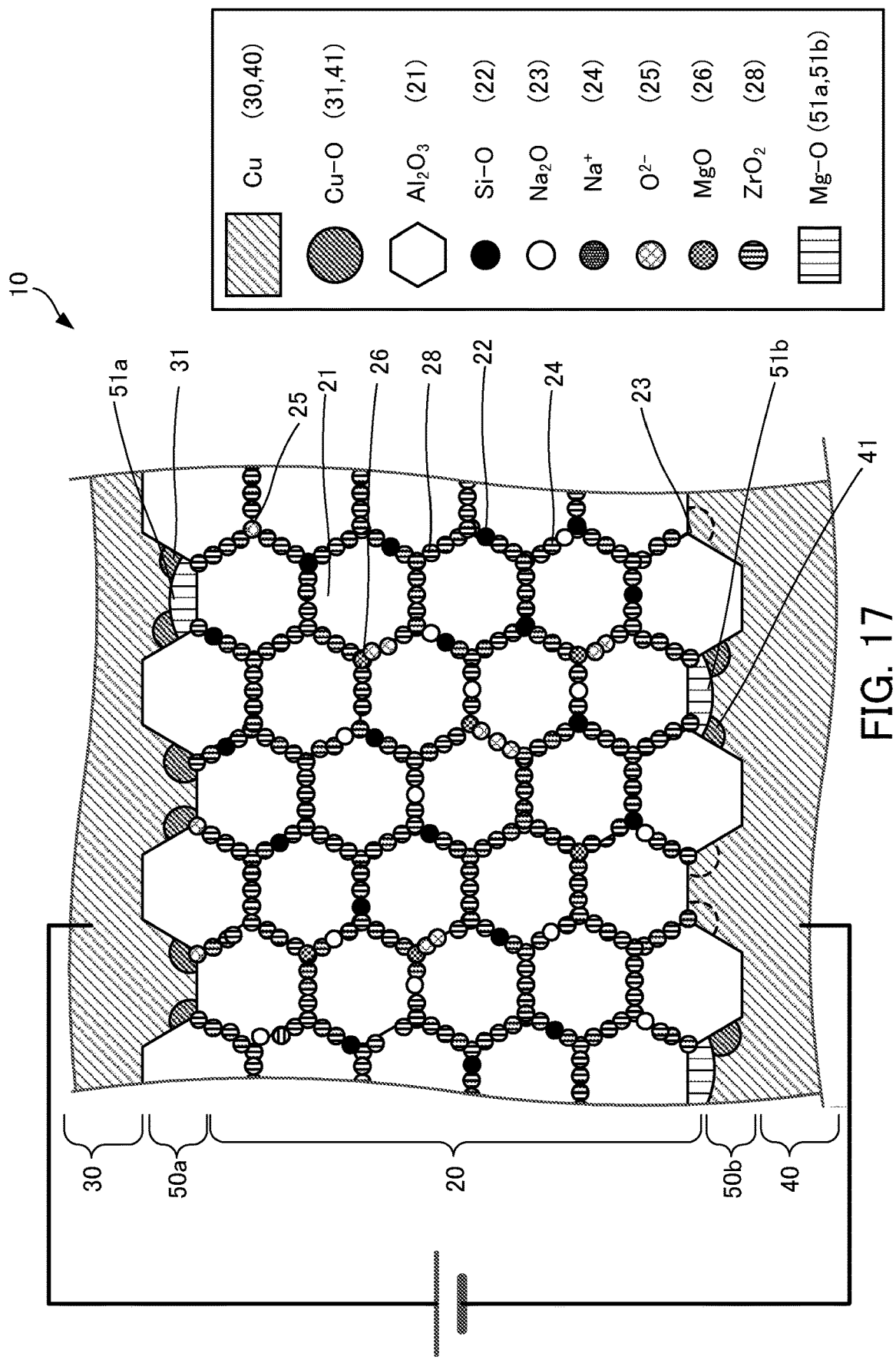
FIG. 17 is a schematic cross-sectional view of a ceramic laminated substrate according to the second embodiment (Specific Example 2-1) under a high voltage in a high temperature environment.

Next, a ceramic laminated substrate 10 including the intermediate layers 50a and 50b will be described with reference to FIGS. 16 and 17. Note that Specific Example 2-1 corresponds to Specific Example 1-1. FIG. 16 is a schematic cross-sectional view of a ceramic laminated substrate according to the second embodiment (Specific Example 2-1), and FIG. 17 is a schematic cross-sectional view of a ceramic laminated substrate according to the second embodiment (Specific Example 2-1) under a high voltage in a high temperature environment. Note that FIG. 16 schematically depicts the microscopic state in the range surrounded by the broken line in FIG. 2. FIG. 17 schematically depicts a microscopic state when a high voltage is applied between the metal layers 30 and 40 in a high temperature environment in FIG. 2.

As depicted in FIG. 16, the ceramic laminated substrate 10 of Specific Example 2-1 is constructed by laminating the metal layer 40, the intermediate layer 50b, the ceramic board 20, the intermediate layer 50a, and the metal layers 30 in that order from the bottom.

The ceramic board 20 is manufactured by applying magnesium oxide powder in step S1a (of the second embodiment) of FIG. 4. The metal layers 30 and 40 are manufactured by dry oxidation in step S1b of FIG. 4.

The ceramic board 20 includes, as second oxide, the oxide 22 containing silicon and the zirconium oxide 28 between particles of aluminum oxide 21 (that is, at the grain boundaries and triple points). Sodium oxide 23 and/or magnesium oxide may additionally be included. Note that oxide containing zirconium, as one example, partially stabilized zirconia, may be used in place of the zirconium oxide 28.

In the same way as in the first embodiment, the metal layers 30 and 40 are constructed with copper as a main component. The intermediate layers 50a and 50b respectively include oxides 51a and 51b containing magnesium as the first oxide. The oxides 51a and 51b containing magnesium are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40 and the ceramic board 20 and also at the boundaries between the oxides 51a and 51b containing magnesium and the metal layers 30 and 40 and the ceramic board 20.

On the ceramic laminated substrate 10 (before the reliability test), when the amounts of the oxides 51a and 51b containing magnesium are too large, the bonding strength between the ceramic board 20 and the metal layers 30 and 40 will fall. For this reason, it is preferable for the intermediate layers 50a and 50b including oxides 51a and 51b containing magnesium to be formed so as to cover 10% or more and 80% or less of the bonding surfaces between the ceramic board 20 and the metal layers 30 and 40, and more preferably 20% or more and 50% or less.

A peeling strength evaluation test was also performed on this ceramic laminated substrate 10. The evaluation results for Specific Example 2-1 are "Good" for the front surface and "Good" for the rear surface of the ceramic laminated substrate 10. That is, compared with the comparative example, the bonding strength of the metal layers 30 and 40 to the ceramic board 20 of the ceramic laminated substrate 10 was somewhat improved, and a fall in bonding characteristics was suppressed. The reason for this has not yet been fully established at present. Without wishing to be bound by theory, this is believed to be due to the reasons given below.

As depicted in FIG. 17, on the ceramic laminated substrate 10 of Specific Example 2-1, a voltage with a high potential (positive electrode) and low potential (negative electrode) is applied to the metal layers 30 and 40 in a high temperature environment. At locations where the intermediate layer 50b including the oxide 51b containing magnesium is not present, the oxide 41 containing copper (Cu—O) is reduced at the boundaries between the metal layer 40 on the negative electrode side and the zirconium oxide 28 of the ceramic board 20. However, unlike Comparative Example 2, the ceramic laminated substrate 10 has an intermediate layer 50b including the oxide 51b containing magnesium on the negative electrode side. This means that in a part where the intermediate layer 50b is formed on the negative electrode side, the zirconium oxide 28 and the oxide 41 (Cu—O) containing copper are not in direct contact, so that reduction of the oxide 41 containing copper is suppressed. That is, the intermediate layer 50b blocks the reduction of the oxide 41 containing copper. Accordingly, the oxide 41 containing copper remains present without becoming copper at locations where the intermediate layer 50b is formed. In addition, since reduction at the negative electrode is suppressed, fewer oxygen ions are produced and excessive oxidation of copper at the boundary between the metal layers 30 and the ceramic board 20 is suppressed on the positive electrode side as well. Accordingly, since the intermediate layer 50b containing the oxide 51b containing magnesium is formed on the negative electrode side, the bonding strength of the metal layers 30 and 40 to the ceramic board 20 is somewhat improved compared to Comparative Example 2, which suppresses a fall in the bonding characteristics.

Magnesium oxide 26 may also be present at grain boundaries and triple points. By doing so, the migration routes of oxygen ions at the grain boundaries are partially blocked. This also suppresses oxidation and reduction reactions at the positive electrode and the negative electrode. The ceramic laminated substrate 10 may also have the intermediate layer 50a including the oxide 51a containing magnesium formed on the positive electrode side. By doing so, the zirconium oxide 28 and the oxide 31 (Cu—O) containing copper will not be in direct contact at parts where the intermediate layer 50b is formed on the positive electrode side, which suppresses oxidation of the metal layers 30. That is, the intermediate layer 50a blocks oxidation of the metal layers 30. By doing so, the bonding strength of the metal layers 30 and 40 to the ceramic board 20 is further improved and the fall in the bonding characteristics is suppressed.

As described above, in the ceramic laminated substrate 10 of Specific Example 2-1, in the same way as Specific Example 1-1, a fall in the bonding strength between the ceramic board 20 and the metal layer 40 is suppressed, and the bonding strength of the metal layer 40 to the ceramic board 20 is improved. In Specific Example 2-1, in the same way as in Specific Example 1-1, when the ceramic laminated substrate 10 has at least the intermediate layer 50b between the rear surface (low potential side) of the ceramic board 20 and the metal layer 40, a fall in the bonding characteristics of the metal layer 40 is suppressed and deterioration in the ceramic laminated substrate 10 may be prevented.

(Ceramic Laminated Substrate of Specific Example 2-2)

Figure 18:
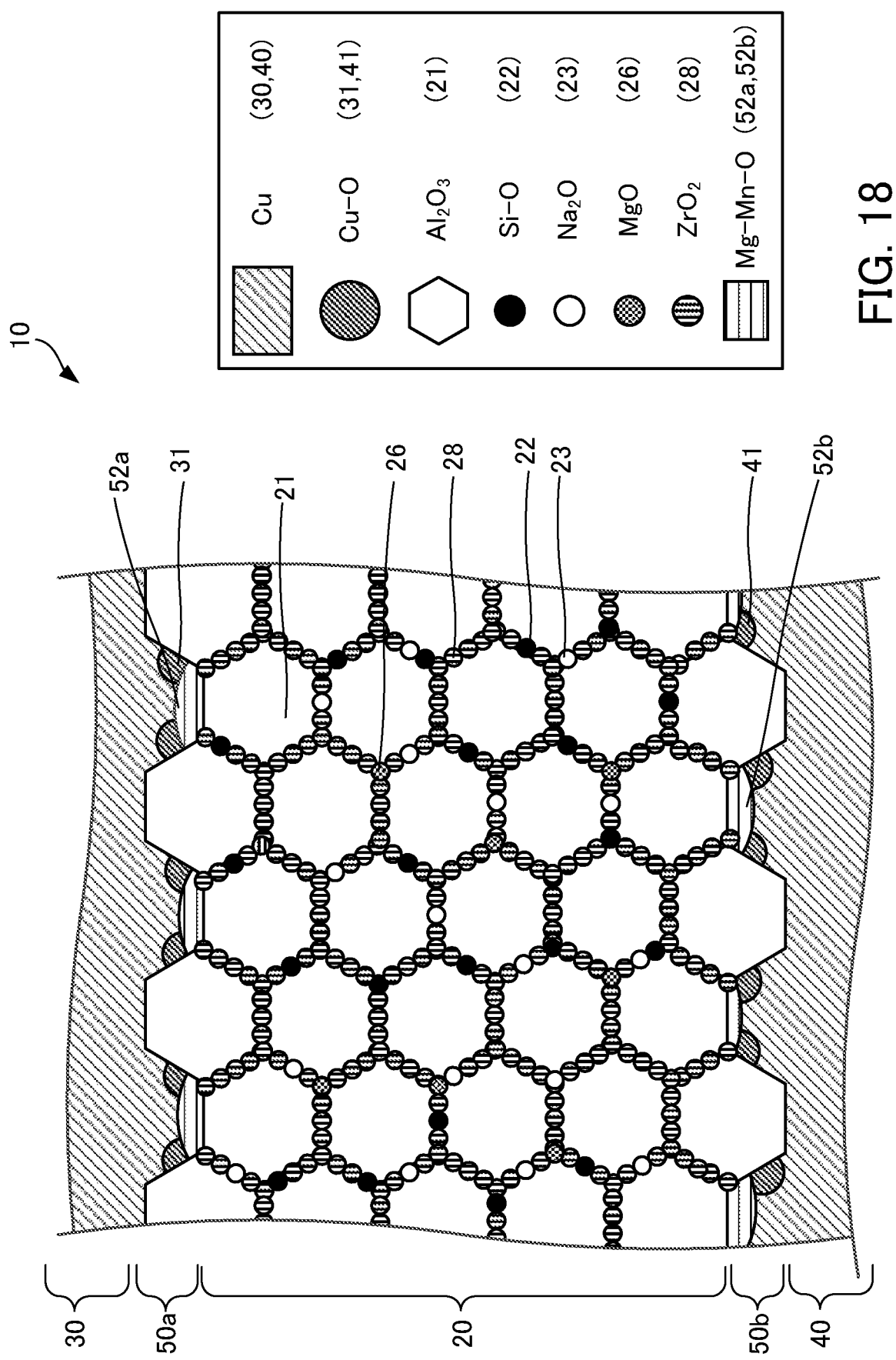
FIG. 18 is a schematic cross-sectional view of a ceramic laminated substrate according to the second embodiment (Specific Example 2-2)
Figure 19:
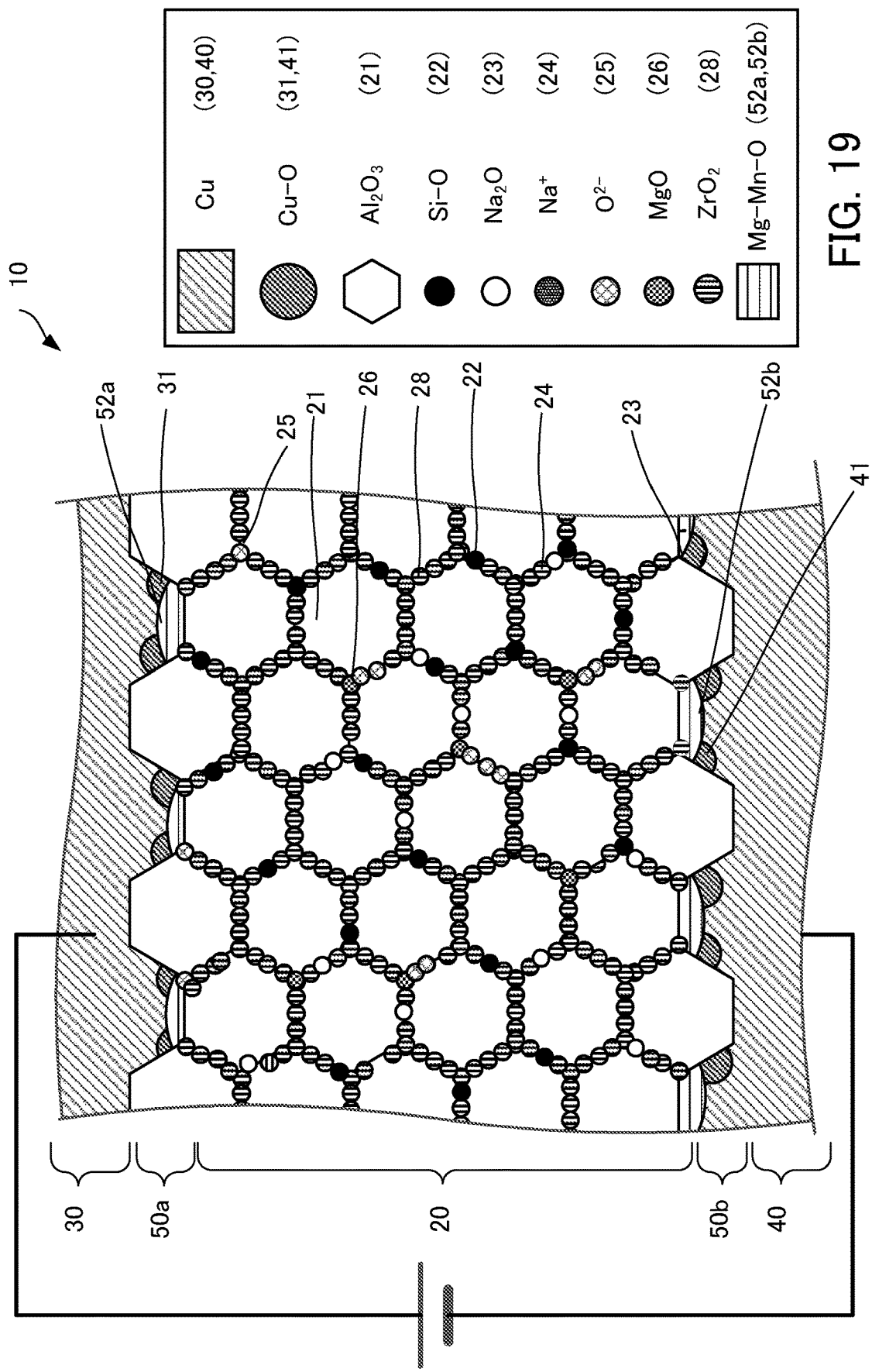
FIG. 19 is a schematic cross-sectional view of a ceramic laminated substrate according to the second embodiment (Specific Example 2-2) under a high voltage in a high temperature environment.

In Specific Example 2-2, a case where the ceramic board 20 of the ceramic laminated substrate 10 is manufactured by applying magnesium oxide powder in step S1a (of the second embodiment) in FIG. 4 and the metal layers 30 and 40 are manufactured by wet oxidization will be described with reference to FIGS. 18 and 19. FIG. 18 is a schematic cross-sectional view of a ceramic laminated substrate according to the second embodiment (Specific Example 2-2) and FIG. 19 is a schematic cross-sectional view of a ceramic laminated substrate according to the second embodiment (Specific Example 2-2) under a high voltage in a high temperature environment. Note that FIG. 18 schematically depicts the microscopic state at a location corresponding to the range surrounded by the broken line in FIG. 2. FIG. 19 schematically depicts a microscopic state when a high voltage is applied between the metal layers 30 and 40 in a high temperature environment in FIG. 2.

As depicted in FIG. 18, the ceramic laminated substrate 10 of Specific Example 2-2 is constructed by laminating the metal layer 40, the intermediate layer 50b, the ceramic board 20, the intermediate layer 50a, and the metal layers 30 in that order from the bottom.

The ceramic board 20 is manufactured in the same way as Specific Example 2-1 by applying magnesium oxide powder in step S1a (of the second embodiment) of FIG. 4. Unlike Specific Example 2-1, the metal layers 30 and 40 are manufactured by wet oxidation in step S1b of FIG. 4.

The ceramic board 20 includes, as second oxide, an oxide 22 containing silicon and zirconium oxide 28 between particles of aluminum oxide 21 (that is, at the grain boundaries and triple points). Sodium oxide 23 and/or magnesium oxide may additionally be included. Note that oxide containing zirconium, as one example, partially stabilized zirconia, may be included in place of the zirconium oxide 28.

The metal layers 30 and 40 are constructed with copper as a main component. In the same way as Specific Example 1-2, the intermediate layers 50a and 50b respectively include oxides 52a and 52b containing magnesium and manganese as the first oxide. The oxides 52a and 52b containing magnesium and manganese are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40, the ceramic board 20, and the oxides 52a and 52b containing magnesium and manganese.

In Specific Example 2-1, on the ceramic laminated substrate 10 (before the reliability test), the range covered by the intermediate layers 50a and 50b is limited, so it is not possible to increase the bonding strength between the ceramic board 20 and the metal layers 30 and 40. In Specific Example 2-2, intermediate layers 50a, 50b including the oxides 52a, 52b containing magnesium and manganese may be formed over a wide area. As a result, the bonding strength between the ceramic board 20 and the metal layers 30 and 40 may be increased compared to Specific Example 2-1. These intermediate layers 50a and 50b are preferably formed so as to cover 20% or more and 80% or less of the bonding surfaces between the ceramic board 20 and the metal layers 30 and 40.

A peeling strength evaluation test was also performed on this ceramic laminated substrate 10. The evaluation results for Specific Example 2-2 are "Excellent" for the front surface and "Excellent" for the rear surface of the ceramic laminated substrate 10. That is, the fall in the bonding strength of the metal layers 30 and 40 to the ceramic board 20 of the ceramic laminated substrate 10 was greatly suppressed compared to the comparative example. In addition, the fall in bonding strength between the metal layers 30 and 40 and the ceramic board 20 is suppressed compared to Specific Example 2-1. The reason for this has not yet been fully established at present. Without wishing to be bound by theory, this is believed to be due to the reasons given below.

As depicted in FIG. 19, on the ceramic laminated substrate 10 of Specific Example 2-2, a voltage with a high potential (positive electrode) and a low potential (negative electrode) is applied to the metal layers 30 and 40 in a high temperature environment. The ceramic laminated substrate 10 has the intermediate layer 50b including an oxide 52b containing magnesium and manganese disposed on the negative electrode side. This means that in parts where the intermediate layer 50b is formed on the negative electrode side, the zirconium oxide 28 and the oxide 41 (Cu—O) containing copper are not in direct contact, which suppresses reduction of the oxide 41 containing copper. That is, the intermediate layer 50b blocks reduction of the oxide 41 containing copper. Accordingly, the oxide 41 containing copper remains without becoming copper at locations where the intermediate layer 50b is formed. In addition, since reduction at the negative electrode is suppressed, fewer oxygen ions are produced and excessive oxidation of copper at the boundary between the metal layers 30 and the ceramic board 20 is suppressed on the positive electrode side also. Accordingly, since the intermediate layer 50b including the oxide 52b containing magnesium and manganese is formed on the negative electrode side, the bonding strength of the metal layers 30 and 40 to the ceramic board 20 is greatly improved compared to Comparative Example 2, and the fall in bonding characteristics is suppressed. In addition, since reduction is blocked more than in Specific Example 2-1 and Specific Example 2-3, described later, it is believed that the fall in bonding strength of the metal layers 30 and 40 to the ceramic board 20 will be further suppressed compared to Specific Examples 2-1 and 2-3.

Magnesium oxide 26 may also be present at grain boundaries and triple points. By doing so, the migration routes of oxygen ions at the grain boundaries are partially blocked. This also suppresses oxidation and reduction reactions at the positive electrode and the negative electrode. The ceramic laminated substrate 10 may also have an intermediate layer 50a including the oxide 52a containing magnesium and manganese on the positive electrode side. By doing so, the zirconium oxide 28 and the oxide 31 (Cu—O) containing copper are not in direct contact at parts where the intermediate layer 50a is formed on the positive electrode side, which suppresses oxidation of the metal layers 30. That is, the intermediate layer 50a blocks oxidation of the metal layers 30. By doing so, the bonding strength of the metal layers 30 and 40 to the ceramic board 20 is further improved and a fall in the bonding characteristics is suppressed.

As described above, in the ceramic laminated substrate 10 of Specific Example 2-2, a fall in the bonding strength between the ceramic board 20 and the metal layer 40 is further suppressed compared to Specific Example 2-1 and Specific Example 2-3, described later, and the bonding strength of the metal layer 40 to the ceramic board 20 is improved.

(Ceramic Laminated Substrate of Specific Example 2-3)

Figure 20:
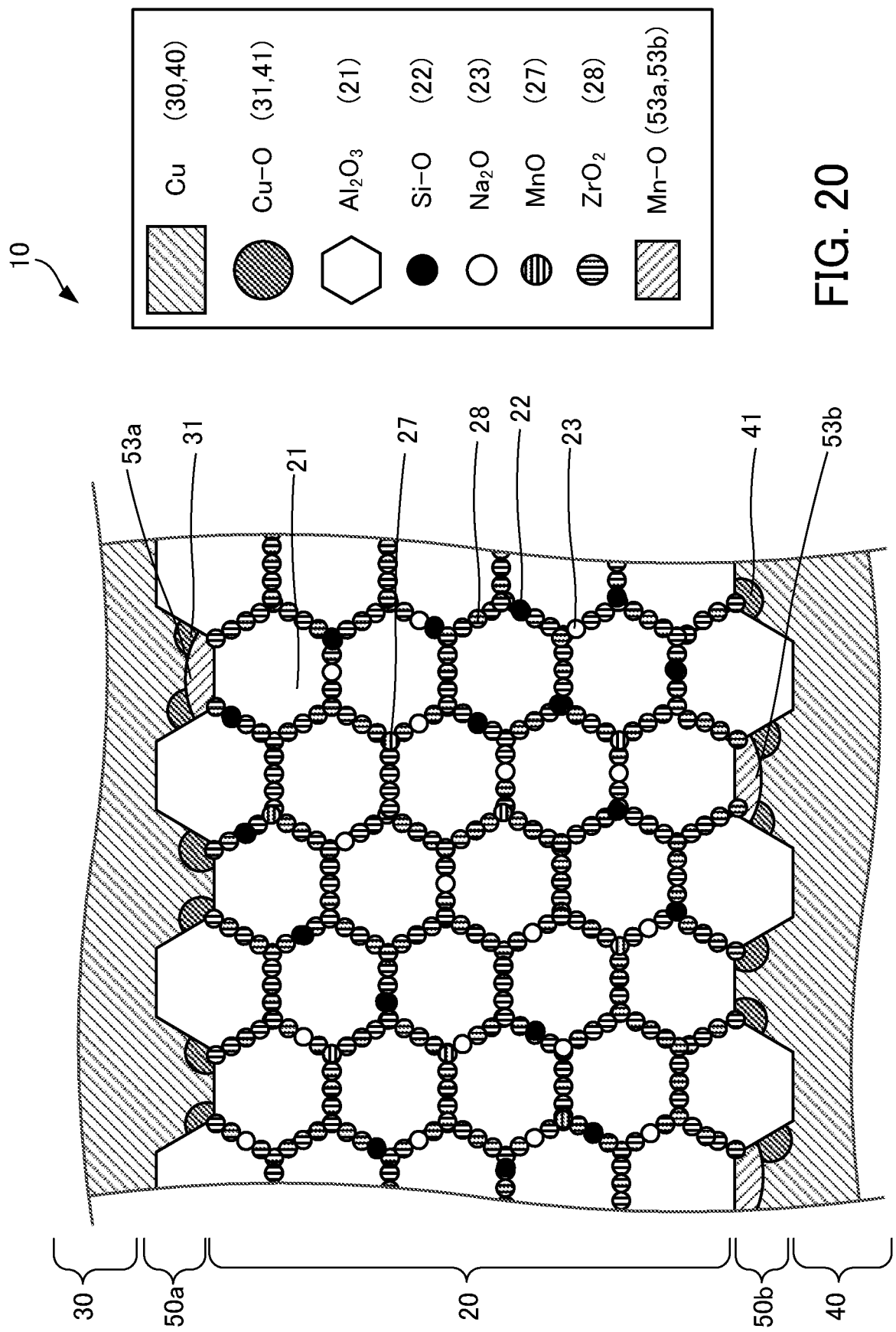
FIG. 20 is a schematic cross-sectional view of a ceramic laminated substrate according to the second embodiment (Specific Example 2-3)
Figure 21:
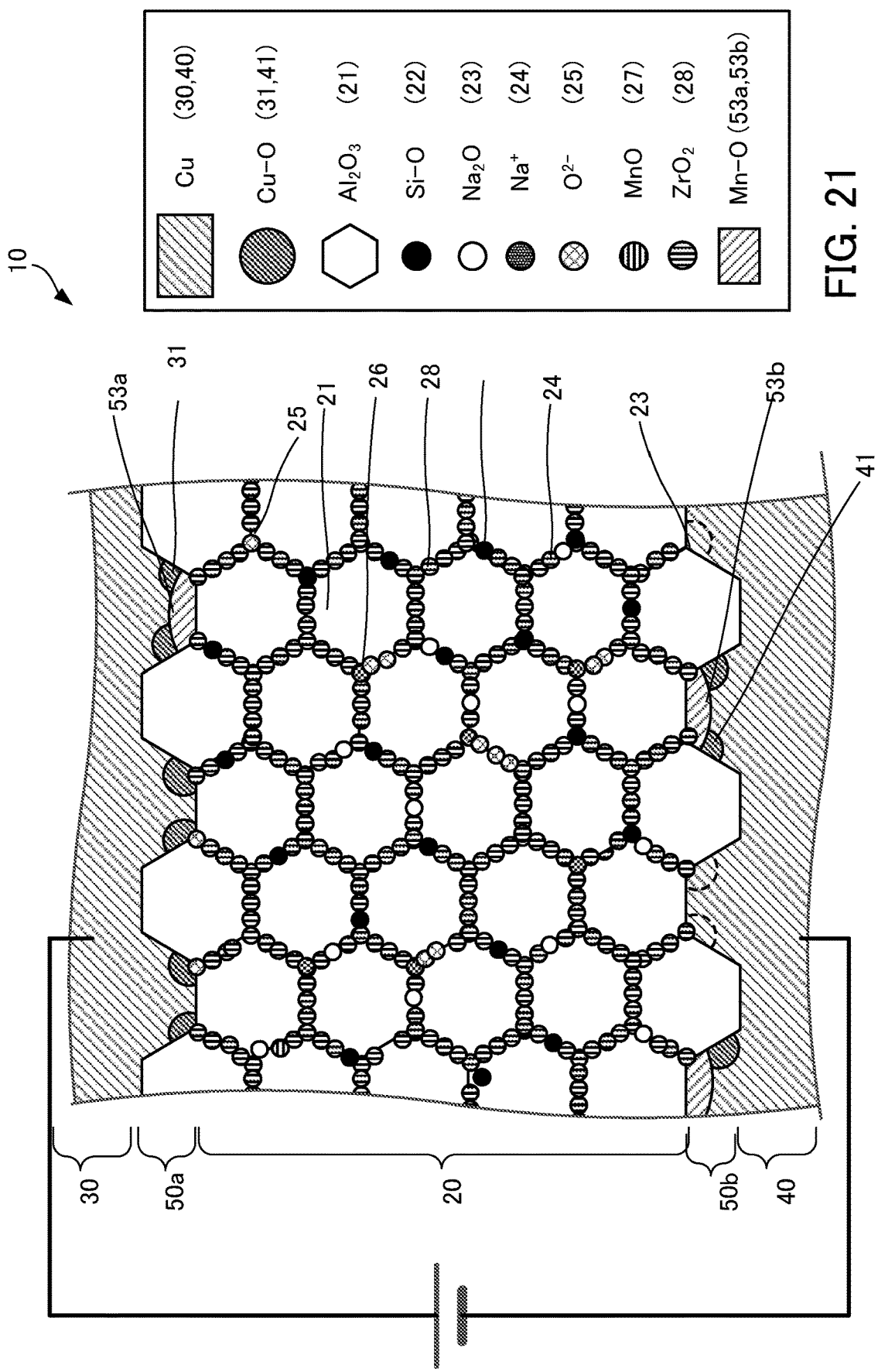
FIG. 21 is a schematic cross-sectional view of the ceramic laminated substrate according to the second embodiment (Specific Example 2-3) under a high voltage in a high temperature environment.

In Specific Example 2-3, a case where the ceramic board 20 of the ceramic laminated substrate 10 is manufactured without applying magnesium oxide powder in step S1a (of the second embodiment) in FIG. 4 and the metal layers 30 and 40 are manufactured by wet oxidization will be described with reference to FIGS. 20 and 21. FIG. 20 is a schematic cross-sectional view of a ceramic laminated substrate according to the second embodiment (Specific Example 2-3), and FIG. 21 is a schematic cross-sectional view of the ceramic laminated substrate according to the second embodiment (Specific Example 2-3) under a high voltage in a high temperature environment. Note that FIG. 20 schematically depicts a microscopic state in the range surrounded by the broken line in FIG. 2. FIG. 21 schematically depicts a microscopic state when a high voltage is applied between the metal layers 30 and 40 in FIG. 2 in a high temperature environment.

As depicted in FIG. 20, the ceramic laminated substrate 10 in Specific Example 2-3 is constructed by laminating the metal layer 40, the intermediate layer 50b, the ceramic board 20, the intermediate layer 50a, and the metal layers 30 in that order from the bottom.

Unlike Specific Examples 2-1 and 2-2, the ceramic board 20 is manufactured without applying magnesium oxide powder in step S1a (of the second embodiment) of FIG. 4. In the same way as in Specific Example 2-2, the metal layers 30 and 40 are manufactured by wet oxidation in step S1b of FIG. 4.

The ceramic board 20 includes, as second oxide, the oxide 22 containing silicon and zirconium oxide 28 between particles of the aluminum oxide 21 (that is, at the grain boundaries and triple points). The ceramic board 20 may additionally include sodium oxide 23. Note that in place of zirconium oxide 28, the ceramic board 20 may include oxide containing zirconium, as one example, partially stabilized zirconia.

The metal layers 30 and 40 are constructed with copper as a main component. The intermediate layers 50a and 50b respectively include oxides 53a and 53b containing manganese as the first oxide. The oxides 53a and 53b containing manganese are respectively formed in large amounts in the intermediate layers 50a and 50b on the front surface side and the rear surface side of the ceramic board 20. In addition, the oxides 31 and 41 containing copper are respectively formed at the boundaries between the metal layers 30 and 40, the ceramic board 20, and the oxides 53a and 53b containing manganese.

On the ceramic laminated substrate 10 (before the reliability test), when the amounts of the oxides 53a and 53b containing manganese are too large, the bonding strength between the ceramic board 20 and the metal layers 30 and 40 will fall. For this reason, it is preferable for the intermediate layers 50a and 50b including oxides 53a and 53b containing manganese to be formed so as to cover 10% or more and 80% or less of the bonding surfaces between the ceramic board 20 and the metal layers 30 and 40, and more preferably 20% or more and 50% or less.

A peeling strength evaluation test was also performed on the ceramic laminated substrate 10. The evaluation results for Specific Example 2-1 are "Excellent" for the front surface and "Very Good" for the rear surface of the ceramic laminated substrate 10. That is, the fall in bonding strength of the metal layers 30 and 40 to the ceramic board 20 of the ceramic laminated substrate 10 was suppressed compared to Comparative Example 2. In addition, the fall in bonding strength of the metal layers 30 and 40 to the ceramic board 20 was suppressed compared to Specific Example 2-1. The reason for this has not yet been fully established at present. Without wishing to be bound by theory, this is believed to be due to the reasons given below.

As depicted in FIG. 21, in the ceramic laminated substrate 10 of Specific Example 2-3, a voltage with a high potential (positive electrode) and a low potential (negative electrode) is applied to the metal layers 30 and 40 in a high temperature environment. The ceramic laminated substrate 10 has the intermediate layer 50b including the oxide 53b containing manganese disposed on the negative electrode side. This means that in parts where the intermediate layer 50b is formed on the negative electrode side, the zirconium oxide 28 and the oxide 41 (Cu—O) containing copper are not in direct contact, which suppresses reduction of the oxide 41 containing copper. That is, the intermediate layer 50b blocks reduction of the oxide 41 containing copper. Accordingly, the oxide 41 containing copper remains without becoming copper at locations where the intermediate layer 50b is formed. In addition, since reduction at the negative electrode is suppressed, fewer oxygen ions are produced and excessive oxidation of copper at the boundary between the metal layers 30 and the ceramic board 20 is suppressed on the positive electrode side also. Accordingly, since the intermediate layer 50b including the oxide 53b containing manganese is formed on the negative electrode side, the bonding strength of the metal layers 30 and 40 to the ceramic board 20 is greatly improved compared to Comparative Example 2, and the fall in bonding characteristics is suppressed. In addition, since reduction is blocked more than in Specific Example 2-1, it is believed that the fall in bonding strength of the metal layers 30 and 40 to the ceramic board 20 will be further suppressed compared to Specific Example 2-1.

The ceramic laminated substrate 10 may also have an intermediate layer 50a including the oxide 53a containing manganese on the positive electrode side. By doing so, the zirconium oxide 28 and the oxide 31 (Cu—O) containing copper are not in direct contact at parts where the intermediate layer 50a is formed on the positive electrode side, which suppresses oxidation of the metal layers 30. That is, the intermediate layer 50a blocks oxidation of the metal layers 30. By doing so, the bonding strength of the metal layers 30 and 40 to the ceramic board 20 is further improved and a fall in the bonding characteristics is suppressed.

As described above, in the ceramic laminated substrate 10 of Specific Example 2-3, a fall in the bonding strength between the ceramic board 20 and the metal layer 40 is further suppressed compared to Specific Example 2-1, and the bonding strength of the metal layer 40 to the ceramic board 20 is improved.

Third Embodiment

As described above in the first and second embodiments, in a case where one of the metal layers 30 and the metal layer 40 is placed at high potential and the other is placed at low potential in the ceramic laminated substrate 10, an intermediate layer is formed at least between the ceramic board 20 and the metal layer that is placed at low potential. By doing so, detachment of the metal layer (on which the intermediate layer has been formed) from the ceramic board 20 is suppressed.

In this third embodiment, regions of the semiconductor device 1 depicted in FIGS. 1 to 3 where an intermediate layer is to be formed will be described based on the potential difference generated between the metal layers 30 and 40 of the ceramic laminated substrate 10 when the semiconductor device 1 is both operated and stopped.

First, the situation when the semiconductor device 1 is stopped will be described. When the semiconductor device 1 is stopped, the control signals inputted into the control electrodes 61a and 61b of the semiconductor chips 60a and 60b are both off. Accordingly, on the ceramic laminated substrate 10, the metal layers 30a and 30b are placed at a high potential and the metal layer 30d is placed at a low potential. The upper arm portion A and the lower arm portion B at this time are both in a so-called "stopped state". Also, when the semiconductor device 1 is stopped, this corresponds to FIGS. 22A, 23A, and 24A, described later.

The semiconductor device 1 in the driven state will now be described. When the semiconductor device 1 is driven, the control signal inputted into the control electrode 61a of the semiconductor chip 60a is on, and the control signal inputted into the control electrode 61b of the semiconductor chip 60b is off. Accordingly, on the ceramic laminated substrate 10, the metal layers 30a, 30b, and 30c are placed at a high potential and the metal layer 30d is placed at a low potential. The upper arm portion A at this time is in the so-called "driven state", and the lower arm portion B is in the so-called "stopped state". When the semiconductor device 1 is driven in this way, this corresponds to FIGS. 22B, 23B, and 24B, described later.

When the semiconductor device 1 is driven in another way, the control signal inputted into the control electrode 61a of the semiconductor chip 60a is off, and the control signal inputted into the control electrode 61b of the semiconductor chip 60b is on. Accordingly, on the ceramic laminated substrate 10, the metal layers 30a and 30b are placed at a high potential and the metal layers 30c and 30d placed at a low potential. The upper arm portion A at this time is in the so-called "stopped state", and the lower arm portion B is in the so-called "driven state". When the semiconductor device 1 is driven in this way, this corresponds to FIGS. 22C, 23C, and 24C, described later.

Next, regions where intermediate layers are formed corresponding to the respective potentials of the metal layers 30 and 40 of the ceramic laminated substrate 10 will be described with reference to FIGS. 22A to 22D, 23A to 23D, 24A to 24D, and 25. FIGS. 22A to 22D are diagrams useful in describing regions where an intermediate layer is formed in a ceramic laminated substrate (where the rear surface metal layer is at a low potential) according to the third embodiment. FIGS. 23A to 23D are diagrams useful in describing regions where an intermediate layer is formed in the ceramic laminated substrate (where the rear surface metal layer is at a high potential) according to the third embodiment. FIGS. 24A to 24D are diagrams useful in describing regions where an intermediate layer is formed in the ceramic laminated substrate (where a rear surface metal layer is at a floating potential) according to the third embodiment. FIG. 25 is a diagram useful in describing regions where an intermediate layer is formed in the ceramic laminated substrate of the third embodiment.

Figure 22A:
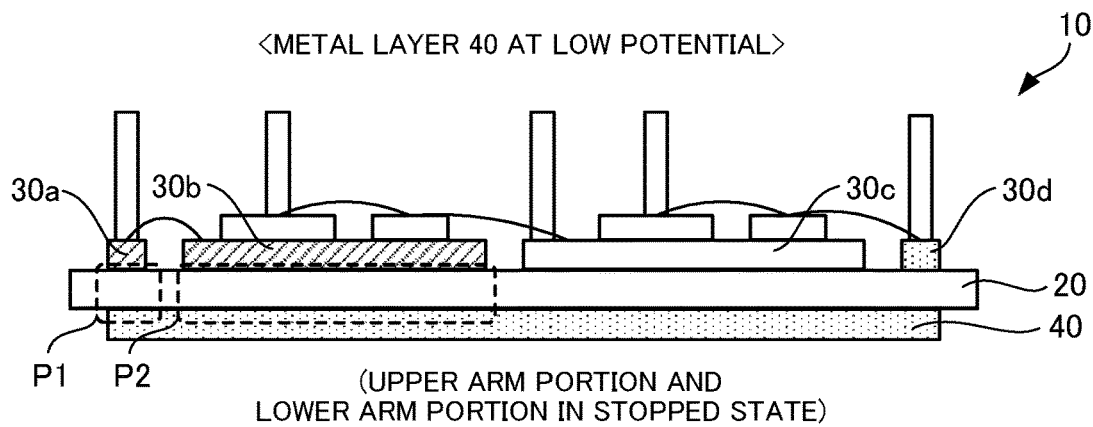
FIGS. 22A to 22D are diagrams useful in describing regions where an intermediate layer is formed in a ceramic laminated substrate (where a rear surface metal layer is at a low potential) according to a third embodiment.
Figure 22B:
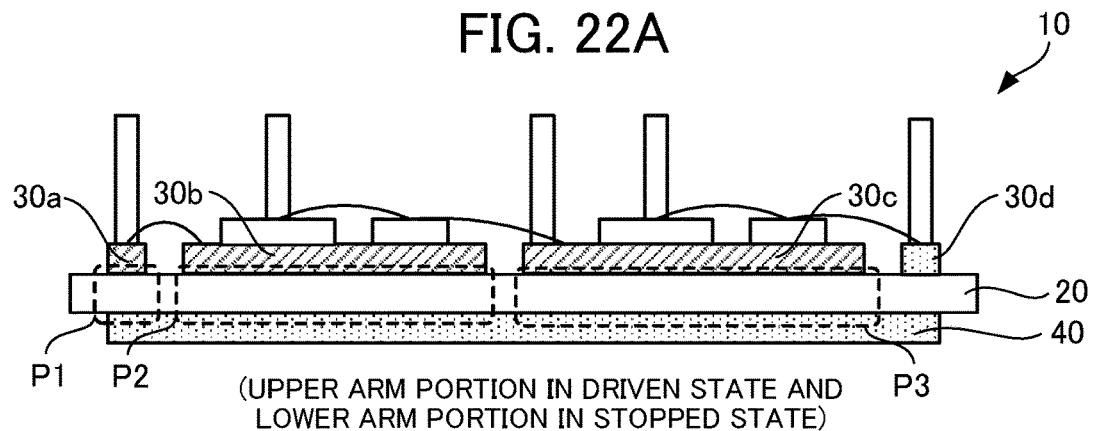
Figure 22C:
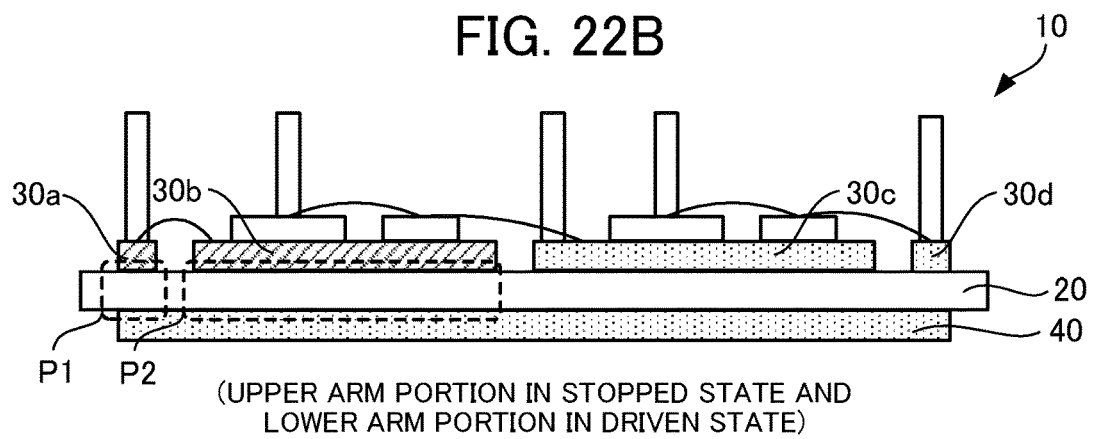
Figure 22D:
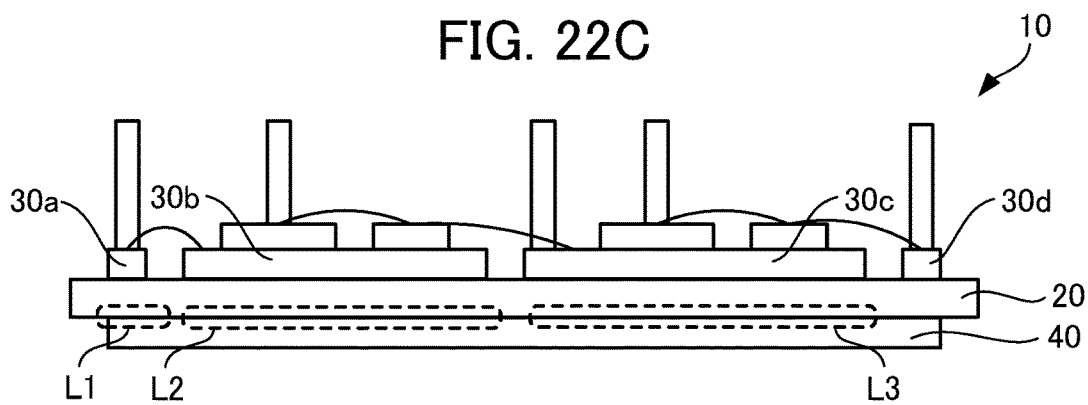
Figure 23A:
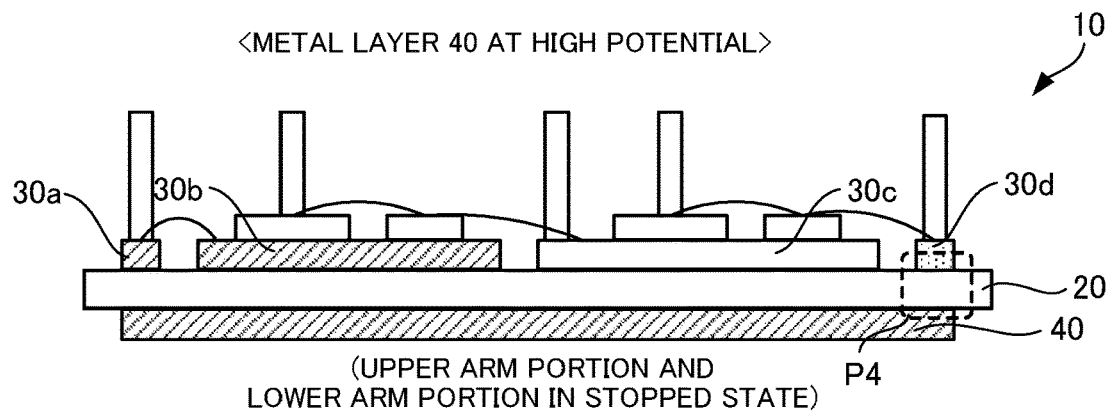
FIGS. 23A to 23D are diagrams useful in describing regions where an intermediate layer is formed in the ceramic laminated substrate (where the rear surface metal layer is at a high potential) according to the third embodiment.
Figure 23B:
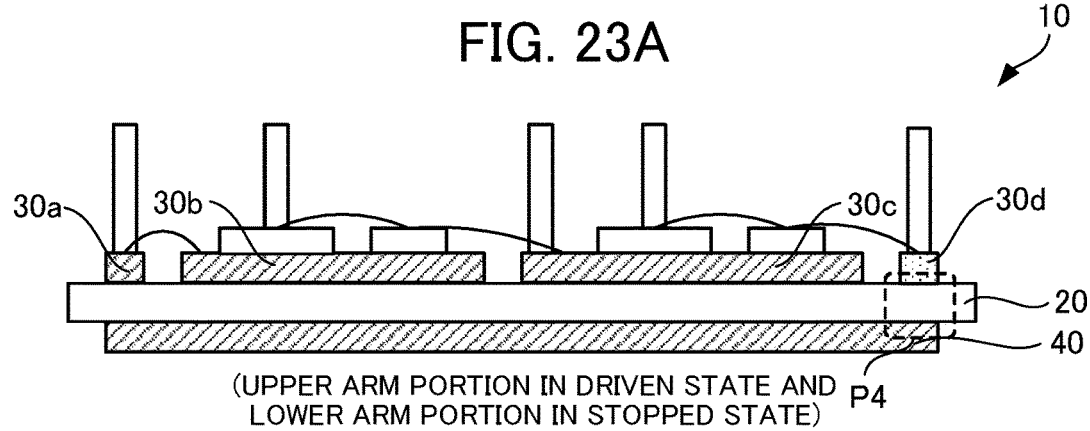
Figure 23C:
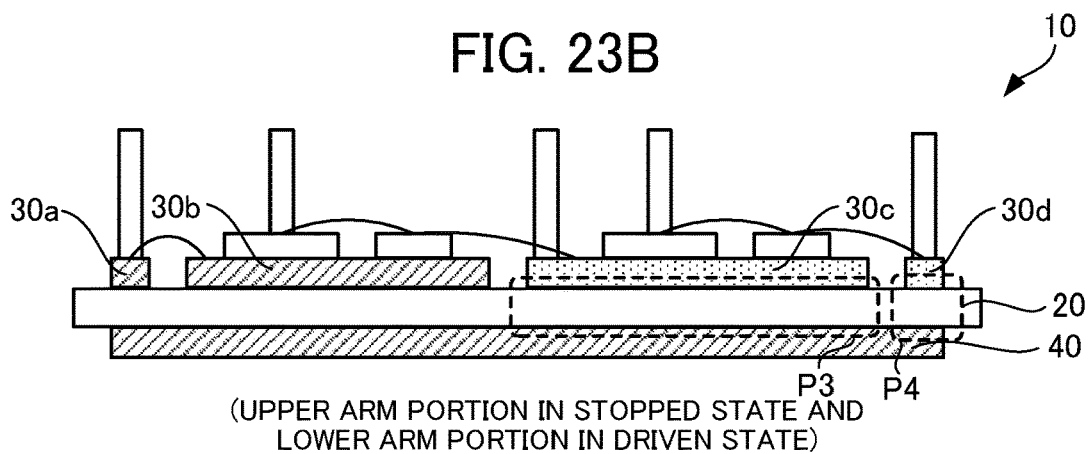
Figure 23D:
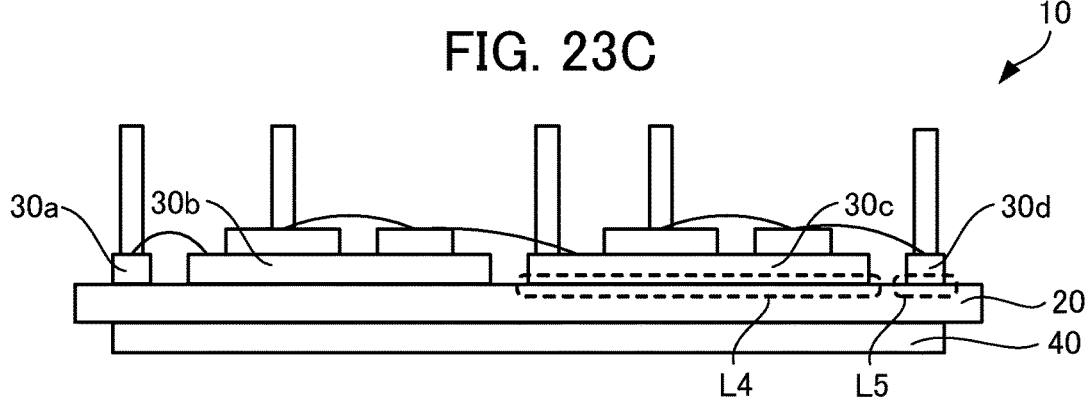
Figure 24A:
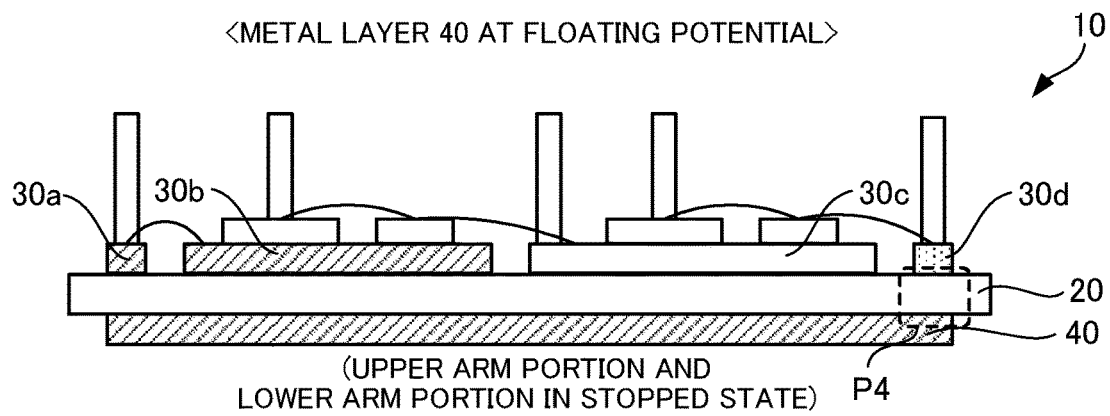
FIGS. 24A to 24D are diagrams useful in describing regions where an intermediate layer is formed in the ceramic laminated substrate (where a rear surface metal layer is at a floating potential) according to the third embodiment.
Figure 24B:
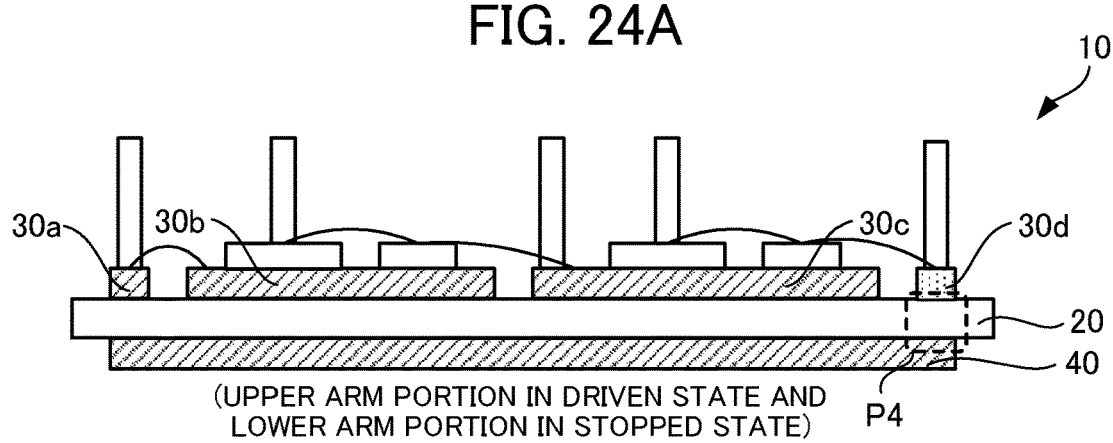
Figure 24C:
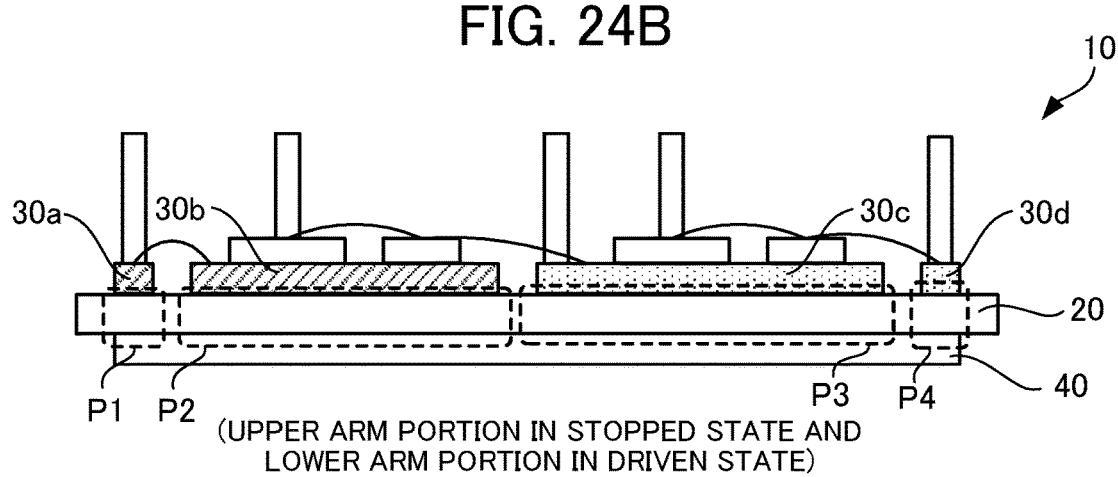
Figure 24D:
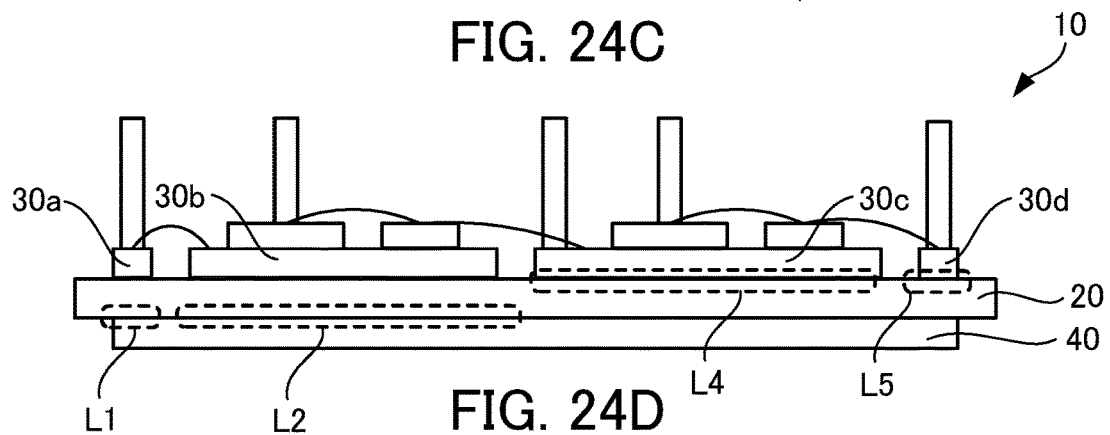
Figure 25:
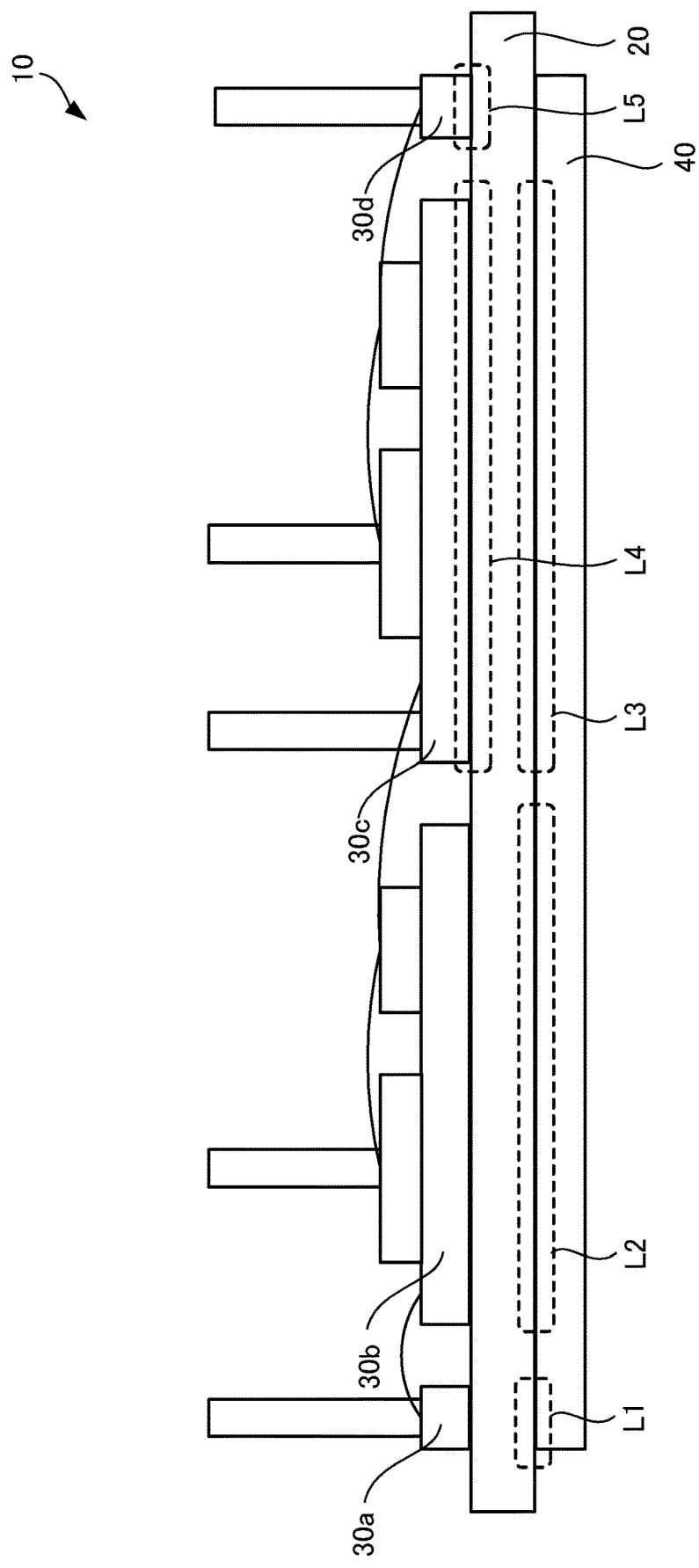
FIG. 25 is a diagram useful in describing regions where an intermediate layer is formed in the ceramic laminated substrate of the third embodiment.

Note that FIGS. 22A to 22D, 23A to 23D, and 24A to 24D depict simplifications of the ceramic laminated substrate 10, the semiconductor chips 60a and 60b, and the external connection terminals 71 to 75 in FIG. 2. In these drawings, only components to be described have been assigned reference numerals. FIGS. 22A, 23A, and 24A correspond to a case where the upper arm portion A and the lower arm portion B are in the stopped state. FIGS. 22B, 23B and 24B correspond to a case where the upper arm portion A is in the driven state and the lower arm portion B is in the stopped state. FIGS. 22C, 23C, and 24C correspond to a case where the upper arm portion A is in the stopped state and the lower arm portion B is in the driven state. FIGS. 22D, 23D, and 24D respectively depict regions where an intermediate layer is formed.

A case where the metal layer 40, which is the metal layer on the rear surface of the ceramic laminated substrate 10, is at a low potential will be described with reference to FIGS. 22A to 22D. At this time, when the upper arm portion A and the lower arm portion B are in the stopped state, as depicted in FIG. 22A, the metal layers 30a and 30b are placed at a high potential and the metal layer 30d is placed at a low potential. Note that the metal layer 30c has a floating potential. A potential difference is generated in the ceramic board 20 between the high-potential metal layers 30a and 30b and the low-potential metal layer 40 (that is, in regions P1 and P2 indicated by the broken lines). This means that it is conceivable for detachment of the metal layer 40 to occur between the ceramic board 20 in the region P1 and the region of the metal layer 40 facing the metal layer 30a. It is also conceivable for detachment of the metal layer 40 to occur between the ceramic board 20 in the P2 region and the region of the metal layer 40 facing the metal layer 30b.

Next, when the upper arm portion A is in the driven state and the lower arm portion B is in the stopped state, as depicted in FIG. 22B, the metal layers 30a, 30b, and 30c are placed at a high potential and the metal layer 30d is placed at a low potential. A potential difference is produced in the ceramic board 20 between the high-potential metal layers 30a, 30b, and 30c and the low-potential metal layer 40 (that is, in regions P1 to P3 indicated by broken lines). This means that it is conceivable for detachment of the metal layer 40 to occur between the ceramic board 20 in the region P1 and the region of the metal layer 40 facing the metal layer 30a. It is also conceivable for detachment of the metal layer 40 to occur between the ceramic board 20 in the region P2 and the region of the metal layer 40 facing the metal layer 30b. It is also conceivable for detachment of the metal layer 40 to occur between the ceramic board 20 in the region P3 and the region of the metal layer 40 facing the metal layer 30c.

Next, when the upper arm portion A is in a stopped state and the lower arm portion B is in a driven state, as depicted in FIG. 22C, the metal layers 30a and 30b are placed at a high potential and the metal layers 30c and 30d are placed at a low potential. A potential difference is produced in the ceramic board 20 between the high-potential metal layers 30a and 30b and the low-potential metal layer 40 (that is, in the regions P1 and P2 indicated by broken lines). This means it is conceivable for detachment of the metal layer 40 to occur between the ceramic board 20 in the region P1 and the region of the metal layer 40 facing the metal layer 30a. It is also conceivable for detachment of the metal layer 40 to occur between the ceramic board 20 in the region P2 and the region of the metal layer 40 facing the metal layer 30b.

In FIGS. 22A to 22C described above, intermediate layers are formed in the L1 to L3 regions depicted in FIG. 22D based on the potential differences produced during the stopped state and the driven states of the semiconductor device 1. The L1 region is the boundary between the ceramic board 20 and the region of the metal layer 40 facing the metal layer 30a. The L2 region is the boundary between the ceramic board 20 and the region of the metal layer 40 facing the metal layer 30b. The L3 region is the boundary between the ceramic board 20 and the region of the metal layer 40 facing the metal layer 30c. In particular, as depicted in FIGS. 22A to 22C, it is believed that potential differences will frequently occur between the ceramic board 20 and the regions of the metal layer 40 facing the metal layers 30a and 30b. For this reason, intermediate layers are formed in at least the L1 and L2 regions.

A case where the metal layer 40, which is the rear surface metal layer, in the ceramic laminated substrate 10 is placed at a high potential will now be described with reference to FIGS. 23A to 23D. At this time, when the upper arm portion A and the lower arm portion B are in the stopped state, as depicted in FIG. 23A, the metal layers 30a and 30b are placed at a high potential and the metal layer 30d is placed at a low potential. Note that the metal layer 30c becomes a floating potential. A potential difference is produced in the ceramic board 20 between the low-potential metal layer 30d and the high-potential metal layer 40 (that is, in a region P4 indicated by the broken line). This means that it is conceivable for detachment of the metal layer 30d to occur between the ceramic board 20 and the metal layer 30d in the P4 region.

Next, when the upper arm portion A is in the driven state and the lower arm portion B is in the stopped state, as depicted in FIG. 23B, the metal layers 30a, 30b, and 30c are placed at a high potential and the metal layer 30d is placed at a low potential. A potential difference is produced in the ceramic board 20 between the low-potential metal layer 30d and the high-potential metal layer 40 (that is, in a region P4 indicated by the broken line). This means that it is conceivable for detachment of the metal layer 30d to occur between the ceramic board 20 and the metal layer 30d in the P4 region.

Next, when the upper arm portion A is in the stopped state and the lower arm portion B is in the driven state, as depicted in FIG. 23C, the metal layers 30a and 30b are placed at a high potential and the metal layers 30c and 30d are placed at a low potential. A potential difference is produced in the ceramic board 20 between the low-potential metal layers 30c and 30d and the high-potential metal layer 40 (that is, in the regions P3 and P4 indicated by the broken lines). This means that it is conceivable for detachment of the metal layer 30c to occur between the ceramic board 20 and the metal layer 30c in the P3 region. It is also conceivable for detachment of the metal layer 30d to occur between the ceramic board 20 and the metal layer 30d in the P4 region.

In FIGS. 23A to 23C described above, an intermediate layer is formed in L4 and L5 regions depicted in FIG. 23D based on the potential differences produced in the stopped state and the driven state of the semiconductor device 1. The L4 region is the boundary between the ceramic board 20 and the metal layer 30c. The L5 region is the boundary between the ceramic board 20 and the metal layer 30c. In particular, as depicted in FIGS. 23A to 23C, it is believed that potential differences will frequently occur between the ceramic board 20 and the metal layer 30d. For this reason, an intermediate layer is formed in at least the L5 region.

A case where the metal layer 40, which is the rear surface metal layer, in the ceramic laminated substrate 10 is placed at a floating potential will now be described with reference to FIGS. 24A to 24D. This corresponds to when no potential is applied to the metal layer 40 in a state where the semiconductor device 1 is not being driven. At this time, when the upper arm portion A and the lower arm portion B are in the stopped state, as depicted in FIG. 24A, the metal layers 30a and 30b are placed at a high potential and the metal layer 30d is placed at a low potential. At this time, the metal layer 40 that is the metal layer on the rear surface has a potential in keeping with the ratio of the areas at the different potentials on the front surface. In the present embodiment, the area at a high potential is large compared to the area at a low potential (see FIG. 1). That is, the metal layer 40 has a potential that is closer to the high potential than the low potential. Accordingly, in the ceramic board 20, a potential difference is produced between the low-potential metal layer 30d and the metal layer 40 (the P4 region indicated by the broken line). This means that it is conceivable for detachment of the metal layer 30d to occur between the ceramic board 20 and the metal layer 30d in the P4 region.

Next, when the upper arm portion A is in the driven state and the lower arm portion B is in the stopped state, as depicted in FIG. 24B, the metal layers 30a, 30b, and 30c are placed at a high potential and the metal layer 30d is placed at a low potential. At this time, the metal layer 40 that is the metal layer on the rear surface has a potential in keeping with the ratio of the areas at the different potentials on the front surface. In the present embodiment, the area at a high potential is quite large compared to the area at a low potential (see FIG. 1). That is, the metal layer 40 is placed at a potential that is substantially equal to the high potential. Accordingly, the metal layer 40 is placed at substantially the same potential as the metal layers 30a, 30b, and 30c. In the ceramic board 20, a potential difference is produced between the low-potential metal layer 30d and the metal layer 40 at the high potential (the P4 region indicated by the broken line). This means that it is conceivable for detachment of the metal layer 30d to occur between the ceramic board 20 and the metal layer 30d in the P4 region.

Next, when the upper arm portion A is in the stopped state and the lower arm portion B is in the driven state, as depicted in FIG. 24C, the metal layers 30a and 30b are placed at a high potential and the metal layers 30c and 30d are placed at a low potential. At this time, the metal layer 40 that is the metal layer on the rear surface has a potential in keeping with the ratio of the areas at the different potentials on the front surface. In the present embodiment, the area at a high potential is substantially equal to the area at a low potential (see FIG. 1). For this reason, the metal layer 40 is placed at a potential that is substantially in the middle of the high potential and the low potential. In the ceramic board 20, a potential difference of half the difference between the high potential and the low potential is produced between the high-potential metal layers 30a and 30b and the metal layer 40 (the P1 and P2 regions indicated by the broken lines). In addition, a potential difference of half the difference between the high potential and the low potential is produced between the low-potential metal layers 30c and 30d and the metal layer 40 (the P3 and P4 regions indicated by the broken lines). This means that it is conceivable for detachment to occur between the metal layer 40 and the ceramic board 20 in the P1 and P2 regions. It is also conceivable for detachment to occur between the metal layers 30c and 30d and the ceramic board 20 in the P3 and P4 regions.

The intermediate layers are formed in the L1, L2 and L5 regions depicted in FIG. 24D based on the potential differences that occur when the semiconductor device 1 is stopped and driven in FIGS. 24A to 24C. The L1 region is the boundary between the ceramic board 20 and the area of the metal layer 40 facing the metal layer 30a. The L2 region is the boundary between the ceramic board 20 and the area of the metal layer 40 facing the metal layer 30b. The L5 region is the boundary between the ceramic board 20 and the metal layer 30d. In particular, as depicted in FIGS. 24A to 24C, it is believed that potential differences will frequently occur between the ceramic board 20 and the metal layer 30d. For this reason, an intermediate layer is formed in at least the L5 region.

In view of FIGS. 22D, 23D, and 24D described above, the ceramic laminated substrate 10 has intermediate layers formed in the L1 to L5 regions indicated by broken lines in FIG. 25. The L1 region is the boundary between the ceramic board 20 and the region of the metal layer 40 facing the metal layer 30a. The L2 region is the boundary between the ceramic board 20 and the region of the metal layer 40 facing the metal layer 30b. The L3 region is the boundary between the ceramic board 20 and the region of the metal layer 40 facing the metal layer 30c. The L4 region is the boundary between the ceramic board 20 and the metal layer 30c. The L5 region is the boundary between the ceramic board 20 and the metal layer 30d. With consideration to the frequency with which potential differences occur in FIGS. 22A to 22D, 23A to 23D, and 24A to 24D, intermediate layers are formed in at least the L1 region, the L2 region, and the L5 region.

On the other hand, an intermediate layer is not needed at the boundary between the ceramic board 20 and the metal layers 30a and 30b. An intermediate layer is also not needed at the boundary between the ceramic board 20 and the region of the metal layer 40 facing the metal layer 30d.

The above description merely illustrates the principles of the present disclosure. A large number of changes and modifications will occur to those skilled in the art, and the present disclosure is not limited to the precise construction and applications described and illustrated above. All corresponding modifications and equivalents are to be regarded as falling within the scope of the present disclosure as defined in the attached patent claims and their equivalents. As one example, the ceramic board 20 may be constructed of a ceramic that is electrically insulating and has favorable thermal conductivity as a main component. Such ceramic is not limited to aluminum oxide and/or zirconium oxide. As examples, the main component may be aluminum nitride (AlN) or silicon nitride ($Si_3N_4$). In addition, zirconium oxide may be further added to such aluminum nitride or silicon nitride. The ceramic board 20 may also include grain boundary materials formed at the grain boundaries and triple points of the ceramic particles. As examples, such grain boundary materials may include oxide (the second oxide) containing aluminum and/or silicon.

According to the present disclosure, it is possible to prevent deterioration of a ceramic laminated substrate and to prevent a fall in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor chip;
   a bonding member; and
   a planar laminated substrate having a front surface and a rear surface opposite to each other, the laminated substrate having the semiconductor chip bonded to the front surface thereof via the bonding member, wherein the laminated substrate includes:
      a planar ceramic board having a first main surface and a second main surface opposite to each other, the ceramic board containing a plurality of ceramic particles;
      a high-potential metal layer containing copper and being bonded to the first main surface of the ceramic board;
      a low-potential metal layer containing copper, being bonded to the second main surface of the ceramic board, and having a potential lower than a potential of the first main surface of the high-potential metal layer; and
      an intermediate layer provided between the second main surface and the low-potential metal layer and including a first oxide that contains at least either magnesium or manganese.

2. The semiconductor device according to claim 1, wherein the first oxide is in contact with both the second main surface and the low-potential metal layer.

3. The semiconductor device according to claim 1, wherein
   the first main surface of the ceramic board and the front surface of the laminated substrate are located at one of two sides of the semiconductor device that are opposite to each other,
   the second main surface of the ceramic board and the rear surface of the laminated substrate are located at the other one of the two sides of the semiconductor device, and
   the semiconductor chip is electrically connected to the high-potential metal layer.

4. The semiconductor device according to claim 3, wherein
   the semiconductor chip includes a first semiconductor chip and a second semiconductor chip,
   the high-potential metal layer includes:
      a positive electrode metal layer to which a positive terminal is connected;
      a chip metal layer to which the first semiconductor chip is bonded;
      an output metal layer to which the second semiconductor chip is bonded and to which an output terminal is connected; and
      a negative electrode metal layer to which a negative terminal is connected, and
   the intermediate layer overlaps a region of the second main surface that faces the positive electrode metal layer in a plan view of the semiconductor device.

5. The semiconductor device according to claim 4, wherein the intermediate layer overlaps a region of the second main surface that faces the chip metal layer in the plan view.

6. The semiconductor device according to claim 1, wherein
   the first main surface of the ceramic board and the rear surface of the laminated substrate are located at one of two sides of the semiconductor device that are opposite to each other,
   the second main surface of the ceramic board and the front surface of the laminated substrate are located at the other one of the two sides of the semiconductor device, and
   the semiconductor chip is electrically connected to the low-potential metal layer.

7. The semiconductor device according to claim 6, wherein
the semiconductor chip includes a first semiconductor chip and a second semiconductor chip,
the low-potential metal layer includes:
a positive electrode metal layer to which a positive terminal is connected;
a chip metal layer to which the first semiconductor chip is bonded;
an output metal layer to which the second semiconductor chip is bonded and to which an output terminal is connected; and
a negative electrode metal layer to which a negative terminal is connected, and
the intermediate layer overlaps a region of the second main surface that faces the negative electrode metal layer in a plan view of the semiconductor device.

8. The semiconductor device according to claim 7, wherein the intermediate layer overlaps a region of the second main surface that faces the output metal layer in the plan view.

9. The semiconductor device according to claim 1, wherein the ceramic board and the intermediate layer include at least either:
magnesium in terms of oxide equivalent in a range of 0.1 wt % to 1.5 wt %; or
manganese in terms of oxide equivalent in a range of 0.01 wt % to 0.15 wt %.

10. The semiconductor device according to claim 1, wherein the first oxide is located at an interface between the second main surface and the low-potential metal layer.

11. The semiconductor device according to claim 10, wherein the intermediate layer covers a range of 10% and 80% of the second main surface.

12. The semiconductor device according to claim 1, wherein the plurality of ceramic particles and the first oxide are located in the intermediate layer between the ceramic board and the low-potential metal layer, and the first oxide is located at at least either grain boundaries or triple points of the plurality of ceramic particles at a side of the intermediate layer where the second surface of the ceramic board is disposed.

13. The semiconductor device according to claim 12, wherein an amount of the first oxide at the side of the intermediate layer where the ceramic board is disposed is greater than an amount of the first oxide at a side of the intermediate layer where the low-potential metal layer is disposed.

14. The semiconductor device according to claim 1, wherein the first oxide is an oxide containing aluminum.

15. The semiconductor device according to claim 14, wherein the first oxide includes a spinel crystal system containing aluminum.

16. The semiconductor device according to claim 1, wherein the first oxide includes one of MgO, MnO, (Mg,Mn)O, and $(Mg,Mn)Mn_2O_4$.

17. The semiconductor device according to claim 1, wherein the ceramic board further includes a second oxide containing silicon at at least either grain boundaries or triple points of the plurality of ceramic particles.

18. The semiconductor device according to claim 17, wherein a content of the silicon in the ceramic board is in a range of 0.01 wt % to 3.0 wt % in terms of oxide equivalent.

19. The semiconductor device according to claim 17, wherein a content of silicon in the ceramic board is in a range of 1.0 wt % to 3.0 wt % in terms of oxide equivalent.

20. The semiconductor device according to claim 17, wherein at least one of:
the laminated substrate includes an oxide containing magnesium, and includes magnesium in a range of 10 wt % to 50 wt % in terms of magnesium oxide (MgO) equivalent with respect to a content of silicon in terms of silicon oxide ($SiO_2$) equivalent; or
the laminated substrate includes an oxide containing manganese, and includes manganese in a range of 1.0 wt % to 5.0 wt % in terms of manganese oxide (MnO) equivalent with respect to the content of silicon in terms of silicon oxide ($SiO_2$) equivalent.

21. The semiconductor device according to claim 1, wherein
the ceramic board further includes the second oxide containing sodium oxide at at least either grain boundaries or triple points of the plurality of ceramic particles, and
a content of the sodium oxide in the ceramic board is in a range of 0.001 wt % to 0.2 wt % in terms of oxide equivalent.

22. The semiconductor device according to claim 1, wherein the plurality of ceramic particles include aluminum oxide.

23. The semiconductor device according to claim 22, wherein a content of the aluminum oxide in the ceramic board is in a range of 90 wt % to 99 wt %.

24. The semiconductor device according to claim 22, wherein the ceramic board further includes an oxide containing zirconium at at least either grain boundaries or triple points of the plurality of ceramic particles.

25. The semiconductor device according to claim 24, wherein a content of zirconium oxide in the ceramic board is in a range of 5.0 wt % to 20.0 wt % in terms of oxide equivalent.

26. The semiconductor device according to claim 24, wherein the laminated substrate includes an oxide containing magnesium and includes magnesium in a range of 2.0 wt % to 20.0 wt % in terms of magnesium oxide (MgO) equivalent with respect to the zirconium in terms of zirconium oxide ($ZrO_2$) equivalent.

27. The semiconductor device according to claim 24, wherein the laminated substrate includes an oxide containing manganese, and contains manganese in a range of 0.05 wt % to 2.0 wt % in terms of manganese oxide (MnO) equivalent with respect to the zirconium in terms of zirconium oxide ($ZrO_2$) equivalent.

28. The semiconductor device according to claim 22, wherein the ceramic board further includes an oxide containing zirconium and yttrium at at least either grain boundaries or triple points of the plurality of ceramic particles.

29. The semiconductor device according to claim 28, wherein the oxide containing zirconium and yttrium includes yttrium in a range of 2.5 mol % to 3.5 mol % in terms of yttrium oxide ($Y_2O_3$) equivalent with respect to the zirconium in terms of zirconium oxide ($ZrO_2$) equivalent.

30. The semiconductor device according to claim 1, wherein
the first main surface of the ceramic board and the front surface of the laminated substrate are located at one of two sides of the semiconductor device that are opposite to each other,
the second main surface of the ceramic board and the rear surface of the laminated substrate are located at the other one of the two sides of the semiconductor device,
the low-potential metal layer has a floating potential, and the semiconductor chip is electrically connected to the high-potential metal layer.

31. The semiconductor device according to claim 30, wherein
the semiconductor chip includes a first semiconductor chip and a second semiconductor chip,
the high-potential metal layer includes:
a positive electrode metal layer to which a positive terminal is connected;
a chip metal layer to which the first semiconductor chip is bonded;
an output metal layer to which the second semiconductor chip is bonded and to which an output terminal is connected; and
a negative electrode metal layer to which a negative terminal is connected, and
the intermediate layer overlaps a region of the first main surface that faces the negative electrode metal layer.

32. The semiconductor device according to claim 31, wherein the intermediate layer overlaps regions of the second main surface that respectively face the positive electrode metal layer and the chip metal layer.

33. A semiconductor device, comprising:
a first semiconductor chip and a second semiconductor chip;
a bonding member; and
a planar laminated substrate having a front surface and a rear surface opposite to each other, the laminated substrate having the first semiconductor chip and the second semiconductor chip bonded to the front surface thereof via the bonding member, wherein
the laminated substrate includes:
a planar ceramic board having a first main surface and a second main surface opposite to each other, and containing a plurality of ceramic particles;
a first metal layer that contains copper and is bonded to the first main surface;
a second metal layer that contains copper and is bonded to the second main surface; and
an intermediate layer including a first oxide containing at least either magnesium or manganese,
the first metal layer includes:
a positive electrode metal layer to which a positive terminal is connected;
a chip metal layer to which the first semiconductor chip is bonded;
an output metal layer to which the second semiconductor chip is bonded and to which an output terminal is connected; and
a negative electrode metal layer to which a negative terminal is connected, and
the intermediate layer overlaps regions of the second main surface that respectively face the positive electrode metal layer and the chip metal layer, and overlaps a region of the first main surface that faces the negative electrode metal layer in a plan view of the semiconductor device.

34. The semiconductor device according to claim 33, wherein the intermediate layer overlaps a region of the second main surface that faces the output metal layer and a region of the first main surface that faces the output metal layer.

35. A semiconductor device, comprising:
a semiconductor chip;
a bonding member; and
a planar laminated substrate having a front surface and a rear surface opposite to each other, the laminated substrate including the semiconductor chip bonded to the front surface thereof via the bonding member, wherein
the laminated substrate includes:
a ceramic board containing ceramic particles, a first oxide including magnesium, and a second oxide including silicon, wherein the ceramic board contains the first oxide in a range of 10 wt % to 50 wt % in terms of a content of the second oxide; and
a metal layer bonded to a main surface of the ceramic board.

36. The semiconductor device according to claim 35, wherein the ceramic board further includes a sodium oxide, a content of which is in a range of 0.001 wt % to 0.2 wt % in terms of sodium oxide equivalent.

37. The semiconductor device according to claim 36, wherein a concentration of the sodium oxide is higher on a second main surface side than a first main surface side of the ceramic board.

38. A semiconductor device, comprising:
a semiconductor chip;
a bonding member; and
a planar laminated substrate having a front surface and a rear surface opposite to each other, the laminated substrate including the semiconductor chip bonded to the front surface thereof via the bonding member, wherein the laminated substrate includes:
a ceramic board containing ceramic particles;
a metal layer bonded to a main surface of the ceramic board; and
an intermediate layer disposed between the main surface of the ceramic board and the metal layer, and includes a first oxide containing manganese.

39. The semiconductor device according to claim 38, wherein
the ceramic board further includes a second oxide containing silicon at at least either grain boundaries or triple points of the plurality of ceramic particles, and
a content of manganese in terms of manganese oxide equivalent is in a range of 1.0 wt % to 5.0 wt % with respect to a content of silicon in terms of silicon oxide equivalent.

40. The semiconductor device according to claim 38, wherein
the ceramic board further includes a second oxide containing silicon at at least either grain boundaries or triple points of the plurality of ceramic particles, and
a content of manganese in terms of manganese oxide equivalent is in a range of 0.05 wt % to 2 wt % or less with respect to a content of zirconium in terms of zirconium oxide equivalent.

41. The semiconductor device according to claim 38, wherein the first oxide further contains magnesium and wherein at least either:
the ceramic board and the intermediate layer include magnesium in a range of 0.1 wt % to 1.5 wt % in terms of oxide equivalent; or
the ceramic board and the intermediate layer include manganese in a range of 0.01 wt % to 0.15 wt % in terms of oxide equivalent.

* * * * *